(12) United States Patent
Dembo et al.

(10) Patent No.: US 10,634,708 B2
(45) Date of Patent: Apr. 28, 2020

(54) RADIO FIELD INTENSITY MEASUREMENT DEVICE, AND RADIO FIELD INTENSITY DETECTOR AND GAME CONSOLE USING THE SAME

(71) Applicant: Semiconductor Energy Laboratory Co., Ltd., Atsugi-shi, Kanagawa-ken (JP)

(72) Inventors: Hiroki Dembo, Isehara (JP); Atsushi Miyaguchi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/281,433

(22) Filed: Feb. 21, 2019

(65) Prior Publication Data

US 2019/0178926 A1 Jun. 13, 2019

Related U.S. Application Data

(63) Continuation of application No. 14/887,704, filed on Oct. 20, 2015, now Pat. No. 10,215,788, which is a (Continued)

(30) Foreign Application Priority Data

Nov. 16, 2006 (JP) .................................. 2006-309996

(51) Int. Cl.
*G01R 29/08* (2006.01)
*H02J 50/20* (2016.01)
(Continued)

(52) U.S. Cl.
CPC ............. *G01R 29/08* (2013.01); *G01R 27/32* (2013.01); *G01R 29/0857* (2013.01);
(Continued)

(58) Field of Classification Search
CPC ................ G01R 29/08; G01R 29/0857; G01R 29/0878; G01R 27/32; H01Q 1/248;
(Continued)

(56) References Cited

U.S. PATENT DOCUMENTS 5,512,823 A * 4/1996 Nepveu ............... G01R 29/0857
324/115
5,773,974 A 6/1998 Kraz
(Continued)

FOREIGN PATENT DOCUMENTS

CA 2013776 10/1992
CN 002368040 Y 3/2000
(Continued)

OTHER PUBLICATIONS

Chinese Office Action (Application No. 200710169455.6) dated Jan. 26, 2011.
(Continued)

*Primary Examiner* — Hoai-an D. Nguyen
*Assistant Examiner* — Sean Curtis
(74) *Attorney, Agent, or Firm* — Robinson Intellectual Property Law Office; Eric J. Robinson

(57) ABSTRACT

The present invention provides a radio field intensity measurement device having a display portion with improved visibility, in the case of measuring a weak radiowave from a long distance. In the radio field intensity measurement device, a battery is provided as a power source for power supply and the battery is charged by a received radiowave. When a potential of a signal obtained from the received radiowave is higher than an output potential of the battery, the power is stored in the battery. On the other hand, when the potential of the signal obtained from the received radiowave is lower than the output potential of the battery, power produced by the battery is used as power to drive the radio
(Continued)

field intensity measurement device. As an element to display the radio field intensity, a thermochromic element or an electrochromic element is used.

26 Claims, 38 Drawing Sheets

Related U.S. Application Data continuation of application No. 13/706,630, filed on Dec. 6, 2012, now Pat. No. 9,176,176, which is a continuation of application No. 13/479,401, filed on May 24, 2012, now Pat. No. 8,330,607, which is a continuation of application No. 13/270,399, filed on Oct. 11, 2011, now Pat. No. 8,188,875, which is a continuation of application No. 11/979,472, filed on Nov. 5, 2007, now Pat. No. 8,044,813.

(51) Int. Cl.
  *H02J 7/02* (2016.01)
  *H04B 1/16* (2006.01)
  *G01R 27/32* (2006.01)
  *H01Q 1/24* (2006.01)
  *H01Q 1/28* (2006.01)
  *H01Q 1/38* (2006.01)

(52) U.S. Cl.
  CPC ......... *G01R 29/0878* (2013.01); *H01Q 1/248* (2013.01); *H01Q 1/28* (2013.01); *H01Q 1/38* (2013.01); *H02J 7/025* (2013.01); *H02J 50/20* (2016.02); *H04B 1/1607* (2013.01)

(58) Field of Classification Search
  CPC ... H01Q 1/28; H01Q 1/38; H02J 50/20; H02J 7/025; H02J 17/00; H04B 1/1607
  USPC .......................................... 324/629; 340/635
  See application file for complete search history.

(56) References Cited

U.S. PATENT DOCUMENTS

| | | | |
|---|---|---|---|
| 5,931,764 A | 8/1999 | Freeman et al. | |
| 6,127,799 A * | 10/2000 | Krishnan | G06K 19/0701 320/104 |
| 6,131,038 A * | 10/2000 | Sekine | H04W 36/06 455/513 |
| 6,489,883 B1 | 12/2002 | Iiyama et al. | |
| 6,761,637 B2 | 7/2004 | Weston et al. | |
| 6,809,498 B2 | 10/2004 | Nakamura et al. | |
| 6,822,574 B2 * | 11/2004 | Nakamura | G01S 3/12 340/601 |
| 6,906,842 B2 * | 6/2005 | Agrawal | G02F 1/1523 359/265 |
| 7,090,139 B2 | 8/2006 | Kasuga et al. | |
| 7,224,143 B2 | 5/2007 | Liscio et al. | |
| 7,229,385 B2 | 6/2007 | Freeman et al. | |
| 7,253,494 B2 * | 8/2007 | Mino | H01L 23/58 257/528 |
| 7,445,550 B2 | 11/2008 | Barney et al. | |
| 7,471,188 B2 * | 12/2008 | Koyama | G06K 19/0701 340/10.1 |
| 7,500,917 B2 | 3/2009 | Barney et al. | |
| 7,571,007 B2 * | 8/2009 | Erickson | A61N 1/3787 607/61 |
| 7,586,215 B2 * | 9/2009 | Hattori | G06K 19/0723 307/141 |
| 7,597,259 B2 | 10/2009 | Nishikawa et al. | |
| 7,659,892 B2 | 2/2010 | Tanada et al. | |
| 7,710,270 B2 * | 5/2010 | Shionoiri | G06K 19/06037 340/572.1 |
| 7,714,535 B2 | 5/2010 | Yamazaki | |
| 7,764,046 B2 | 7/2010 | Osada | |
| 7,839,124 B2 | 11/2010 | Yamazaki et al. | |
| 7,850,527 B2 | 12/2010 | Barney et al. | |
| 7,854,684 B1 | 12/2010 | Freeman et al. | |
| 7,860,455 B2 * | 12/2010 | Fukumoto | H04B 13/00 340/12.22 |
| 7,878,905 B2 | 2/2011 | Weston et al. | |
| 7,881,693 B2 | 2/2011 | Kurokawa | |
| 7,896,742 B2 | 3/2011 | Weston et al. | |
| 7,898,537 B2 | 3/2011 | Tanada et al. | |
| 7,965,180 B2 | 6/2011 | Koyama | |
| 7,986,216 B2 * | 7/2011 | Kurokawa | G06K 19/07749 340/10.1 |
| 8,012,809 B2 | 9/2011 | Reed | |
| 8,030,643 B2 | 10/2011 | Asami et al. | |
| 8,044,813 B1 * | 10/2011 | Dembo | H01Q 1/248 340/635 |
| 8,089,458 B2 | 1/2012 | Barney et al. | |
| 8,111,567 B2 * | 2/2012 | Inoue | G11C 5/141 365/189.11 |
| 8,159,088 B2 | 4/2012 | Tanada et al. | |
| 8,164,567 B1 | 4/2012 | Barney et al. | |
| 8,169,406 B2 | 5/2012 | Barney et al. | |
| 8,184,097 B1 | 5/2012 | Barney et al. | |
| 8,188,875 B2 * | 5/2012 | Dembo | H01Q 1/38 340/635 |
| 8,238,152 B2 | 8/2012 | Asami et al. | |
| 8,248,367 B1 | 8/2012 | Barney et al. | |
| 8,324,021 B2 | 12/2012 | Reed | |
| 8,330,284 B2 | 12/2012 | Weston et al. | |
| 8,330,607 B2 * | 12/2012 | Dembo | G01R 29/08 340/635 |
| 8,368,648 B2 | 2/2013 | Barney et al. | |
| 8,373,659 B2 | 2/2013 | Barney et al. | |
| 8,384,668 B2 | 2/2013 | Barney et al. | |
| 8,427,280 B2 * | 4/2013 | Kurokawa | G06K 19/07749 340/10.1 |
| 8,432,293 B2 * | 4/2013 | Symons | H02J 7/025 340/854.8 |
| 8,455,954 B2 | 6/2013 | Suzuki et al. | |
| 8,526,216 B2 | 9/2013 | Asami et al. | |
| 8,692,653 B2 * | 4/2014 | Shionoiri | G06K 7/10178 340/1.1 |
| 8,749,063 B2 * | 6/2014 | Tsurume | H01L 27/1214 257/758 |
| 9,176,176 B2 * | 11/2015 | Dembo | H04B 1/1607 |
| 9,667,091 B2 * | 5/2017 | Baek | H02J 7/025 |
| 10,215,788 B2 * | 2/2019 | Dembo | H01Q 1/38 |
| 10,290,908 B2 * | 5/2019 | Momo | H01M 10/0562 |
| 2002/0180344 A1 | 12/2002 | Lichtfuss | |
| 2002/0190689 A1 | 12/2002 | Nakamura et al. | |
| 2003/0078731 A1 * | 4/2003 | Nakamura | G01S 3/12 702/2 |
| 2004/0257064 A1 | 12/2004 | Ito | |
| 2005/0051870 A1 * | 3/2005 | Yamazaki | H01L 21/6835 257/531 |
| 2006/0038658 A1 * | 2/2006 | Jarvis | G06K 7/0008 340/10.1 |
| 2006/0113652 A1 * | 6/2006 | Mino | H01L 23/58 257/684 |
| 2006/0202269 A1 | 9/2006 | Suzuki et al. | |
| 2006/0259098 A1 * | 11/2006 | Erickson | A61N 1/3787 607/61 |
| 2006/0267769 A1 | 11/2006 | Ito et al. | |
| 2006/0289525 A1 * | 12/2006 | Hovorka | H05B 6/763 219/737 |
| 2007/0132590 A1 * | 6/2007 | Hattori | G06K 19/0723 340/572.3 |
| 2007/0163010 A1 | 7/2007 | Ishii | |
| 2007/0229228 A1 | 10/2007 | Yamazaki et al. | |
| 2007/0229279 A1 | 10/2007 | Yamazaki et al. | |
| 2007/0278998 A1 | 12/2007 | Koyama | |
| 2007/0285246 A1 | 12/2007 | Koyama | |
| 2008/0016961 A1 | 1/2008 | Dwyer et al. | |
| 2008/0055047 A1 | 3/2008 | Osada et al. | |
| 2008/0055279 A1 | 3/2008 | Osada et al. | |
| 2008/0058029 A1 | 3/2008 | Sato et al. | |
| 2008/0060422 A1 | 3/2008 | Hosoya | |

(56) References Cited

U.S. PATENT DOCUMENTS

| | | | |
|---|---|---|---|
| 2008/0101267 A1 | 5/2008 | Kurokawa | |
| 2008/0156886 A1* | 7/2008 | Tsuchiya | G06K 19/07749 235/492 |
| 2008/0158092 A1* | 7/2008 | Yakubo | H01Q 1/2283 343/866 |
| 2008/0169349 A1 | 7/2008 | Suzuki et al. | |
| 2008/0210762 A1 | 9/2008 | Osada et al. | |
| 2008/0272889 A1* | 11/2008 | Symons | H02J 50/10 340/10.1 |
| 2009/0121675 A1 | 5/2009 | Ho et al. | |
| 2011/0081970 A1 | 4/2011 | Barney et al. | |
| 2011/0267075 A1 | 11/2011 | Woo | |
| 2011/0300941 A1 | 12/2011 | Weston et al. | |
| 2012/0139714 A1 | 6/2012 | Tanada et al. | |
| 2012/0258802 A1 | 10/2012 | Weston et al. | |
| 2013/0079141 A1 | 3/2013 | Barney et al. | |
| 2014/0014953 A1 | 1/2014 | Asami et al. | |
| 2014/0124583 A1 | 5/2014 | Reed | |
| 2015/0086809 A1* | 3/2015 | Lemke | H01M 10/0436 429/7 |
| 2016/0254500 A1* | 9/2016 | Kawata | H01G 11/78 362/157 |
| 2016/0351975 A1* | 12/2016 | Momo | H01M 10/0562 |

FOREIGN PATENT DOCUMENTS

| | | | |
|---|---|---|---|
| CN | 002471040 Y | 1/2002 | |
| CN | 002550773 Y | 5/2003 | |
| CN | 002616914 Y | 5/2004 | |
| DE | 19852525 | 5/2000 | |
| EP | 1263114 A | 12/2002 | |
| EP | 1600885 A | 11/2005 | |
| EP | 1722284 A | 11/2006 | |
| EP | 1724649 A | 11/2006 | |
| EP | 1729187 A | 12/2006 | |
| EP | 1962408 A | 8/2008 | |
| EP | 1962408 A2 * | 8/2008 | G01R 27/32 |
| JP | 04-029894 A | 1/1992 | |
| JP | 10-197581 A | 7/1998 | |
| JP | 10-222108 A | 8/1998 | |
| JP | 11-268460 A | 10/1999 | |
| JP | 3063391 | 10/1999 | |
| JP | 11-345292 A | 12/1999 | |
| JP | 2000-138512 A | 5/2000 | |
| JP | 2000-224775 A | 8/2000 | |
| JP | 2001-165973 A | 6/2001 | |
| JP | 2001-218958 A | 8/2001 | |
| JP | 2001-338273 A | 12/2001 | |
| JP | 2002-519754 | 7/2002 | |
| JP | 2002-366059 A | 12/2002 | |
| JP | 2003-076442 A | 3/2003 | |
| JP | 2003-111301 A | 4/2003 | |
| JP | 2003-168085 A | 6/2003 | |
| JP | 2003-259570 A | 9/2003 | |
| JP | 2003-288573 A | 10/2003 | |
| JP | 2004-252522 A | 9/2004 | |
| JP | 2004-264916 A | 9/2004 | |
| JP | 2005-072114 A | 3/2005 | |
| JP | 2005-149118 A | 6/2005 | |
| JP | 2005-204493 A | 7/2005 | |
| JP | 2005-251417 A | 9/2005 | |
| JP | 2005-286011 A | 10/2005 | |
| JP | 2005-310128 A | 11/2005 | |
| JP | 2005-339825 A | 12/2005 | |
| JP | 2006-023817 A | 1/2006 | |
| JP | 2006-237581 A | 9/2006 | |
| JP | 2006-521162 | 9/2006 | |
| JP | 2006-285958 A | 10/2006 | |
| JP | 2006-296187 A | 10/2006 | |
| JP | 2006-310799 A | 11/2006 | |
| WO | WO-1991/015800 | 10/1991 | |
| WO | WO-1999/067702 | 12/1999 | |
| WO | WO-2001/007993 | 2/2001 | |
| WO | WO-2003/083495 | 10/2003 | |
| WO | WO-2004/087271 | 10/2004 | |
| WO | WO-2005059817 A1 * | 6/2005 | G06K 19/0723 |
| WO | WO-2006/039339 | 4/2006 | |
| WO | WO-2006/080322 | 8/2006 | |
| WO | WO-2006080322 A1 * | 8/2006 | H01L 27/1214 |
| WO | WO-2006/101493 | 9/2006 | |
| WO | WO-2007/058996 | 5/2007 | |

OTHER PUBLICATIONS

Chinese Office Action (Application No. 201110320811.6) dated Nov. 25, 2013.

European Search Report (Application No. 07021488.7) dated Jan. 8, 2014.

Radio Frequency (RF) Field Intensity Units Field Intensity Units, 1999, pp. 1-6, SoftWright LLC.

AM Radio Field Strength Measurements with Confidence, Nov. 1, 2004.

* cited by examiner

FIG. 2
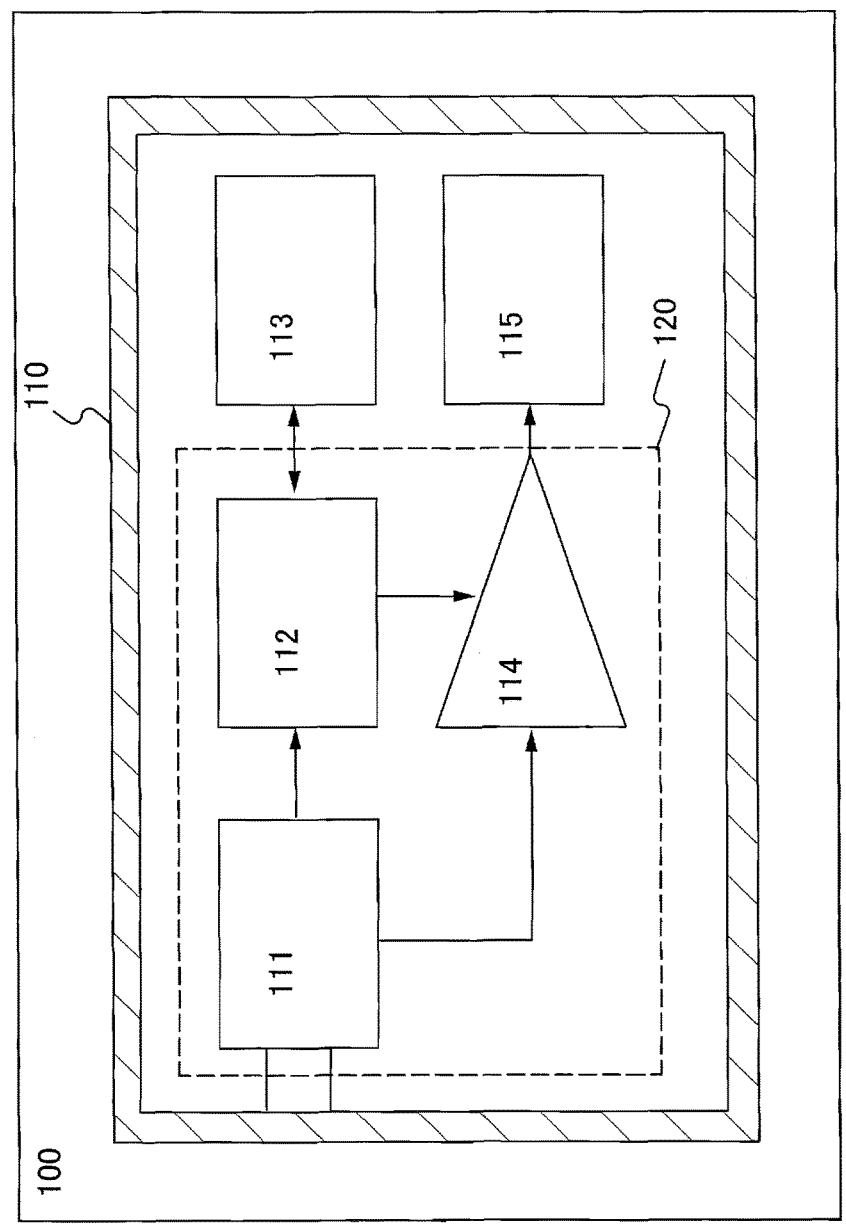
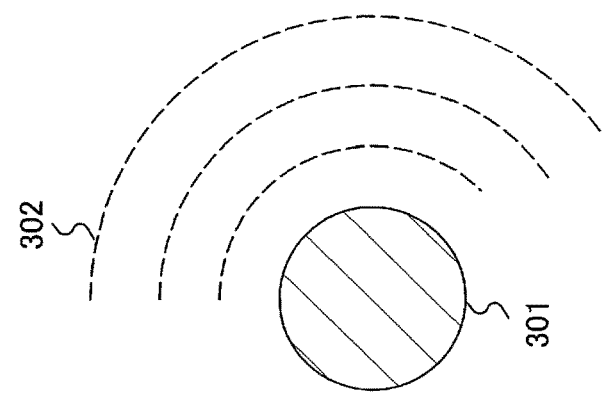

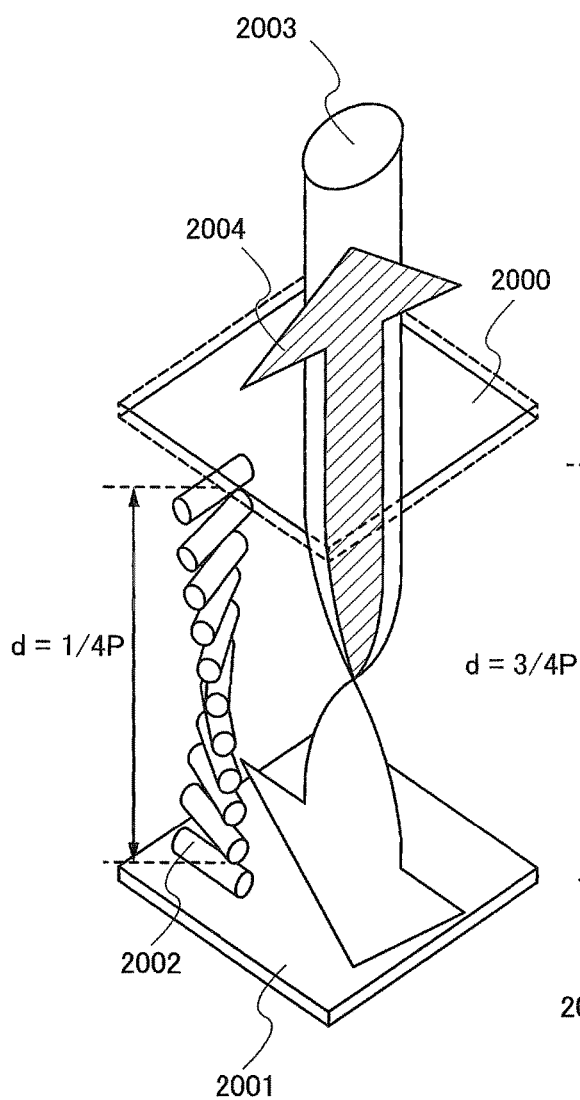
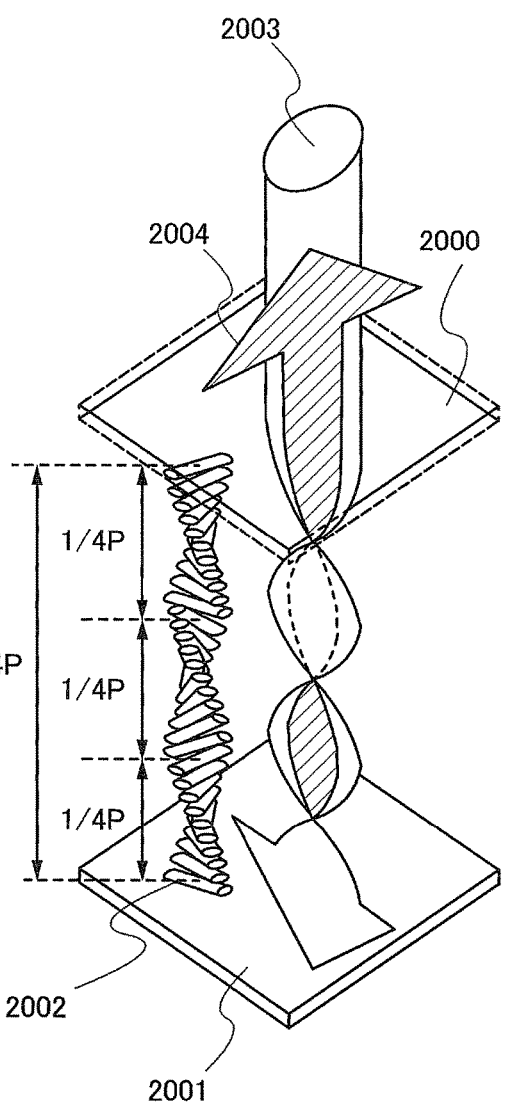
FIG. 15A
FIG. 15B

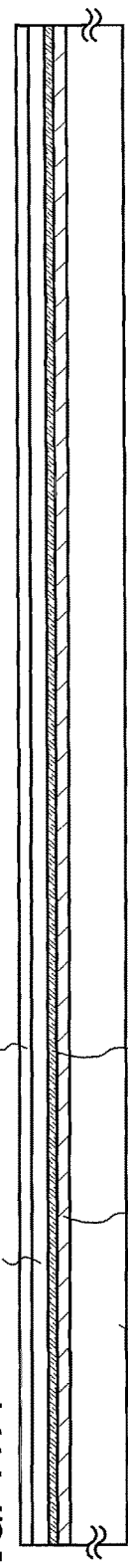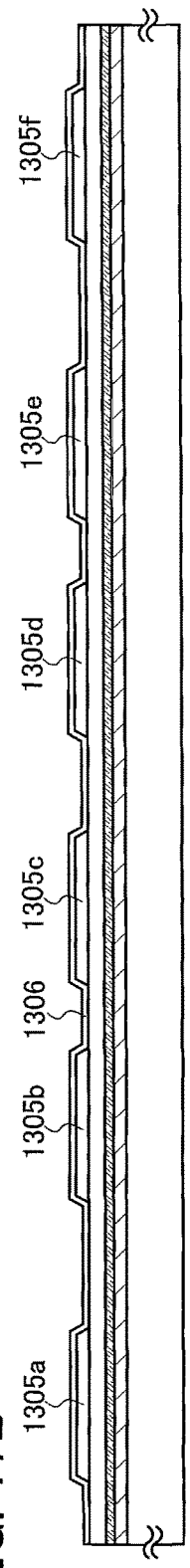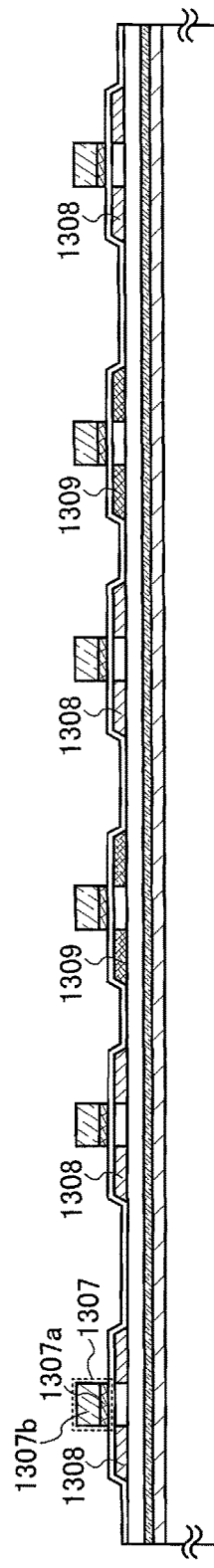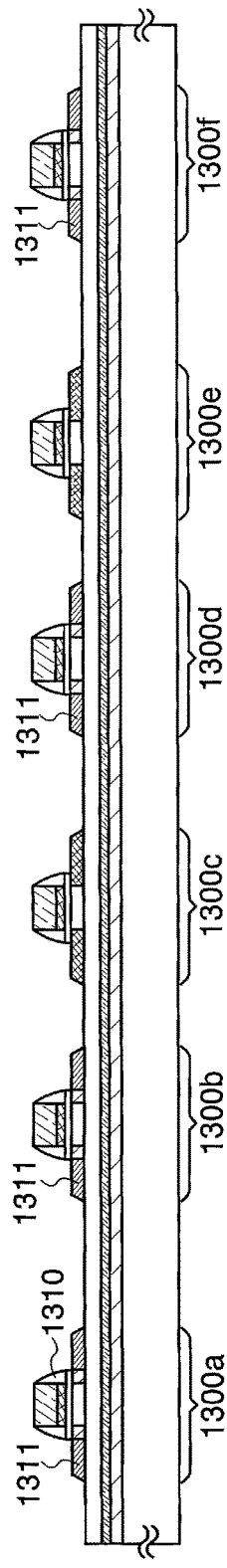

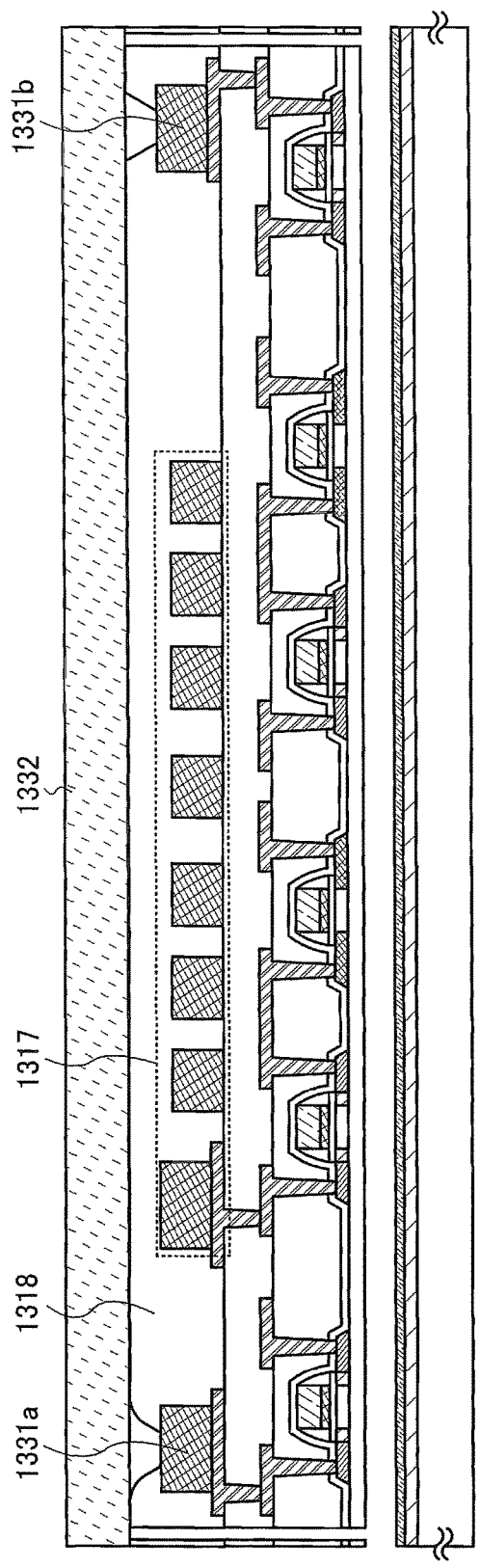
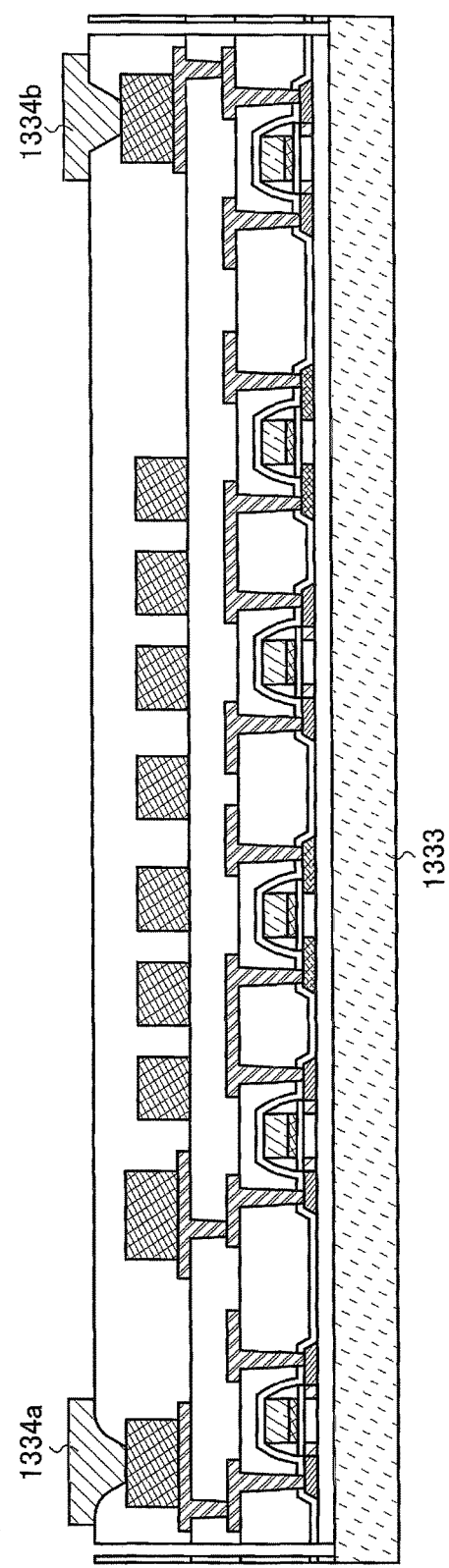

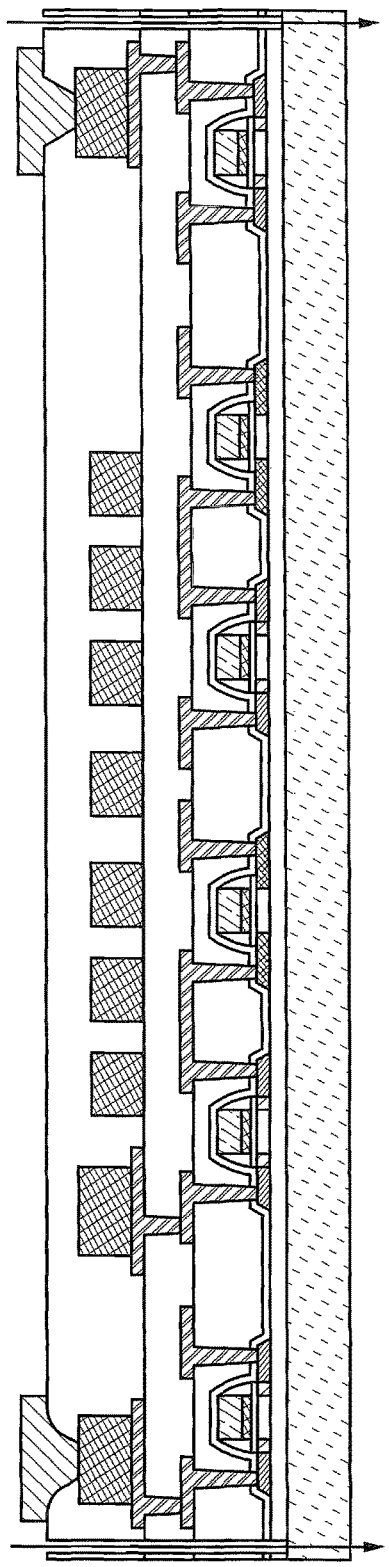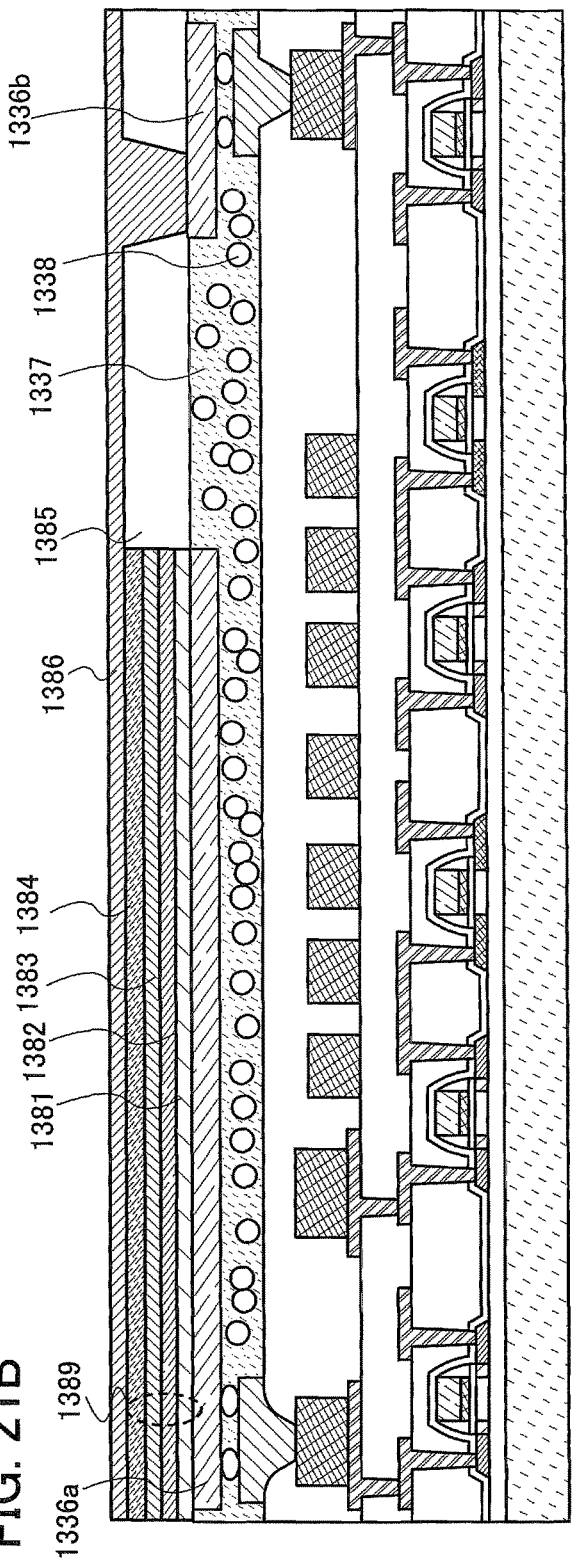
FIG. 21A
FIG. 21B

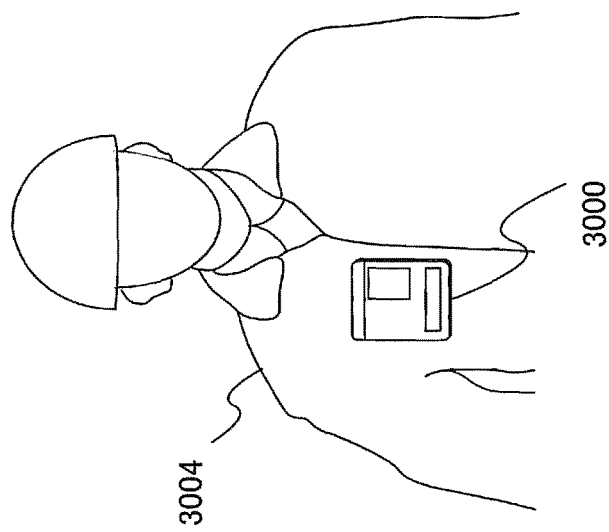
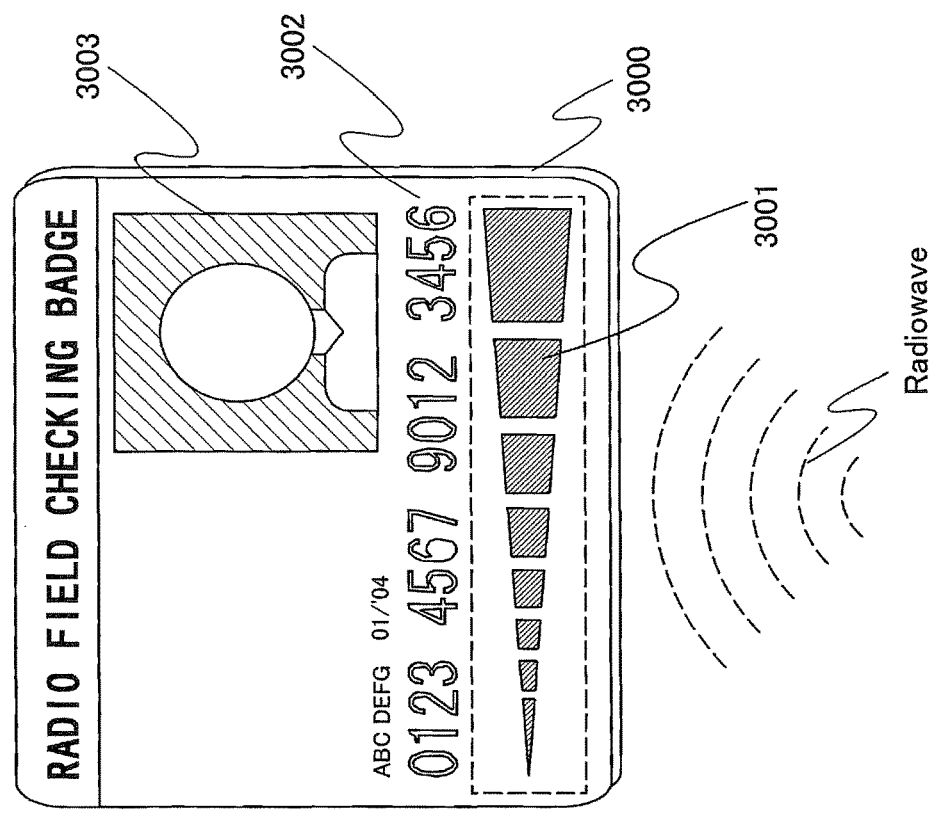
FIG. 29B
FIG. 29A

RADIO FIELD INTENSITY MEASUREMENT DEVICE, AND RADIO FIELD INTENSITY DETECTOR AND GAME CONSOLE USING THE SAME

BACKGROUND OF THE INVENTION

1. Field of the Invention

The present invention relates to radio field intensity measurement devices which can display radio field intensity of radio signals. In particular, the present invention relates to radio field intensity measurement devices which change color in accordance with radio intensity of a radio signal, utilizing a chromic material, and radio field intensity detectors and amusement devices (such as game consoles, game machines, toys or the like) using the radio field intensity measurement devices.

2. Description of the Related Art

In recent years, wireless devices using radio communication have been spreading due to development of electronics and the coming of an advanced information society, and have been utilized in various fields such as military affairs, medical treatment, communication, education, and commercial transaction. Radio communication using a radiowave as a communication medium takes the maximum advantages of radiowave that information can be transmitted instantly independent from time and distance, and one of the most important bases for human life and industry in modern society.

A radiowave is a kind of electromagnetic waves, and a wave propagated in the air by energy exchange between an electric field and a magnetic field. Since a radiowave cannot be seen, there is a concern that a radiowave emitted from facilities using radiowave and wireless devices may adversely affect human bodies. Thus, there is a need to provide a device which can easily measure radio field intensity of a radiowave emitted from a radio emission device, and display information on the radiowave.

There are various methods for measuring radio field intensity. For example, Reference 1, Japanese Published Patent Application No. 2006-23817, discloses a radio field detector in which an antenna, a rectifier circuit and a lamp are connected and radio field intensity is detected by light intensity of a lamp. Further, Reference 2, Japanese Published Patent Application No. 2001-165973, provides an electromagnetic wave monitor in which an antennal, a storage device, and an informing means are connected, and the informing means is driven by the storage device to measure a radio field intensity.

FIG. 38 is a block diagram illustrating a typical configuration of a radio field intensity measurement device disclosed in Reference 1.

In the radio field intensity measurement device 3800 illustrated in FIG. 38, a received radiowave 3820 is converted to an induction signal and the induction signal is input to a rectifier circuit 3811. The rectifier circuit 3811 rectifies the induction signal and supplied power to the lamp 3812. In other words, electricity which goes up in proportion to the intensity of the received radiowave 3820 is supplied to the lamp, and the intensity of the radiowave appears in the light intensity of the lamp which is turned on.

In the electromagnetic wave monitor in Reference 2, as the informing means, a light-emitting diode, a discharge lamp, or a liquid crystal display device is used.

SUMMARY OF THE INVENTION

However, the radio field intensity measurement device of Reference 1 has a problem of not detecting a weak radiowave, because the weak radiowave emitted over long distance lights the lamp, and thus sufficient power is difficult to secure. Further, in the electromagnetic wave monitor of Reference 2, a weak radiowave is measured to secure power to drive a light-emitting diode, a discharge lamp and a liquid crystal display device as the informing means. However, Reference 2 has a problem in that lighting of the informing means is difficult to be seen when brightness in surroundings is intense e.g., under sunlight.

The present invention has been made in view of the above problems. It is an object of the present invention to provide a radio field intensity measurement device which can measure a weak radiowave, and have a display portion which has a high level of visibility even when brightness in surroundings is intense e.g., under sunlight.

In order to solve the above problems, in accordance with the present invention, a battery is provided as a power source to supply power to a radio field intensity measurement device. The power to drive the radio field intensity measurement device is produced from a received radiowave, and charged in the battery. When a potential of a signal obtained from the received radiowave is higher than an output potential of the battery, the power is stored in the battery. On the other hand, when the potential of the signal obtained from the received radiowave is lower than the output potential of the battery, power produced by the battery is used as power to drive the radio field intensity measurement device.

A radio field intensity measurement device of the present invention employs a thermochromic material or an electrochromic (EC) material as an element to display radio field intensity, and includes a resistor or a voltage application element as a means of changing the color of such a chromic material.

An aspect of the present invention is a radio field intensity measurement device which comprises an antenna to convert a received radiowave to an induction signal; a rectifier circuit configured to output a direct signal by rectifying the induction signal; a battery to be charged by the direct signal; a control circuit configured to compare a potential of the direct signal with an output potential of the battery; an amplifier circuit configured to amplify the direct signal; and a display element which is operated depending on the direct signal amplified by the amplifier circuit. In the radio field intensity measurement device, the control circuit charges the battery when the potential of the direct signal is higher than the output potential of the battery, and when the potential of the direct signal is lower than the output potential of the battery, power of the battery is used as a power source to drive the amplifier circuit.

Another aspect of the present invention is a radio field intensity measurement device which comprises an antenna to convert a received radiowave to an induction signal; a rectifier circuit configured to output a direct signal by rectifying the induction signal; a battery to be charged by the direct signal; a control circuit configured to compare a potential of the direct signal with an output potential of the battery; an amplifier circuit configured to amplify the direct signal; and a display element which is operated depending on the direct signal amplified by the amplifier circuit. In the radio field intensity measurement device, the control circuit charges the battery when the potential of the direct signal is higher than the output potential of the battery, when the potential of the direct signal is lower than the output potential of the battery, power of the battery is used as a power source to drive the amplifier circuit, and a color of the display element is changed in accordance with a magnitude of the direct signal amplified by the amplifier circuit.

Another aspect of the present invention is a radio field intensity measurement device which comprises an antenna to convert a received radiowave to an induction signal; a rectifier circuit configured to output a direct signal by rectifying the induction signal; a battery to be charged by the direct signal; a control circuit configured to compare a potential of the direct signal with an output potential of the battery; an amplifier circuit configured to amplify the direct signal; and a display element which is operated depending on the direct signal amplified by the amplifier circuit. In the radio field intensity measurement device, the control circuit charges the battery when the potential of the direct signal is higher than the output potential of the battery, when the potential of the direct signal is lower than the output potential of the battery, power of the battery is used as a power source to drive the amplifier circuit, and the display element includes a resistance heating element and a thermochromic element.

Another aspect of the present invention is a radio field intensity measurement device which comprises an antenna to convert a received radiowave to an induction signal; a rectifier circuit configured to output a direct signal by rectifying the induction signal; a battery to be charged by the direct signal; a control circuit configured to compare a potential of the direct signal with an output potential of the battery; an amplifier circuit configured to amplify the direct signal; and a display element which is operated depending on the direct signal amplified by the amplifier circuit. In the radio field intensity measurement device, the control circuit charges the battery when the potential of the direct signal is higher than the output potential of the battery, when the potential of the direct signal is lower than the output potential of the battery, power of the battery is used as a power source to drive the amplifier circuit, and the display element includes a resistance heating element and a thermochromic element, and a color of the display element is changed in accordance with a magnitude of the direct signal amplified by the amplifier circuit.

In the present invention, the thermochromic element includes a thermotropic liquid crystal.

Another aspect of the present invention is a radio field intensity measurement device which comprises an antenna to convert a received radiowave to an induction signal; a rectifier circuit configured to output a direct signal by rectifying the induction signal; a battery to be charged by the direct signal; a control circuit configured to compare a potential of the direct signal with an output potential of the battery; an amplifier circuit configured to amplify the direct signal; and a display element which is operated depending on the direct signal amplified by the amplifier circuit. In the radio field intensity measurement device, the control circuit charges the battery when the potential of the direct signal is higher than the output potential of the battery, when the potential of the direct signal is lower than the output potential of the battery, power of the battery is used as a power source to drive the amplifier circuit, and the display element includes a voltage application element and an electrochromic element.

Another aspect of the present invention is a radio field intensity measurement device which comprises an antenna to convert a received radiowave to an induction signal; a rectifier circuit configured to output a direct signal by rectifying the induction signal; a battery to be charged by the direct signal; a control circuit configured to compare a potential of the direct signal with an output potential of the battery; an amplifier circuit configured to amplify the direct signal; and a display element which is operated depending on the direct signal amplified by the amplifier circuit. In the radio field intensity measurement device, the control circuit charges the battery when the potential of the direct signal is higher than the output potential of the battery, when the potential of the direct signal is lower than the output potential of the battery, power of the battery is used as a power source to drive the amplifier circuit, and the display element includes a voltage application element and an electrochromic element, and a color of the display element is changed in accordance with a magnitude of the direct signal amplified by the amplifier circuit.

In addition, in the present invention, the electrochromic element includes a metal oxide.

The battery of the present invention is a lithium battery, a lithium polymer battery, a lithium ion battery, a nickel hydride battery, a nickel cadmium battery, an organic radical battery, a lead-acid battery, an air secondary battery, a nickel zinc battery, a silver zinc battery, or a capacitor.

The capacitor of the present invention is an electric double layer capacitor.

The radio field intensity detector of the present invention is attached to an object to detect a radiowave.

An amusement device of the present invention comprises a plate-like radio field intensity detector attached with the radio field intensity detector and a radiowave emitter, and a color of the plate-like radio field intensity detector is changed by using a radiowave emitted from the radiowave emitter.

It is to be noted that description "be connected" in the present invention indicates electrical connection. Therefore, in structures disclosed in the present invention, another element capable of electrical connection (e.g., a switch, a transistor, a capacitor, an inductor, a resistor, a diode, or the like) may be interposed between elements having a predetermined connection relation.

The present invention provides a radio field intensity measurement device which can measure a weak radiowave from a long distance. Further, the present invention provides a radio field intensity measurement device which has a high level of visibility even when brightness in surroundings is intense e.g., under sunlight.

BRIEF DESCRIPTION OF THE DRAWINGS

In the accompanying drawings:—

FIG. 2 is a view describing Embodiment Mode 1.

FIGS. 15A and 15B are views describing Embodiment Mode 2;
FIGS. 17A to 17D are views describing Embodiment 1;
FIGS. 20A and 20B are views describing Embodiment 1;
FIGS. 21A and 21B are views describing Embodiment 1;
FIGS. 29A and 29B are views describing Embodiment 4.

DETAILED DESCRIPTION OF THE INVENTION

Embodiment Modes

Figure 1:
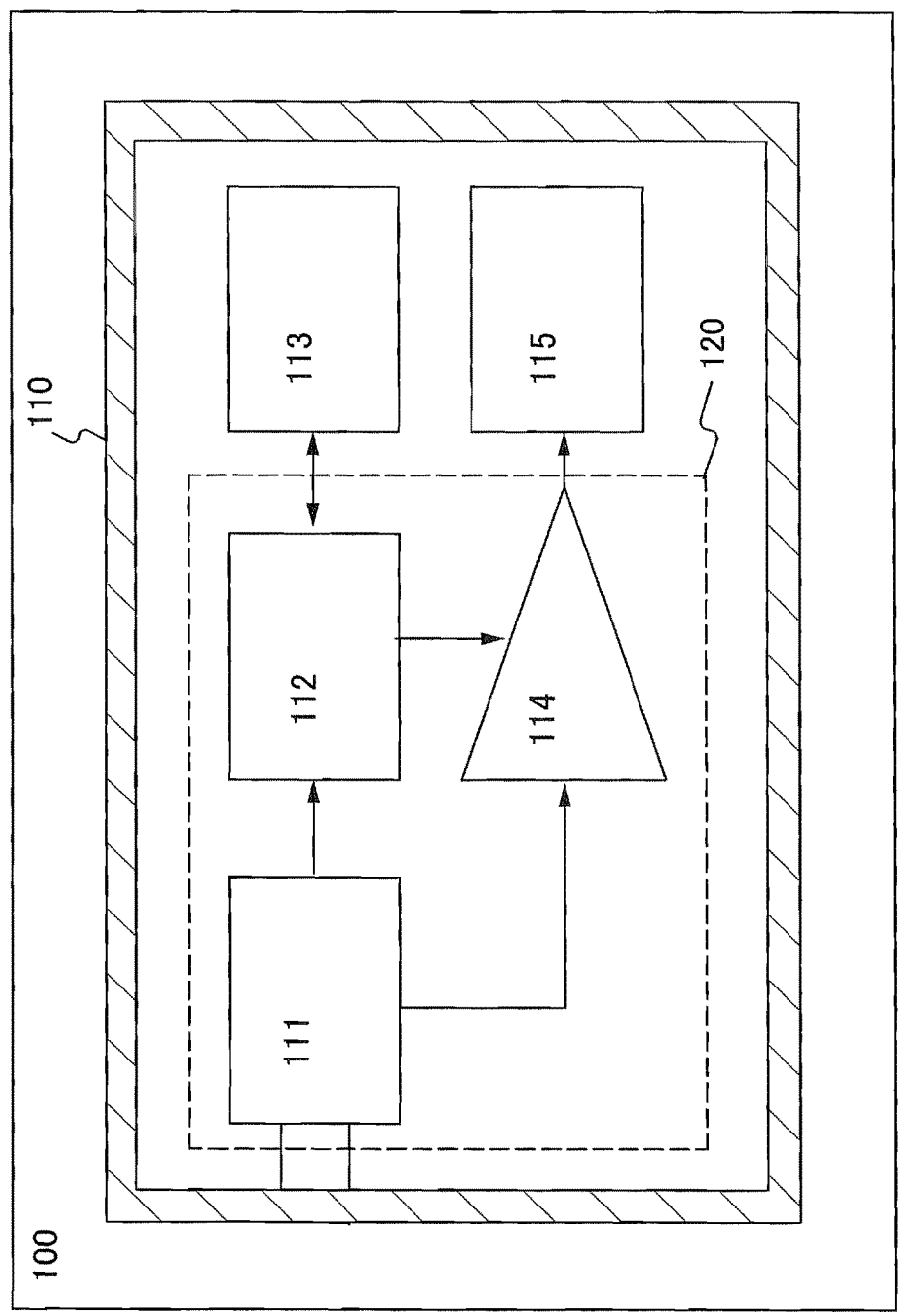
FIG. 1 is a view describing Embodiment Mode 1.

Embodiment Modes of the present invention will be explained below with reference to the accompanied drawings. It is easily understood by those skilled in the art that modes and details disclosed herein can be modified in various ways without departing from the spirit and the scope of the present invention. Therefore, the present invention should not be interpreted as being limited to the description of the embodiment modes to be given below. It is to be noted that, in the present invention explained below, there is a case that similar portions or portions having a similar function are denoted by the same reference numerals through the drawings.

Embodiment Mode 1

Embodiment Mode 1 will describe a structure of a radio field intensity measurement device of the present invention.

FIG. 1 is a block diagram of a radio field intensity measurement device of the present invention. The radio field intensity measurement device 100 includes an antenna 110, a rectifier circuit 111, a control circuit 112, a battery 113, an amplifier circuit 114 and a display element 115. Note that the rectifier circuit 111, the control circuit 112 and the amplifier circuit 114 are collectively referred to as a signal processing circuit 120 for simple description.

FIG. 2 is a block diagram in which the antenna 110 receives a received radiowave 302 from a radiowave source 301. In FIG. 2, the radiowave received by the antenna 110 is converted into an induction signal and input into the rectifier circuit 111. The rectifier circuit 111 converts the induction signal to a direct signal and outputs the direct signal. In addition, the direct signal output from the rectifier circuit 111 is input into the battery 113 through the control circuit 112. Meanwhile, the direct signal output from the rectifier circuit 111 is amplified by the amplifier circuit 114 and input into the display element 115. The display element 115 changes color in accordance with the direct signal amplified by the amplifier circuit 114.

Figure 4:
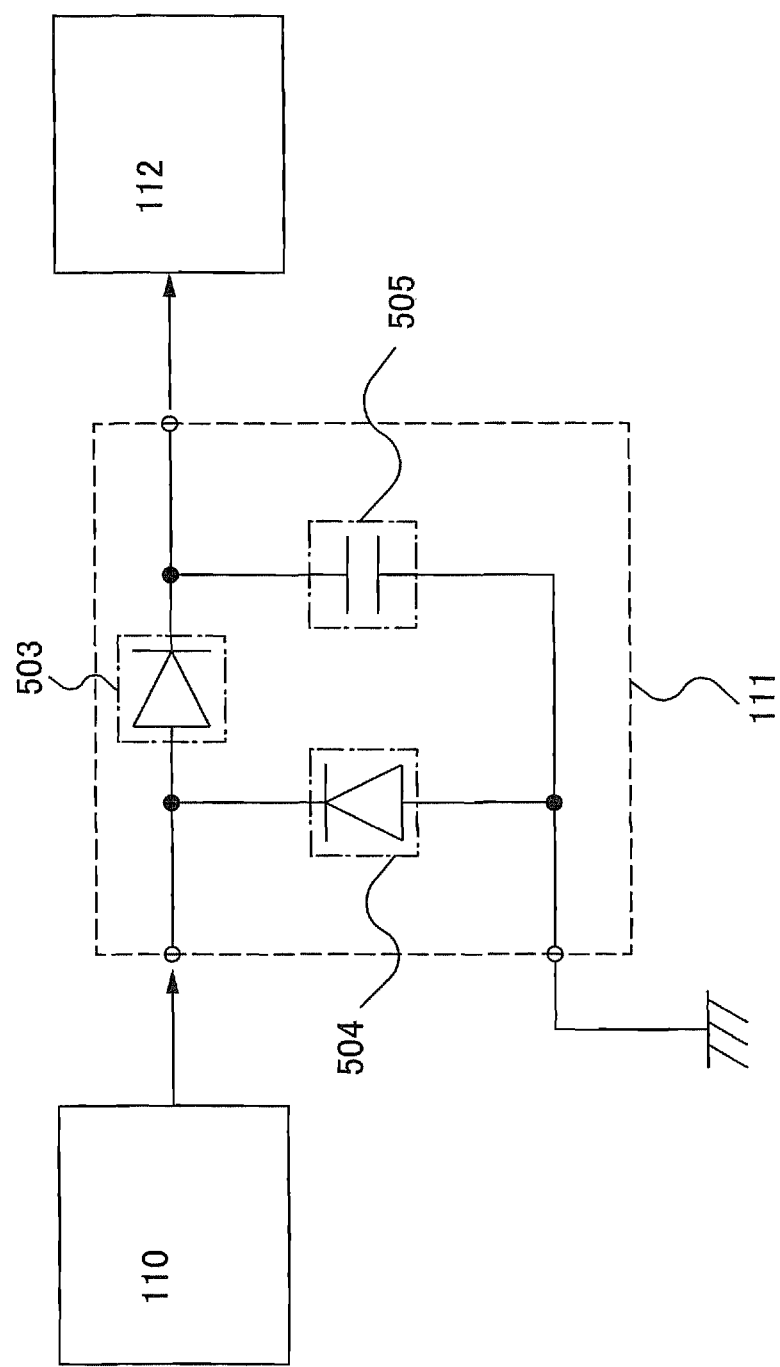
FIG. 4 is a view describing Embodiment Mode 1.

The rectifier circuit 111, for example as illustrated in FIG. 4, a diode 503, a diode 504, and a capacitor 505, and an induction signal received by the antenna 110 is half-wave rectified by the diode 504 and smoothed by the capacitor 505. The direct signal which is output from the rectifier circuit 111 and which is half-wave rectified and smoothed is supplied to the control circuit 112.

Figure 5:
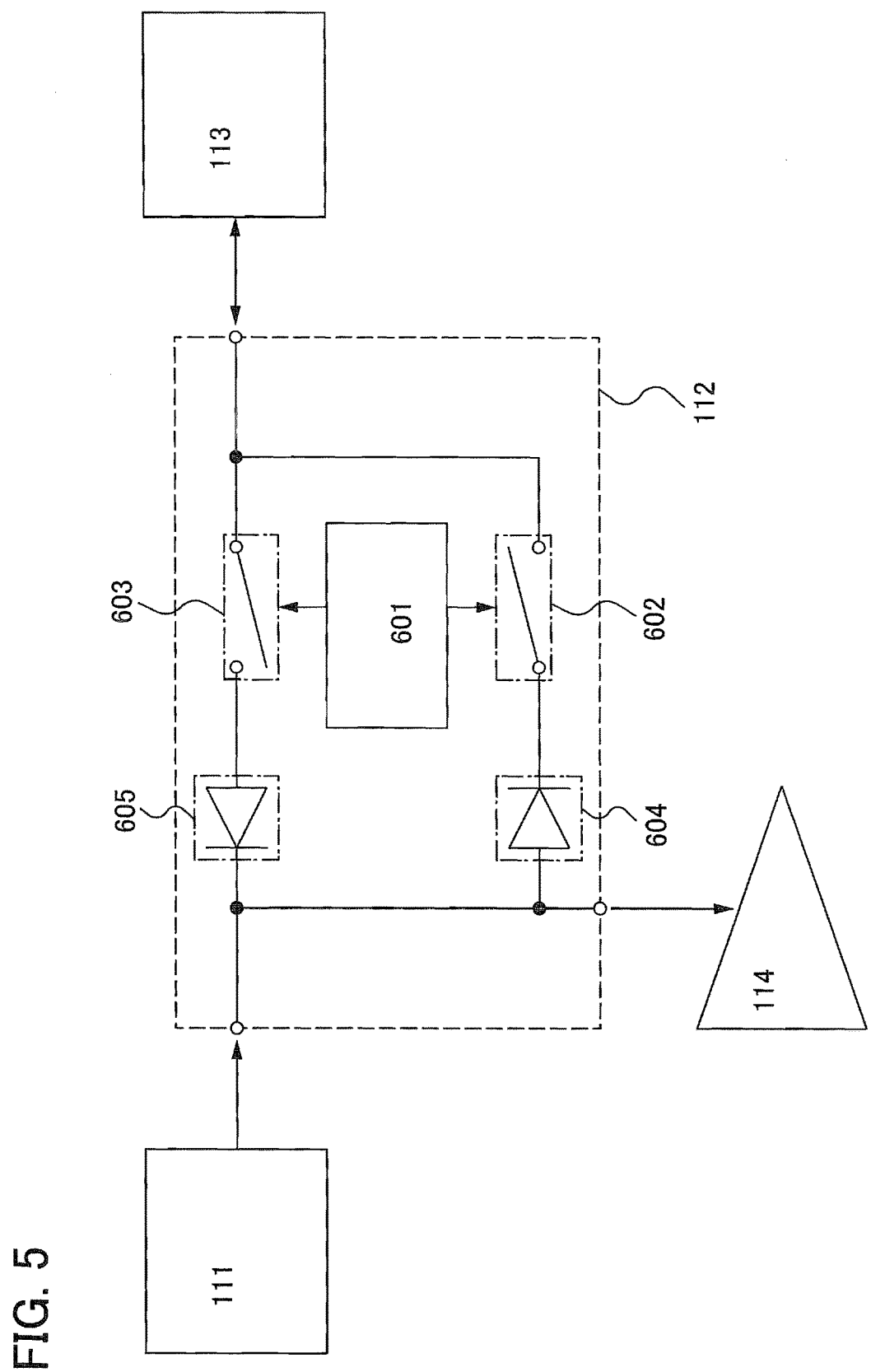
FIG. 5 is a view describing Embodiment Mode 1.

The control circuit 112, for example as illustrated in FIG. 5, includes a diode 604, a diode 605, a voltage comparison circuit 601, a switch 602 and a switch 603.

The voltage comparison circuit 601 compares an output potential of the battery 113 with a potential of a direct signal output from the rectifier circuit 111. When the potential of the direct signal output from the rectifier circuit 111 is sufficiently higher than the output potential of the battery 113, the voltage comparison circuit 601 turns the switch 602 on and the switch 603 off. Thus, current flows to the battery 113 from the rectifier circuit 111 through the diode 604 and the switch 602. On the other, hand, when the potential of the direct signal output from the rectifier circuit 111 is not sufficiently higher than the output potential of the battery 113, the voltage comparison circuit 601 turns the switch 602 off and the switch 603 on. At this time, when the potential of the direct signal output from the rectifier circuit 111 is higher than the output potential of the battery 113, no current flows to the diode 605. On the other hand, when the potential of the direct signal output from the rectifier circuit 111 is lower than the output potential of the battery 113, current flows to the amplifier circuit 114 from the battery 113 through the switch 603 and the diode 605.

Note that the control circuit is not limited to the example in Embodiment Mode 1, and may employs any mode.

As a switch employed in this specification, a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), a thyristor, or the like can be used. Alternatively, a logic circuit combining such elements can be used as a switch.

Figure 6:
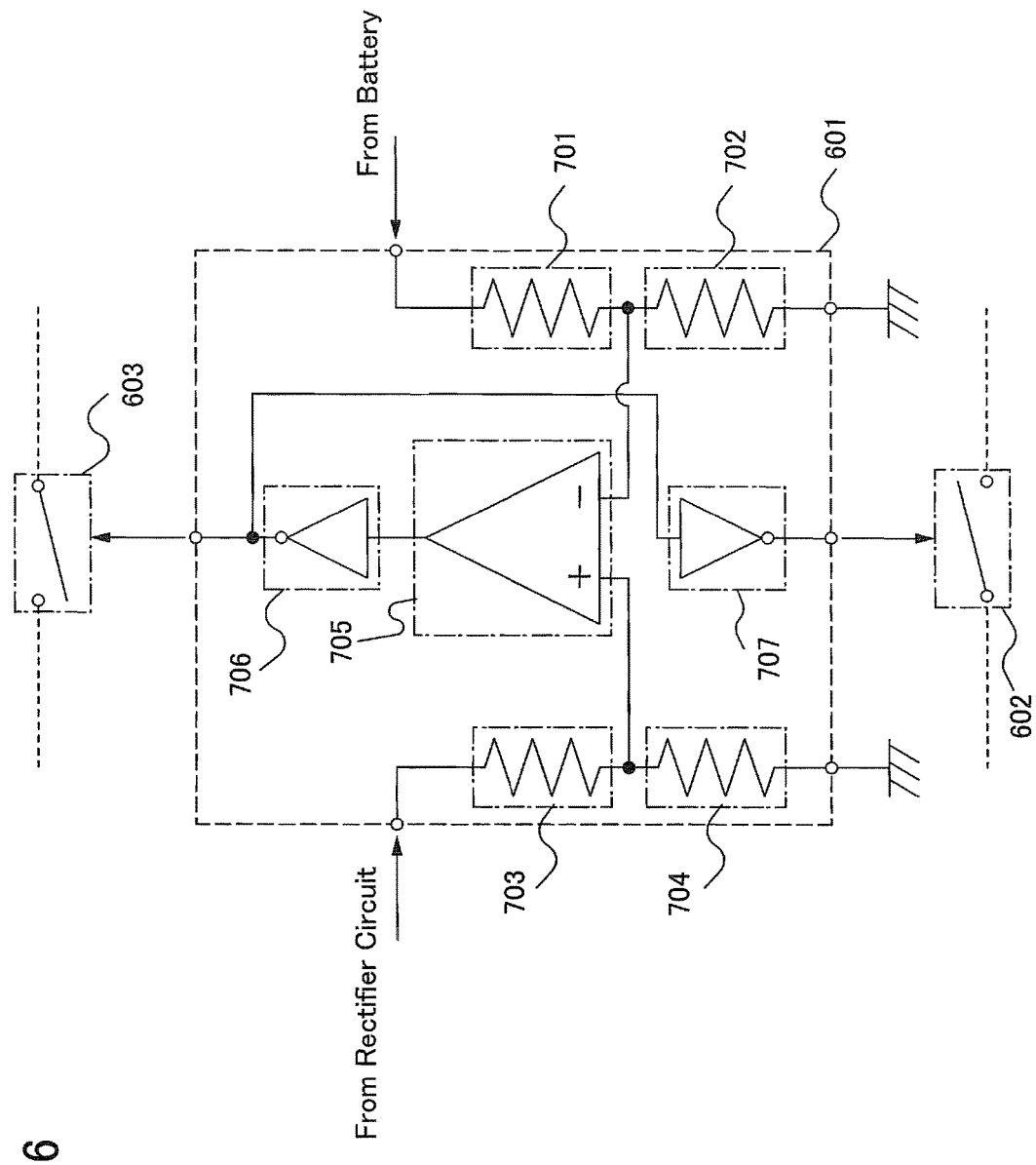
FIG. 6 is a view describing Embodiment Mode 1.

FIG. 6 illustrates an example of the voltage comparison circuit 601.

By the voltage comparison circuit 601, a voltage output from the battery 113 is divided by resistors 701 and 702, and a voltage output from the rectifier circuit 111 is divided by resistors 703 and 704. Then, the voltages divided by the resistors are input to a comparator 705. Buffers 706 and 707 of inverter topologies are connected in series with an output of the comparator 705. Then, an output of the buffer 706 is input to a control terminal of the switch 603, and an output of the buffer 707 is input to a control terminal of the switch 602, so that on/off of the switches 602 and 603 in FIG. 6 is controlled. Note that when H-level signals are input to the control terminals of the switches 602 and 603, the switches 602 and 603 are turned on, whereas when L-level signals are input, the switches 602 and 603 are turned off.

By regulating a voltage input to the comparator 705 by dividing an incoming voltage with the resistors, it becomes possible to control the timings for turning the switch 602 on and turning the switch 603 off at a point when the voltage output from the rectifier circuit becomes higher than the voltage output from the battery 113 by a certain level. Similarly, it becomes possible to control the timings for turning the switch 602 off and turning the switch 603 on at a point when the voltage output from the rectifier circuit becomes lower than the voltage output from the battery 113 by a certain level.

Note that the voltage comparison circuit is not limited to this example in this embodiment mode, and may employ any mode.

Figure 9:
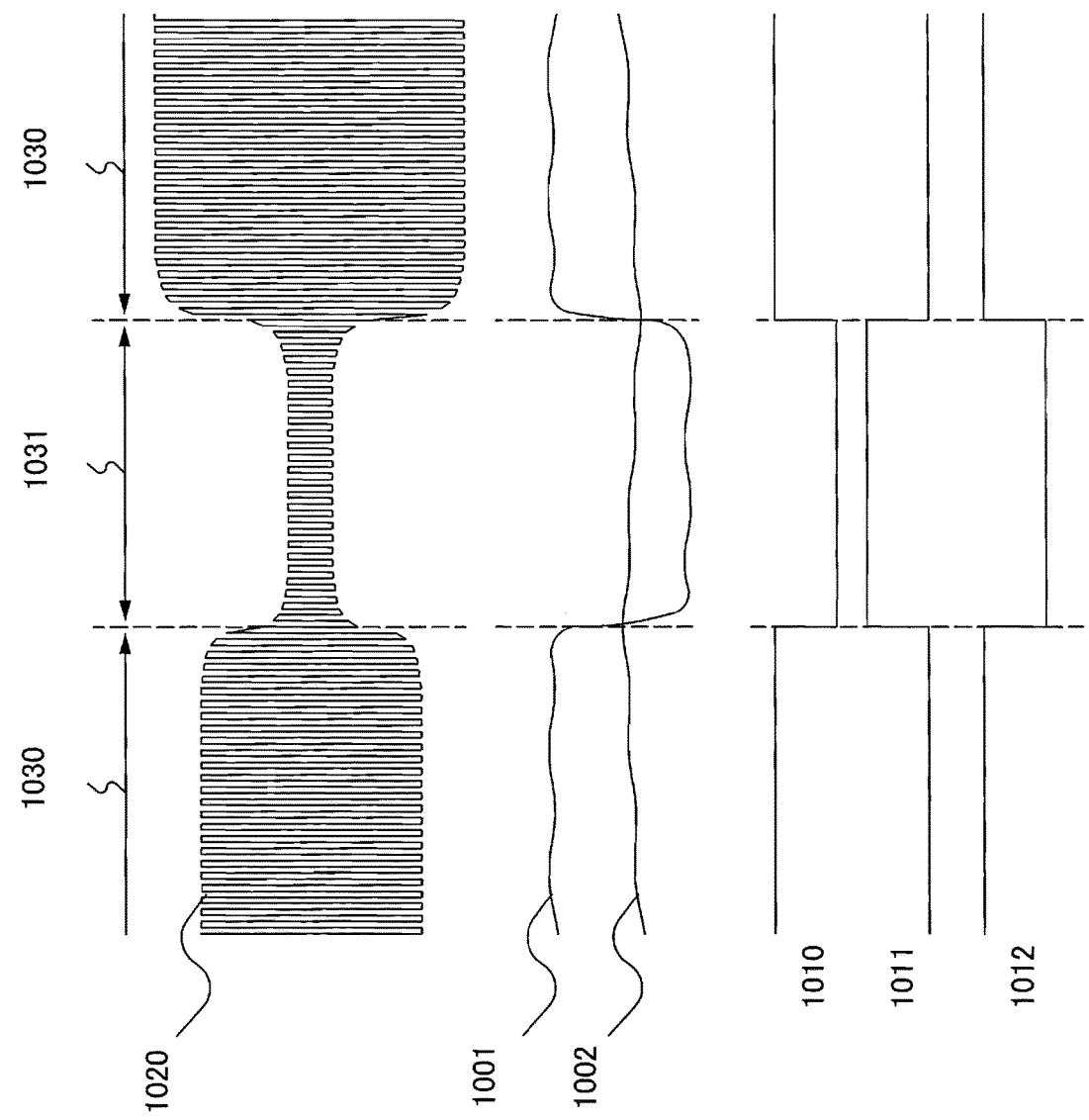
FIG. 9 is a view describing Embodiment Mode 1.

With reference to the timing chart of FIG. 9, operation of the voltage comparison circuit is described. A first waveform 1001 is a change of a potential after the division by the resistors 701 and 702 in FIG. 6. A second waveform 1002 is a change of a potential after the division by the resistors 703 and 704 in FIG. 6. A first signal 1010 is a control signal which is output from the comparator 705 and is input to the buffer 706 in FIG. 6. A second signal 1011 is a control signal which is output from the buffer 706 and is input to a control terminal of the switch 603 in FIG. 6. A third signal 1012 is a control signal which is output from the buffer 707 and is input to a control terminal of the switch 602 in FIG. 6. For simple description, a signal which is input to the rectifier circuit 111 from the antenna 110 before rectification is denoted by a waveform before rectification 1020 (a waveform of an induction signal).

Figure 10:
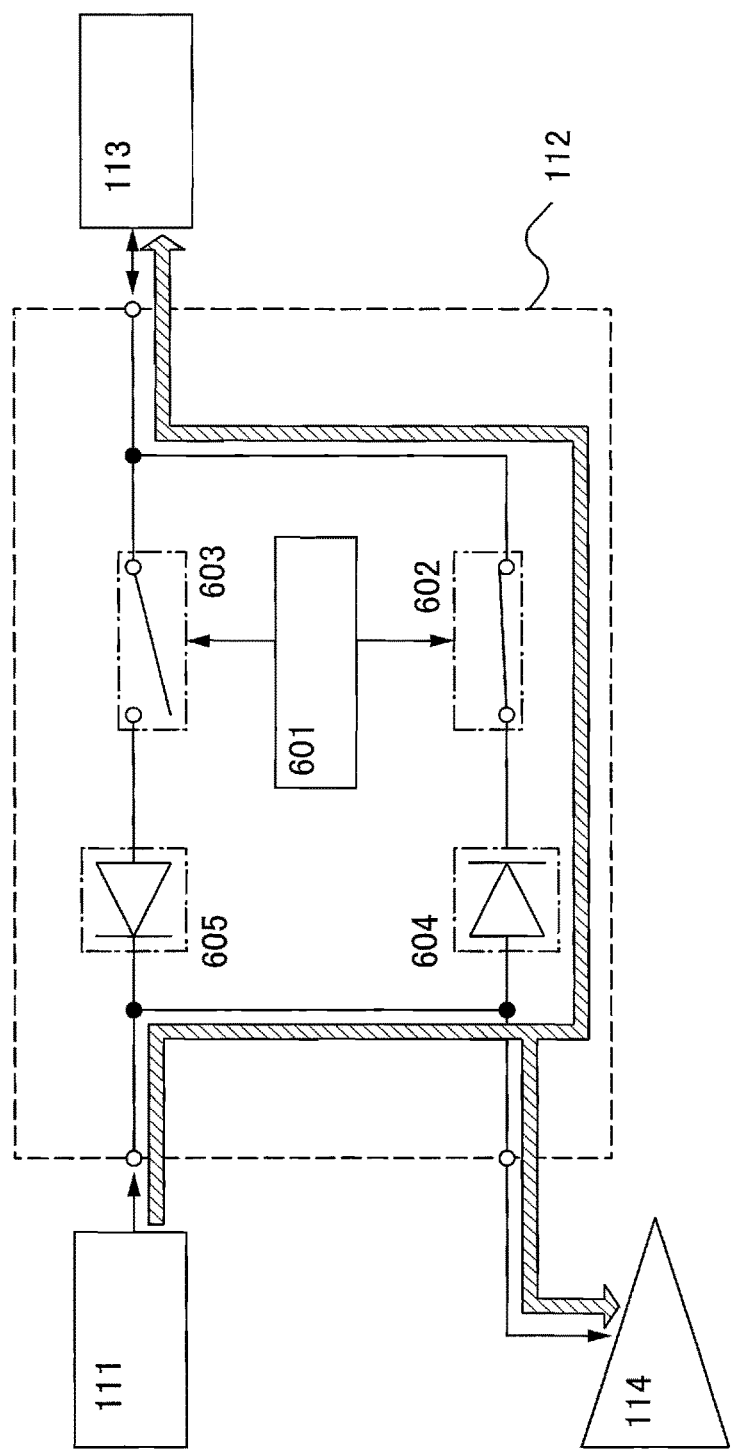
FIG. 10 is a view describing Embodiment Mode 1.

In FIG. 9, when the potential of the first waveform 1001 is higher than that of the second waveform 1002, i.e., when the amplitude of the waveform before rectification which is a signal before rectification is large, the first signal 1010 is at a high potential level (hereinafter, abbreviated as H), the second signal 1011 at a low potential level (hereinafter, abbreviated as L), and the third signal 1012 is H. Accordingly, the switch 603 to which L of the second signal 1011 is input is turned off, and the switch 602 to which H of the third signal 1012 is input is turned on. Thus, the battery 113 is charged as illustrated in FIG. 10. The period in which the battery 113 is charged is regarded as a charge period 1030, and during this charge period 1030, the amplifier circuit 114 uses power output from the rectifier circuit 111.

Figure 11:
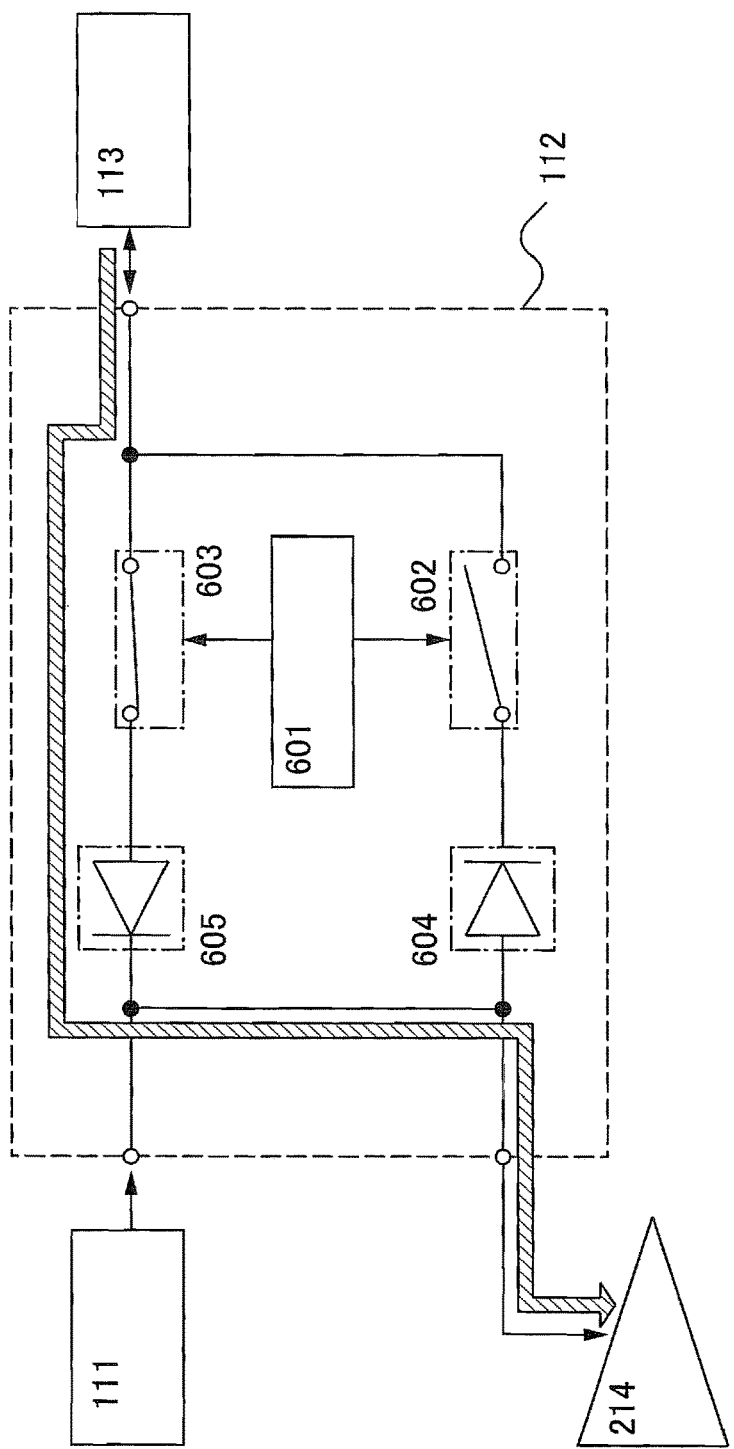
FIG. 11 is a view describing Embodiment Mode 1.

In FIG. 9, when the potential of the first waveform 1001 is lower than that of the second waveform 1002, i.e., the amplitude of the waveform before rectification 1020 which is a signal before rectification, is small, the first signal 1010, the second signal 1011 and the third signal 1012 are L, H, and L respectively. Accordingly, the switch 603 to which H of the second signal 1011 is input is turned on, and the switch 602 to which L of the third signal 1012 is input is turned off. Thus, the battery 113 is discharged as illustrated in FIG. 11. The period in which the battery 113 is discharged is regarded as a discharge period 1031, and during this discharge period 1031, the amplifier circuit 114 uses power output from the battery 113.

Therefore, the amplifier circuit 114 receives power either in the charge period 1030 or the discharge period 1031.

Non-limiting examples of the battery 113 includes secondary batteries such as a lithium ion battery, a lithium secondary battery, a nickel metal hydride battery, a nickel cadmium battery, and an organic radical battery. Alternatively, a capacitor having large capacity may be used.

Note that the term "charge" indicates that current flows to the battery 113, so that power is stored in the battery 113. Specifically, in a secondary battery, "charge" means that electric energy input to the battery 113 is converted to chemical energy to be stored. On the other hand, the term "discharge" indicates that chemical energy in the battery 113 is converted to electric energy to be output.

A capacitor having large capacity which can be used as the battery 113 of the present invention is preferably a capacitor having electrodes whose opposed areas are large. In particular, it is preferable to use an electric double layer capacitor which is formed from an electrode material having a large specific surface area such as activated carbon, fullerene, or a carbon nanotube. A capacitor has a simpler structure than a battery. Further, a capacitor can be easily formed to be thin and formed by stacking layers. An electric double layer capacitor has a function of storing power and will not deteriorate so much even after it is charged and discharged a large number of times. Further, the electric double layer capacitor has an excellent property in that it can be charged rapidly.

For the display element 115, an element including a material exhibiting a chromism phenomenon, such as a thermochromic material or an electrochromic material, can be used, but not limited to such an element.

Figure 12:
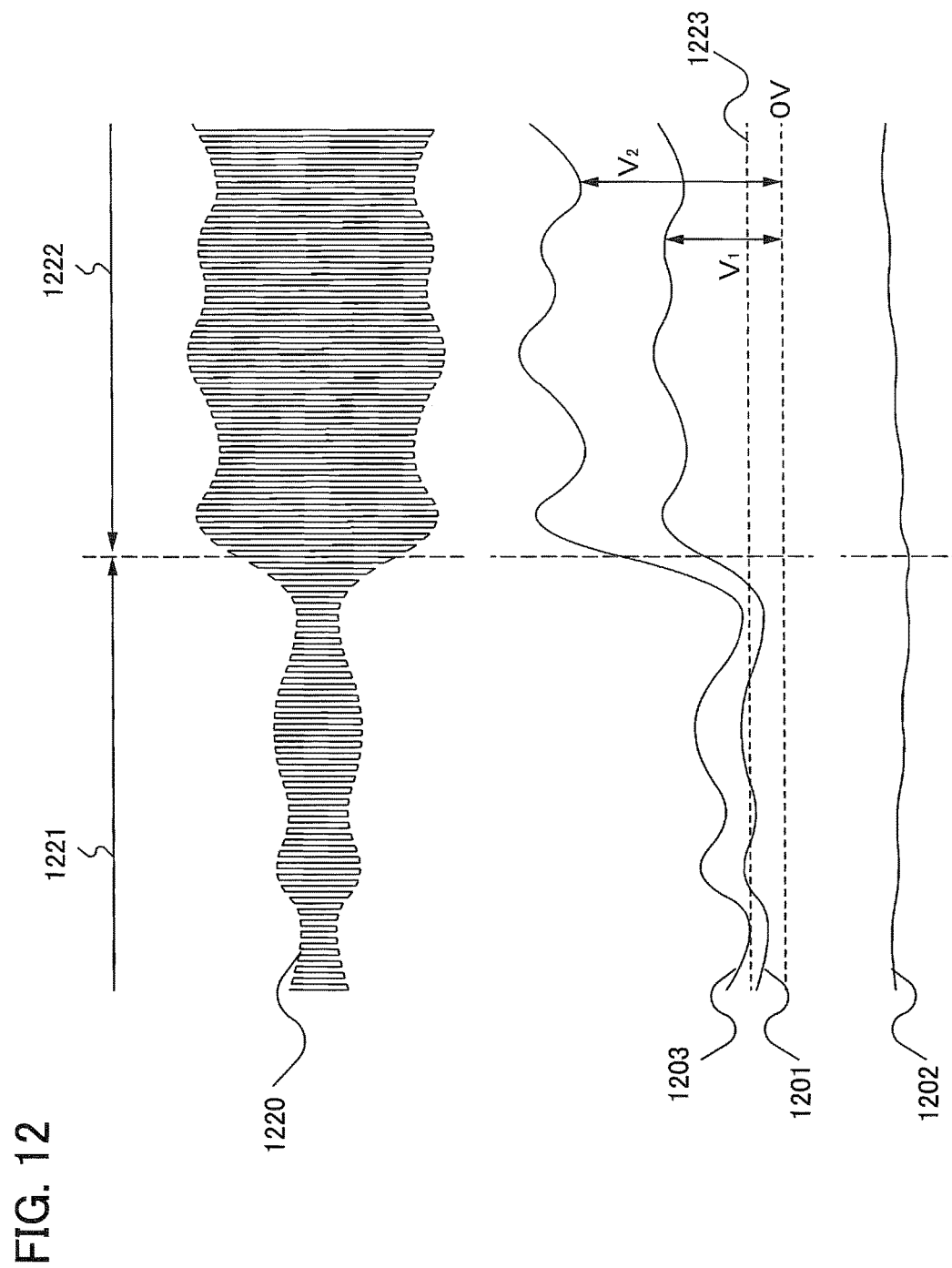
FIG. 12 is a view describing Embodiment Mode 1.

Next, with reference to the timing chart of FIG. 12, operation of the radio field intensity measurement device is described. A first waveform 1201 is a potential change of a direct signal which is rectified in the rectifier circuit 111 and is input to the amplifier circuit 114 in FIG. 2. A second waveform 1202 is a potential change of a signal which is output from the control circuit 112 and is input to the amplifier circuit 114 as power in FIG. 2. Note that the second waveform 1202 is the same as the second waveform 1002 in FIG. 9. A third waveform 1203 is a potential change of voltage, which is obtained by amplifying the first waveform 1201 input into the amplifier circuit 114 in FIG. 2 with the amplifier circuit 114 to be input to the display element 115. For simple description, a signal which is input to the rectifier circuit 111 from the antenna 110 before rectification is denoted by a waveform before rectification 1220 (a waveform of an induction signal). A period in which the waveform before rectification 1220 is small is denoted by a weak radiowave period 1221, and a period in which the waveform before rectification 1220 is large is denoted by a strong radiowave period 1222, and the minimum operation voltage of the display element 115 is denoted by reference numeral 1223. The minimum operation voltage is a minimum voltage at which the display element 115 can cause color change which is visible to human eyes.

In FIG. 12, in the weak radiowave period 1221, the first waveform 1201 is amplified as shown by the third waveform 1203. In addition, also in the strong radiowave period 1222, the first waveform 1201 is amplified as shown by the third waveform 1203. In this case, the ratio of increase from the first waveform 1201 to the third waveform ($V_2/V_1$) is referred to as an amplification ratio. Note that the amplifier circuit 114 may have such an amplification ratio that the third waveform after amplification exceeds the minimum operation voltage 1223.

Therefore, the display element 115 can operate either in the weak radiowave period 1221 or the strong radiowave period 1222.

Figure 7A:
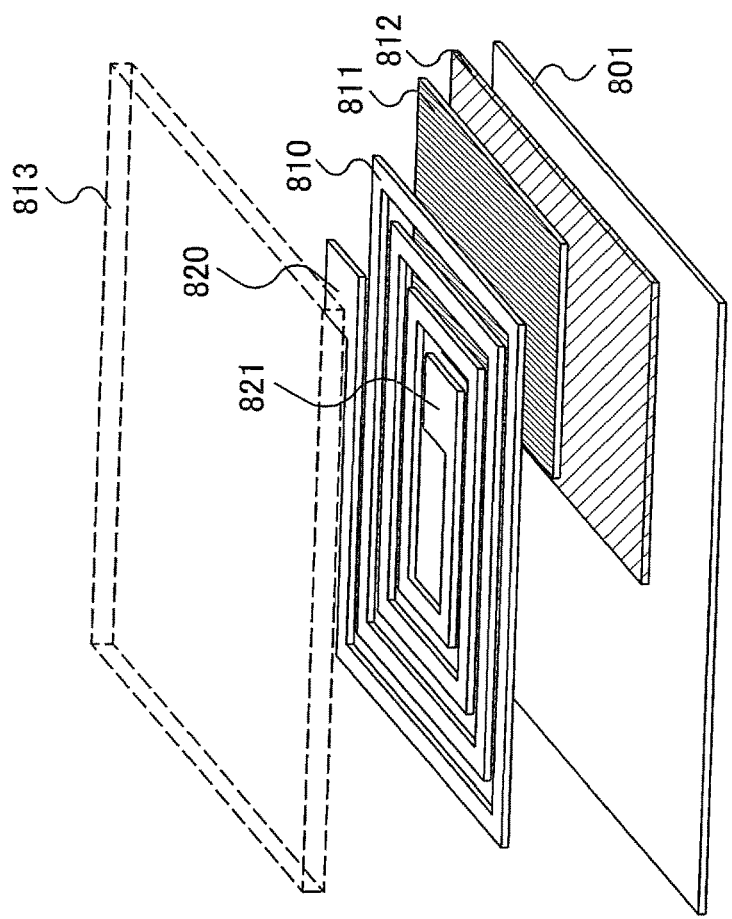
FIGS. 7A and 7B are views describing Embodiment Mode 1.

Then, FIG. 7A schematically illustrates of a radio field intensity measurement device of the present invention.

The radio field intensity measurement device illustrated in FIG. 7A includes an antenna 810, a signal processing circuit 811, a battery 812 and a display element 813 over a substrate 801. The antenna 810 includes a connection terminal 820 and a connection terminal 821. The connection terminals 820 and 821 of the antenna 810 are both connected to the signal processing circuit 811.

As a transistor which can be used for the signal processing circuit 811, various types of transistors can be applied without being limited to particular types of transistors. Accordingly, a thin film transistor (TFT) using a non-single crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be applied. Note that a non-single crystalline semiconductor film may include hydrogen or halogen.

In addition, various types of substrates can be employed as the substrate 801 without particular limitations. Accordingly, for example, a single crystalline substrate, an SOI substrate, a glass substrate, a quartz substrate, a plastic substrate, a paper substrate, a cellophane substrate, a stone substrate, or the like can be used. In addition, the signal processing circuit 811 may be formed over one substrate, and then the signal processing circuit 811 may be transferred to another substrate.

Figure 3B:
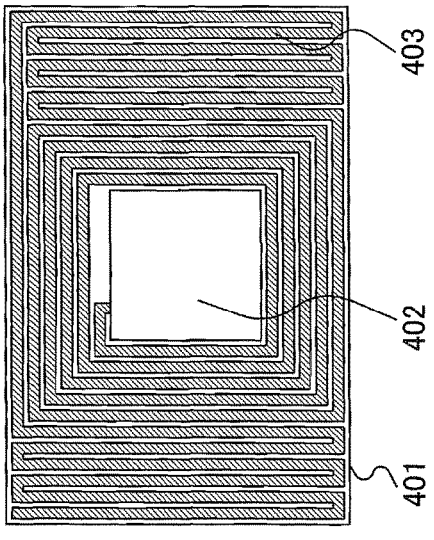
FIGS. 3A to 3E are views describing Embodiment Mode 1.
Figure 3D:
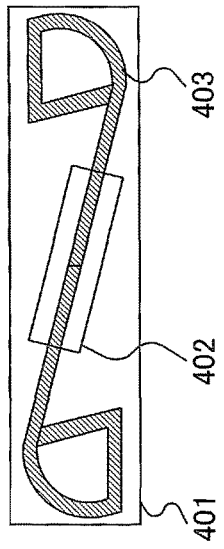
Figure 3E:
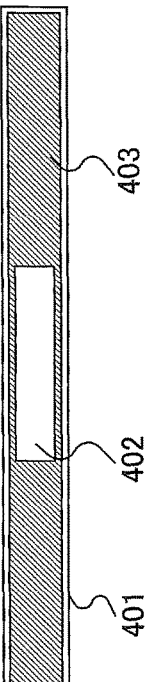
Figure 3A:
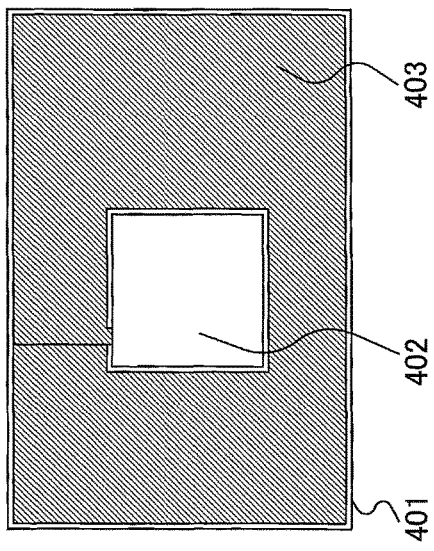
Figure 3C:
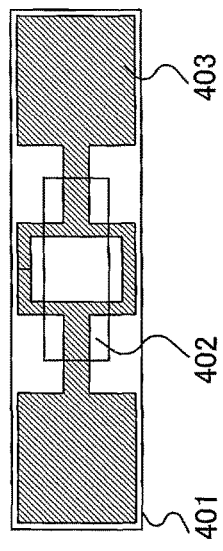

There are no particular limitations on the shape of the antenna 810. For example, as illustrated in FIG. 3A, an antenna 403 may be provided in the whole area around a signal processing circuit 402 over a substrate 401. As illustrated in FIG. 3B, a thin antenna 403 may be provided in the area around the signal processing circuit 402 over the substrate 401. As illustrated in FIG. 3C, the antenna may have such a shape that receives a high frequency electromagnetic wave. As illustrated in FIG. 3D, the antenna may have a 180-degree nondirectional shape. As illustrated in FIG. 3E, the antenna may have a stick-like elongated shape. For example, the shape such as a so-called dipole antenna, a loop antenna, a Yagi antenna, a patch antenna, or a minute antenna can be employed.

Although FIGS. 3A to 3E do not illustrate elements corresponding to the battery and the display element for simple description, the radio field intensity measurement device according to Embodiment Mode 1 includes a battery and a display element.

The antenna 810 illustrated in FIG. 7A may be formed over the substrate provided with the signal processing circuit 811 or a substrate different from the substrate provided with the signal processing circuit 811. Various types of substrates can be used as a substrate to be provided with the antenna 810, and not-limiting examples of the substrate includes a single crystalline substrate, an SOI substrate, a glass substrate, a quartz substrate, a plastic substrate, a paper substrate, a cellophane substrate, a stone substrate and the like. In the case where the antenna 810 is formed over the same substrate as the signal processing circuit 811, the antenna 810 may be formed by depositing a conductive film by sputtering, CVD, spin coating, or the like and then patterning the conductive film; or the antenna 810 may be formed by a droplet discharge method typified by an ink-jet method, a screen printing method, or the like. Also in the case where the antenna 810 is formed over a substrate which is different from the substrate over which the signal processing circuit 811 is formed, the antenna 810 can be formed by any of the aforementioned methods; however, preferably, the antenna 810 is formed by the screen printing method.

There are no particular limitations on the method of connecting the substrate provided with the signal processing circuit to the antenna. For example, wire bonding or a bump may be adopted to connect the antenna and the substrate provided with the signal processing circuit, or a method where a surface of the substrate provided with a signal processing circuit formed in a chip form is made as an electrode and the electrode is attached to the antenna may be employed. In this method, an anisotropic conductive film (ACF) can be used to connect the antenna and the substrate.

In addition, an appropriate length of the antenna varies depending on a frequency for receiving signals. For example, when the frequency is 2.45 GHz, a half-wave dipole antenna may have a length of a half wavelength (about 60 mm), or a monopole antenna may have a length of a quarter wavelength (about 30 mm).

Figure 8:
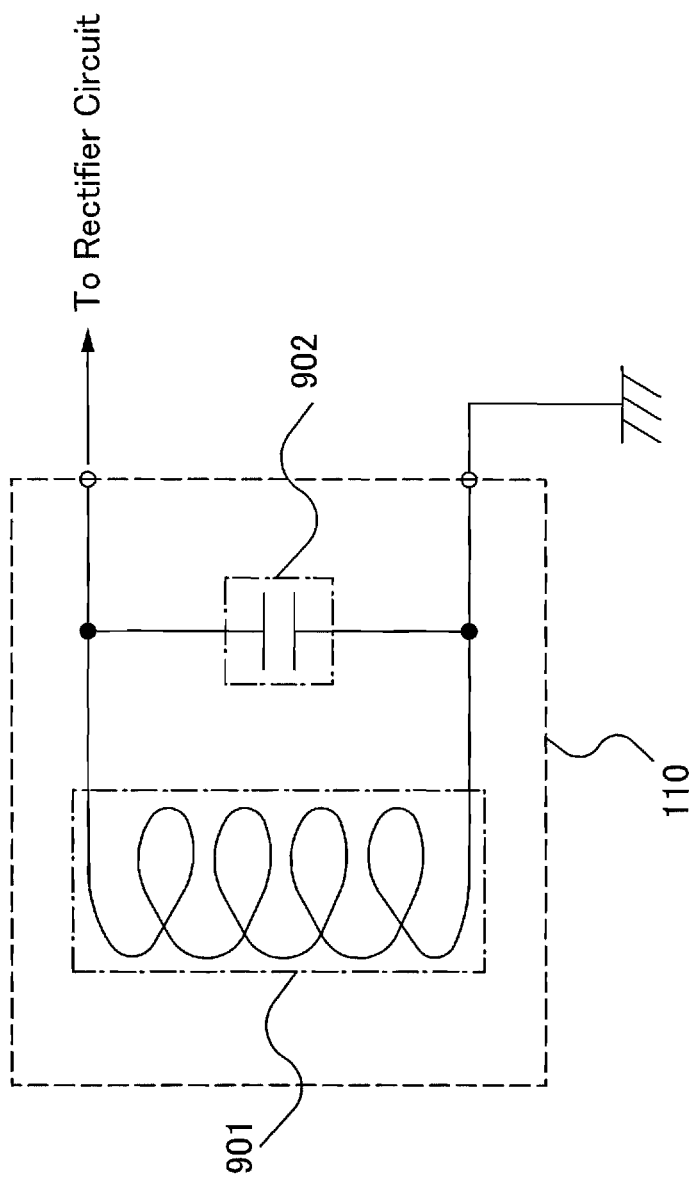
FIG. 8 is a view describing Embodiment Mode 1.

The antenna may include a means of changing frequency of a received signal. For example, when a loop antenna is used for the antenna, a resonant circuit may be formed from an antenna coil 901 and a capacitor 902 included in the antenna 110 as illustrated in FIG. 8.

Further, in FIG. 7A, the antenna 810 is formed over the same substrate as the signal processing circuit 811, or may be provided as an external antenna. As illustrated in FIG. 7A, when the antenna 810 is formed over the same substrate 801 as the signal processing circuit 811, the shape of the antenna is preferably a shape of a minute loop antenna, a minute dipole antenna or the like.

As the battery 812, secondary batteries can be used, such as a lithium ion battery, a lithium secondary battery, a nickel hydride battery, a nickel cadmium battery, an organic radical battery, a lead-acid battery, an air secondary battery, a nickel zinc battery, a silver zinc battery, and the like. The battery is not limited to these examples, and a high-capacity capacitor may be used. In particular, a lithium ion battery and a lithium secondary battery have high charging and discharging capacity. Therefore, such a lithium ion battery or such a lithium secondary battery can be used as a battery provided for the radio field intensity measurement device of Embodiment Mode 1 in the present invention, and thus miniaturization thereof can be achieved. It is to be noted that an active material or an electrolyte of a lithium ion battery is formed by a sputtering method; therefore, the battery 812 may be formed over a substrate over which the signal processing circuit 811 is formed or a substrate over which the antenna 810 is formed. The battery 812 is formed over the substrate over which the signal processing circuit 811 or the antenna 810 is formed, and thus yield is improved. In a metal lithium battery, a transition metal oxide including lithium ions, a metal oxide, a metal sulfide, an iron compound, a conductive polymer, an organic sulfur compound, or the like is used for an anode active material; lithium (alloy) is used for a cathode active material; and an organic electrolyte solution, a polymer electrolyte, or the like is used for an electrolyte. Therefore, the battery 812 can have higher charging and discharging capacity.

For the display element 813, an element including a material exhibiting chromism phenomena, such as a thermochromic material or an electrochromic material, can be used, but not limited to this element. In particular, as an element including a thermochromic material (also referred to as a thermochromic element), an element including a thermotropic liquid crystal (also referred to as a thermochromic liquid crystal), especially an element including a cholesteric liquid crystal is preferable, and the cholesteric liquid crystal may include cholesteryl oleyl carbonate, cholesteryl nonanoate, or cholesteryl benzoate. In addition, as the element including the electrochromic material (also referred to as an electrochromic element), an element including a metal oxide such as tungsten oxide or a related compound thereof may be used.

Figure 7B:
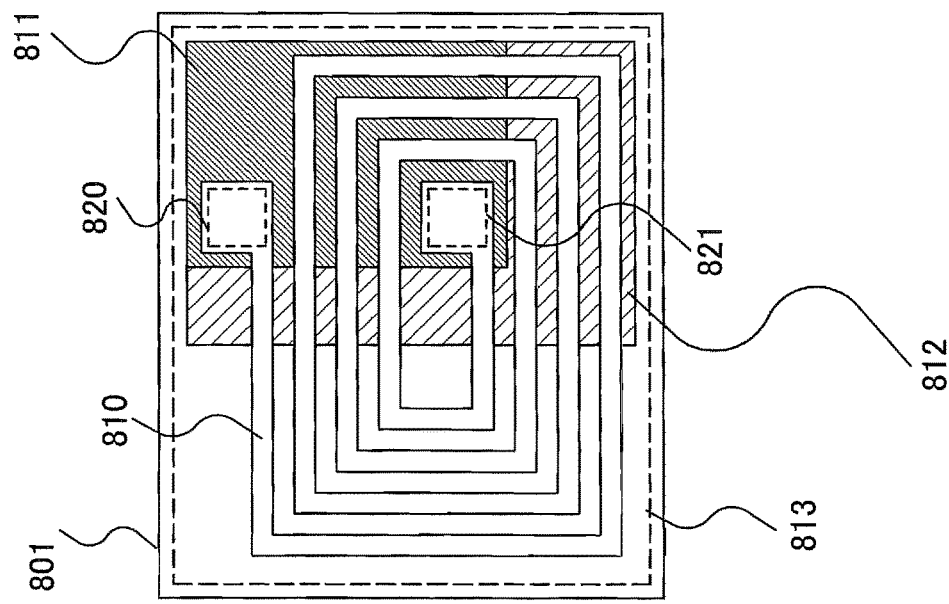

The structure of the radio field intensity measurement device according to Embodiment Mode 1 in the present invention is not limited to that of FIG. 7A. For example, in FIG. 7B, the signal processing circuit 811 is provided between the antenna 810 and the battery 812; however, the battery 812 may be provided between the antenna 810 and the signal processing circuit 811 or the antenna 810 may be provided between the battery 812 and the signal processing circuit 811. The area ratio of the antenna 810, the battery 812 and the signal processing circuit 811 is not limited to the example of FIGS. 7A and 7B. In other words, in the case where each layer in the cross-section of the radio field intensity measurement device according to this embodiment mode in the present invention is seen, there are no particular limitations on the positional relationship of the antenna 810, the battery 812 and the signal processing circuit 811. In addition, the antenna 810 and the signal processing circuit 811 may be formed over different substrates, or the antenna 810, the signal processing circuit 811, and the battery 812 may be formed over the same substrate. Note that, preferably, the display element 813 is disposed in the uppermost layer for improving visibility and has a large area.

The radio field intensity measurement device of Embodiment Mode 1 in the present invention has a battery which can store power, and replacing batteries is not needed. Furthermore, even when a received signal is weak, power can be supplied from the battery to the signal processing circuit, and thus the radio field intensity measurement device can operate to measure the intensity of the radiowave. In other words, since the radio field intensity measurement device can measure the intensity of the radiowave having a weak signal, sensitivity improvement and stable measurement of the radio field intensity measurement device can be achieved.

Moreover, when a received signal is strong, the battery can be automatically charged, and thus it is unnecessary that a user bothers charging. Needless to say, if the power stored in the battery becomes small, a user can easily charge the battery by himself/herself.

Embodiment Mode 2

Embodiment Mode 2 will describe a mode in which a display element including a thermochromic material is formed.

Figure 13A:
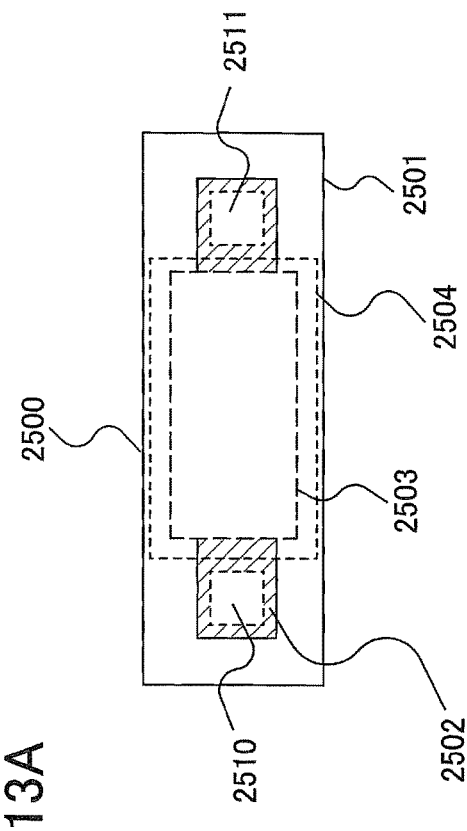
FIGS. 13A and 13B are views describing Embodiment Mode 2.
Figure 13B:
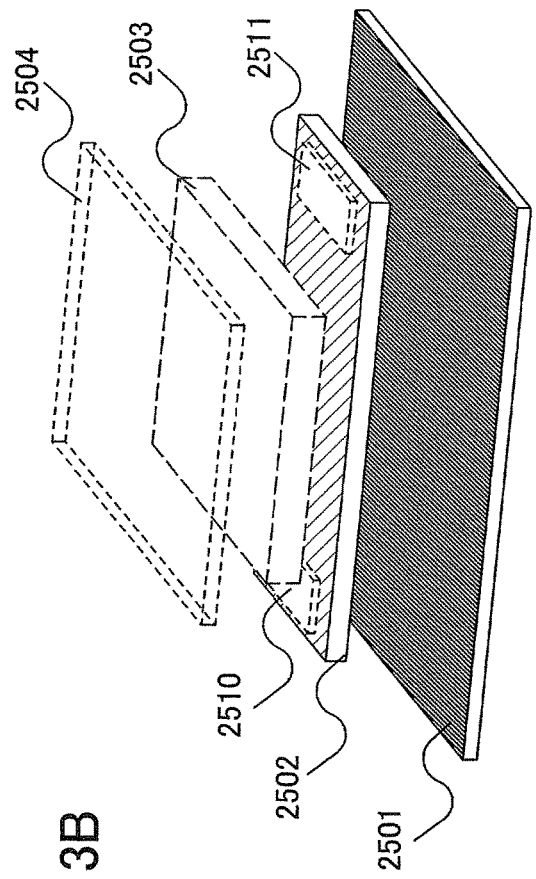

FIGS. 13A and 13B schematically illustrate a display element in the present invention. A display element 2500 includes a resistance heating element 2502, a thermochromic material 2503, a transparent substrate 2504, a connection terminal 2510 and a connection terminal 2511 over a light-shielding substrate 2501. One of the connection terminals 2510 and 2511 is connected to a power supply terminal. For example, one of the connection terminals 2510 and 2511 is connected to the amplifier circuit 114 in Embodiment Mode 1. Note that the other of the connection terminals 2510 and 2511, which is not connected to the power supply terminal, is connected to a GND terminal.

The structure of the display element in Embodiment Mode 2 is not limited to that in FIGS. 13A and 13B. For example, the thermochromic material 2503 is arranged above the resistance heating element 2502 in FIGS. 13A and 13B; alternatively the resistance heating element 2502 may be arranged over the thermochromic material 2503. The shape and area of the resistance heating element 2502 and the thermochromic material 2503 are not limited to those of FIGS. 13A and 13B. For example, a comb-like shape or a convex-concave shape may be employed. Wider areas of the resistance heating element 2502 and the thermochromic material 2503 are preferably in contact with each other to enhance thermal conductivity.

In this embodiment mode, "the resistance heating element" indicates general elements which generate heat by electrical power. The amount of generated heat is changed in accordance with the power amount supplied from a connection terminal to the resistance heating element. Various substances can be used as materials of the resistance heating element in this embodiment mode. Thus, there are no particular limitations on the applicable material for the resistance hating element.

The thermochromic material in this embodiment mode indicates general substances which exhibit thermochromism phenomena. The thermochromism phenomenon is phenomena that color of a material is reversibly changed by heat stimulation. Thus, color is changed depending on the amount of heat supplied from the resistance heating element 2502. In other words, color is changed in accordance with the amount of power supplied to the display element through the connection terminal. Various substances can be used as a thermochromic material included in the display element of this embodiment mode. Thus, there are no particular limitations on the type of the applicable thermochromic material.

A cholesteric liquid crystal, which is one example of thermochromic material in this embodiment mode, has a feature that a torsional state of the helix is changed depending on temperature. The molecular structure of the cholesteric liquid crystal and the principal of color change depending on the change of the molecular structure of the cholesteric liquid crystal are described with reference to FIGS. 14A, 14B and FIGS. 15A, 15B.

Figure 14A:
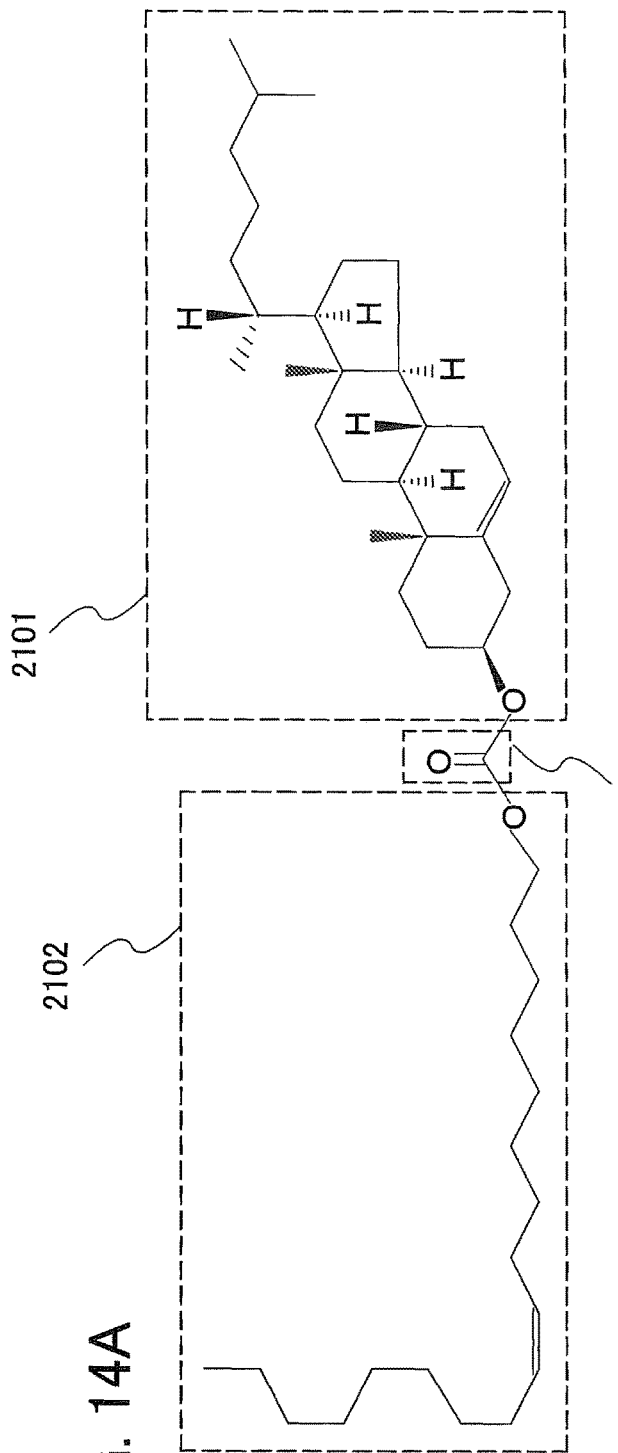
FIGS. 14A to 14C are views describing Embodiment Mode 2.
Figure 14C:
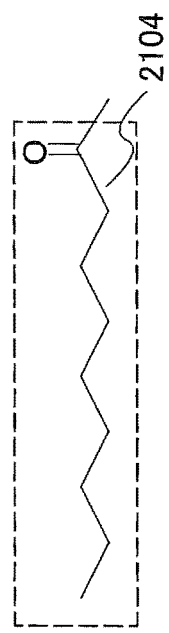
Figure 14B:
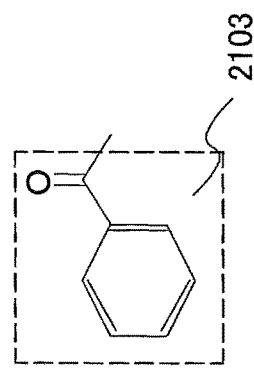

The cholesteric liquid crystal preferably includes cholesteryl oleyl carbonate in which one side of a carbonate group 2100 is bound to a cholesteryl group 2101 and the other side of the carbonate group is bound to an oleyl group 2102 which is a straight-chain hydrocarbon group as illustrated in FIG. 14A. In FIG. 14A, cholesteryl oleyl carbonate, a compound in which the carbonate group 2100 and the oleyl group 2102 are bound to the cholesteryl group 2101 is shown. Cholesteryl benzoate, a compound in which a benzoate group 2103 is bonded to the chlesteryl group 2101, instead of the carbonate group 2100 and the oleyl group 2102, as illustrated in FIG. 14B, or cholesteryl nanoate, a compound in which a nanoate group 2104 is bonded to the chlesteryl group 2101, instead of the carbonate group 2100 and the oleyl group 2102, as illustrated in FIG. 14C may be used. The mixed ratio of liquid crystal molecules including different straight-chain hydrocarbons such as cholesteryl oleyl carbonate, cholesteryl nanoate, and cholesteryl benzoate is changed to change the color of the cholesteric liquid crystal.

The cholesteric liquid crystal has a helical molecular structure and partially reflects incident light. This reflecting property is changed depending on the torsional state of the helix. For example, a cholesteric liquid crystal molecule having a pitch P selectively reflects only a wavelength ($\lambda$=n (refractive index of a cholesteric liquid crystal)×P) of wavelengths included in incident light. For example, the liquid crystal molecule 2002 of FIG. 15A has a torsion corresponding to ¼ pitch in a distance d between a transparent substrate 2000 and a light-shielding substrate 2001, and thus only a wavelength ($\lambda$=n×P=n×4d) of wavelengths included in the incident light 2003 is selectively reflected. In addition, a liquid crystal molecule 2002 illustrated in FIG. 15B has a torsion corresponding to ¾ pitch in the distance d, and thus a wavelength ($\lambda=n\times P=n\times 4/3d$) of wavelengths included in the incident light 2003 is selectively reflected.

Human eyes recognize a difference in a wavelength of light as a difference of a color. Therefore, reflection light 2004 of FIG. 15A and reflection light 2004 of FIG. 15B have different wavelengths and are recognized as different colors.

The transparent substrate 2000 illustrated in FIGS. 15A and 15B may be transparent to human eyes. Preferably, the substrate transmits all wavelengths. The light-shielding substrate 2001 illustrated in FIGS. 15A and 15B may be a substrate which is black to human eyes. Preferably, the substrate absorbs all wavelengths.

Figure 16:
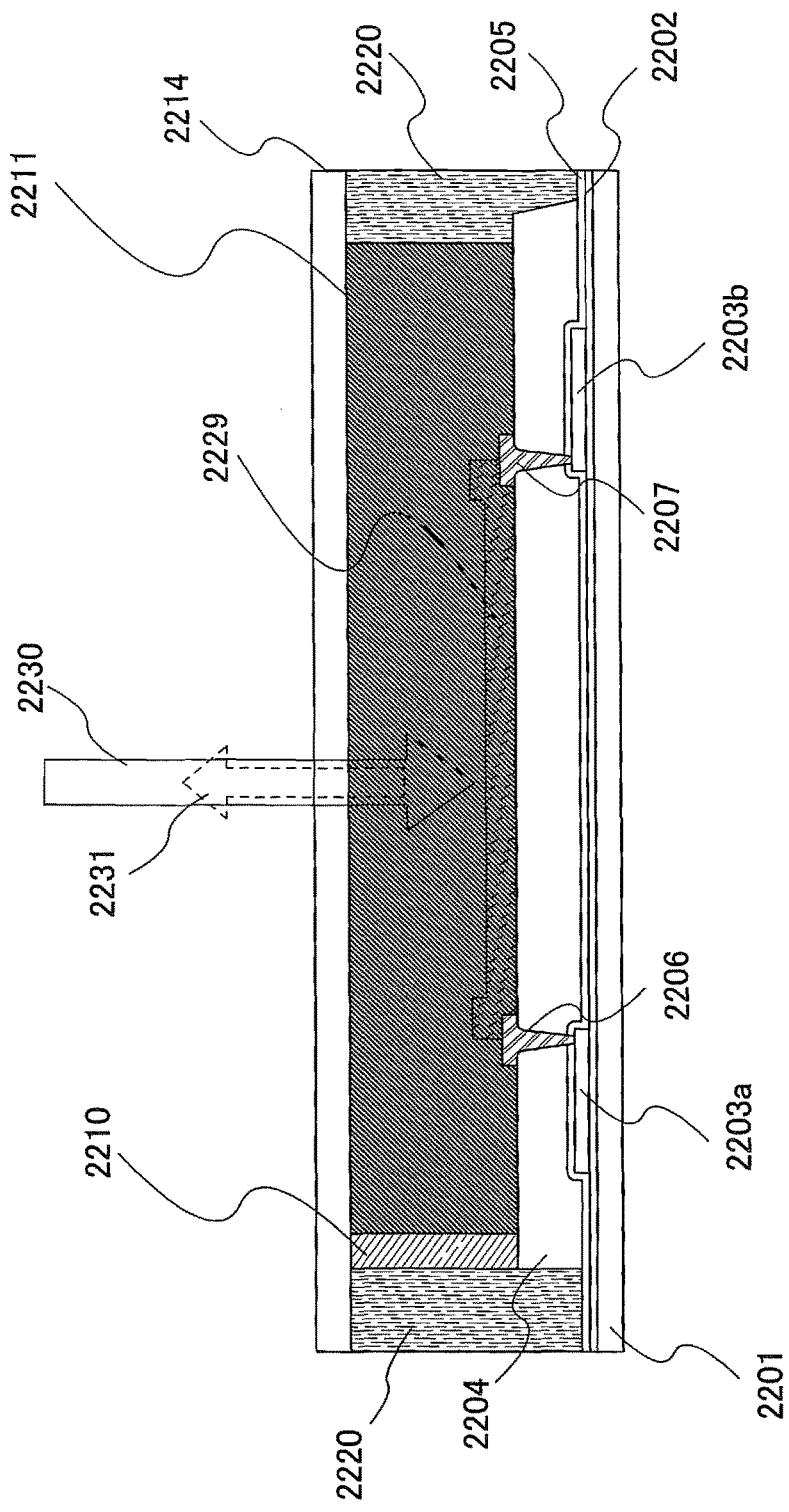
FIG. 16 is a view describing Embodiment Mode 2.

FIG. 16 is a cross-sectional view illustrating a thermochromic element which is a display element including a thermochromic material. Wirings 2203a and 2203b are provided over the light-shielding substrate 2201 with a base layer 2202 interposed therebetween. The wiring 2203a and the wiring 2203b are connected to a resistance heating element 2229 in a contact portion 2206 and a contact portion 2207 provided in an interlayer insulating film 2204 and an insulating film 2205. The resistance heating element 2229 generates heat by current flowing between the contact opening portion 2206 and the contact opening portion 2207 to heat a thermochromic material 2211. Note that the wirings 2203a and 2203b are connected to connection terminals in FIG. 13.

A transparent substrate 2214 is disposed opposite to the light-shielding substrate 2201. A thermochromic material 2211 is provided between the light-shielding substrate 2201 and the transparent substrate 2214. The distance between the light-shielding substrate 2201 and the transparent substrate 2214 is kept by a spacer 2210. After a thermochromic material 2211 is provided between the light-shielding substrate 2201 and the transparent substrate 2214, the light-shielding substrate 2201 and the transparent substrate 2214 are fixed by a sealing material 2220. It is preferable that the distance between the light-shielding substrate 2201 and the transparent substrate 2214 is narrow, since a small amount of the thermochromic material 2211 is used and the heat amount of the thermochromic material 2211 to be heated is small, which achieves rapid color change.

In such a display element, by voltage application to the resistance heating element 2229, the heat amount supplied to the thermochromic material 2211 is changed, and thus the state of the thermochromic material 2211 is changed, so that a color tone reflection light 2231 is different from that of incident light 2230.

Embodiment 1

Embodiment 1 will describe an example of a method for manufacturing the radio field intensity measurement device shown in the above-described embodiment modes with reference to drawings. In this embodiment, a structure in which an antenna, and a signal processing circuit of the radio field intensity measurement device are formed using thin film transistors over the same substrate will be explained. It is to be noted that when an antenna and a signal processing circuit are formed together over the same substrate, reduction in size of the radio field intensity measurement device can be achieved, which is advantageous. In addition, in this embodiment, an example will be explained, in which a thin-film secondary battery is used as the battery in the signal processing circuit. Needless to say, instead of the secondary battery, a capacitor such as an electric double layer capacitor may be used.

First, a peeling layer 1303 is formed over one surface of a substrate 1301 with an insulating film 1302 interposed therebetween, and then an insulating film 1304 functioning as a base film and a semiconductor film (e.g., a film containing amorphous silicon) 1305 are stacked thereover (see FIG. 17A). It is to be noted that the insulating film 1302, the peeling layer 1303, the insulating film 1304, and the semiconductor film 1305 can be formed consecutively.

The substrate 1301 is selected from a glass substrate, a quartz substrate, a metal substrate (e.g., a ceramic substrate or a stainless steel substrate), a semiconductor substrate such as a Si substrate, or the like. Alternatively, a plastic substrate made of polyethylene terephthalate (PET), polyethylene naphthalate (PEN), polyether sulfone (PES), acrylic, or the like can be used. In this process, although the peeling layer 1303 is provided over the entire surface of the substrate 1301 with the insulating film 1302 interposed therebetween, the peeling layer 1303 can also be selectively formed by photolithography after being provided over the entire surface of the substrate 1301.

The insulating films 1302 and 1304 are formed using insulating materials such as silicon oxide, silicon nitride, silicon oxynitride ($SiO_xN_y$, where $x>y>0$), or silicon nitride oxide ($SiN_xO_y$, where $x>y>0$) by a CVD method, a sputtering method, or the like. For example, when each of the insulating films 1302 and 1304 is formed to have a two-layer structure, a silicon nitride oxide film may be formed as a first insulating film and a silicon oxynitride film may be formed as a second insulating film. In addition, a silicon nitride film may be formed as a first insulating film and a silicon oxide film may be formed as a second insulating film. The insulating film 1302 functions as a blocking layer which prevents an impurity element contained in the substrate 1301 from getting mixed into the peeling layer 1303 or elements formed thereover. The insulating film 1304 functions as a blocking layer which prevents an impurity element contained in the substrate 1301 or the peeling layer 1303 from getting mixed into elements formed over the insulating film 1304. In this manner, providing the insulating films 1302 and 1304 which function as the blocking layers can prevent adverse effects on the elements formed over the peeling layer 1303 or the insulating film 1304, which would otherwise be caused by an alkali metal such as Na or an alkaline earth metal contained in the substrate 1301 or by the impurity element contained in the peeling layer 1303. It is to be noted that when quartz is used for the substrate 1301, for example, the insulating films 1302 and 1304 may be omitted.

The peeling layer 1303 may be formed using a metal film, a stacked structure of a metal film and a metal oxide film, or the like. As a metal film, either a single layer or stacked layers is/are formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing such an element as its main component. In addition, such materials can be formed by a sputtering method, various CVD methods such as a plasma CVD method, or the like. A stacked structure of a metal film and a metal oxide film can be obtained by the steps of forming the above-described metal film, applying plasma treatment thereto under an oxygen atmosphere or an $N_2O$ atmosphere or applying heat treatment thereto under an oxygen atmosphere or an $N_2O$ atmosphere, and thereby forming oxide or oxynitride of the metal film on the surface of the metal film. For example, when a tungsten film is provided as a metal film by a sputtering method, a CVD method, or the like, a metal oxide film of tungsten oxide can be formed on the surface of the tungsten film by application of plasma treatment to the tungsten film. In that case, the tungsten oxide can be represented by $WO_x$ where x is in the range of 2 to 3. For example, there are cases where x is 2 ($WO_2$), x is 2.5 ($W_2O_5$), x is 2.75 ($W_4O_{11}$), x is 3 ($WO_3$), and the like. When tungsten oxide is formed, there is no particular limitation on the value of x, and thus, which of the above oxides is to be formed may be determined base on the etching rate or the like. In addition, after a metal film (e.g., tungsten) is formed, an insulating film formed of silicon oxide ($SiO_2$) or the like may be formed over the metal film by a sputtering method, and also metal oxide (e.g., tungsten oxide on tungsten) may be formed on the metal film. Moreover, high-density-plasma treatment as described above may be applied as the plasma treatment, for example. Besides, metal nitride or metal oxynitride may also be formed. In that case, plasma treatment or heat treatment may be applied to the metal film under a nitrogen atmosphere or an atmosphere containing nitrogen and oxygen.

The amorphous semiconductor film 1305 is formed with a thickness of 25 to 200 nm (preferably, 30 to 150 nm) by a sputtering method, an LPCVD method, a plasma CVD method, or the like.

Next, the amorphous semiconductor film 1305 is crystallized by laser irradiation. Alternatively, the crystallization of the amorphous semiconductor film 1305 may be performed by a method combining the laser crystallization with a thermal crystallization method using RTA or an annealing furnace or with a thermal crystallization method using a metal element that promotes the crystallization. After that, the crystallized semiconductor film is etched into a desired shape, whereby crystalline semiconductor films 1305a to 1305f are formed. Then, a gate insulating film 1306 is formed so as to cover the semiconductor films 1305a to 1305f (see FIG. 17B).

The gate insulating film 1306 is formed using an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. For example, when the gate insulating film 1306 is formed to have a two-layer structure, it is preferable to form a silicon oxynitride film as a first insulating film and form a silicon nitride oxide film as a second insulating film. Alternatively, it is also preferable to form a silicon oxide film as a first insulating film and form a silicon nitride film as a second insulating film.

An example of a formation process of the crystalline semiconductor films 1305a to 1305f is briefly explained below. First, an amorphous semiconductor film with a thickness of 50 to 60 nm is formed by a plasma CVD method. Then, a solution containing nickel which is a metal element that promotes crystallization is retained on the amorphous semiconductor film, which is followed by dehydrogenation treatment (500° C. for one hour) and thermal crystallization treatment (550° C. for four hours). Thus, a crystalline semiconductor film is formed. Then, the crystalline semiconductor film is subjected to laser irradiation and then a photolithography process to form the crystalline semiconductor films 1305a to 1305f. It is to be noted that crystallization of the amorphous semiconductor film may be performed only by laser irradiation, not by thermal crystallization which uses a metal element that promotes crystallization.

As a laser oscillator used for crystallization, either a continuous wave laser (a CW laser) or a pulsed laser can be used. As a laser that can be used here, there are gas lasers such as an Ar laser, a Kr laser, and an excimer laser; a laser whose medium is single-crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. When irradiation is performed with the fundamental wave of such a laser beam or the second to fourth harmonics of the fundamental wave, crystals with a large grain size can be obtained. For example, the second harmonic (532 nm) or the third harmonic (355 nm) of an Nd:$YVO_4$ laser (the fundamental wave of 1064 nm) can be used. In this case, a laser power density of approximately 0.01 to 100 $MW/cm^2$ (preferably, 0.1 to 10 $MW/cm^2$) is needed, and irradiation is performed with a scanning rate of approximately 10 to 2000 cm/sec. It is to be noted that the laser whose medium is single crystal YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser, or a Ti:sapphire laser can be used as a CW laser, whereas it can also be used as a pulsed laser with a repetition rate of 10 MHz or more by a Q-switch operation, mode locking, or the like. When a laser beam with a repetition rate of 10 MHz or more is used, a semiconductor film is irradiated with the next pulse during the period in which the semiconductor film has been melted by the laser beam and is solidified. Therefore, unlike the case of using a pulsed laser with a low repetition rate, a solid-liquid interface in the semiconductor film can be continuously moved. Thus, crystal grains which have grown continuously in the scanning direction can be obtained.

The gate insulating film 1306 may be formed by oxidization or nitridation of the surfaces of the semiconductor films 1305a to 1305f by the above-described high-density plasma treatment. For example, plasma treatment with a mixed gas of a rare gas such as He, Ar, Kr, or Xe, and oxygen, nitrogen oxide ($NO_2$), ammonia, nitrogen, or hydrogen is conducted. When plasma is excited by the introduction of microwaves, plasma with a low electron temperature and high density can be generated. With oxygen radicals (which may include OH radicals) or nitrogen radicals (which may include NH radicals) which are generated by the high-density plasma, the surfaces of the semiconductor films can be oxidized or nitrided.

By such high-density plasma treatment, an insulating film with a thickness of 1 to 20 nm, typically 5 to 10 nm, is formed on the semiconductor films. Since the reaction in this case is a solid-phase reaction, the interface state density between the insulating film and the semiconductor films can be quite low. Since such high-density plasma treatment directly oxidizes (or nitrides) the semiconductor films (crystalline silicon or polycrystalline silicon), desirably, the insulating film can be formed with extremely little unevenness. In addition, since crystal grain boundaries of crystalline silicon are not strongly oxidized, an excellent state is obtained. That is, by the solid-phase oxidation of the surfaces of the semiconductor films by high-density plasma treatment which is described in this embodiment, an insulating film with a uniform thickness and low interface state density can be formed without excessive oxidation reaction at the crystal grain boundaries.

As the gate insulating film, only an insulating film formed by high-density plasma treatment may be used, or a stacked layer may be employed, which is obtained by deposition of an insulating film such as silicon oxide, silicon oxynitride, or silicon nitride on the insulating film, by a CVD method using plasma or thermal reaction. In either case, a transistor which includes such an insulating film formed by high-density plasma treatment in a part or the whole of its gate insulating film can have reduced characteristic variations.

In addition, the semiconductor films 1305a to 1305f, which are obtained by irradiation of a semiconductor film with a continuous wave laser beam or a laser beam oscillated with a repetition rate of 10 MHz or more and scanning the semiconductor film with the laser beam in one direction to crystallize the semiconductor film, have a characteristic in that their crystals grow in the beam scanning direction. Transistors are each arranged so that its channel length direction (direction in which carriers move when a channel formation region is formed) is aligned with the scanning direction, and the above-described gate insulating film is combined with the semiconductor film, whereby thin film transistors (TFTs) with high electron field effect mobility and reduced variations in characteristics can be obtained.

Next, a first conductive film and a second conductive film are stacked over the gate insulating film 1306. Here, the first conductive film is formed to a thickness of 20 to 100 nm by a CVD method, a sputtering method, or the like. The second conductive film is formed to a thickness of 100 to 400 nm. The first conductive film and the second conductive film are formed of an element selected from tantalum (Ta), tungsten (W), titanium (Ti), molybdenum (Mo), aluminum (Al), copper (Cu), chromium (Cr), niobium (Nb), or the like, or an alloy material or a compound material containing such an element as its main component. Alternatively, the first conductive film and the second conductive film are formed of semiconductor materials typified by polycrystalline silicon doped with an impurity element such as phosphorus. As a combination example of the first conductive film and the second conductive film, a tantalum nitride film and a tungsten film; a tungsten nitride film and a tungsten film; a molybdenum nitride film and a molybdenum film; and the like can be given. Tungsten and tantalum nitride have high heat resistance. Therefore, after forming the first conductive film and the second conductive film, thermal treatment for the purpose of heat activation can be applied thereto. In addition, in the case where a two-layer structure is not employed, but a three-layer structure is employed, it is preferable to use a stacked structure of a molybdenum film, an aluminum film, and a molybdenum film.

Next, a resist mask is formed by photolithography, and etching treatment is conducted to form gate electrodes and gate lines. Thus, gate electrodes 1307 are formed above the semiconductor films 1305a to 1305f. Here, a stacked structure of a first conductive film 1307a and a second conductive film 1307b is shown as an example of the gate electrode 1307.

Next, the semiconductor films 1305a to 1305f are doped with an n-type impurity element at low concentration, using the gate electrodes 1307 as masks by an ion doping method or an ion implantation method. Then, a resist mask is selectively formed by photolithography, and the semiconductor films 1305c and 1305e are doped with a p-type impurity element at high concentration. As an n-type impurity element, phosphorus (P), arsenic (As), or the like can be used. As a p-type impurity element, boron (B), aluminum (Al), gallium (Ga), or the like can be used. Here, phosphorus (P) is used as an n-type impurity element and is selectively introduced into the semiconductor films 1305a to 1305f so as to be contained at concentrations of $1\times10^{15}$ to $1\times10^{19}$/$cm^3$. Thus, n-type impurity regions 1308 are formed. In addition, boron (B) is used as a p-type impurity element, and is selectively introduced into the semiconductor films 1305c and 1305e so as to be contained at concentrations of $1\times10^{19}$ to $1\times10^{20}$/$cm^3$. Thus, p-type impurity regions 1309 are formed (see FIG. 17C).

Subsequently, an insulating film is formed so as to cover the gate insulating film 1306 and the gate electrodes 1307. The insulating film is formed to have either a single layer or a stacked layer of a film containing an inorganic material such as silicon, silicon oxide, or silicon nitride, or a film containing an organic material such as an organic resin by a plasma CVD method, a sputtering method, or the like. Next, the insulating film is selectively etched by anisotropic etching mainly in the perpendicular direction, so that insulating films 1310 (also referred to as sidewalls) which are in contact with the side surfaces of the gate electrodes 1307 are formed. The insulating films 1310 are used as masks in doping for forming LDD (Lightly Doped Drain) regions.

Next, the semiconductor films 1305a, 1305b, 1305d, and 1305f are doped with an n-type impurity element at high concentration, using resist masks formed by photolithography, the gate electrodes 1307 and the insulating films 1310 as masks. Thus, n-type impurity regions 1311 are formed. Here, phosphorus (P) is used as an n-type impurity element, and is selectively introduced into the semiconductor films 1305a, 1305b, 1305d, and 1305f so as to be contained at concentrations of $1\times10^{19}$ to $1\times10^{20}$/$cm^3$. Thus, the n-type impurity regions 1311 with higher concentration of impurity than that of the impurity regions 1308 are formed.

Through the above steps, n-channel thin film transistors 1300a, 1300b, 1300d, and 1300f, and p-channel thin film transistors 1300c and 1300e are formed (see FIG. 17D).

In the n-channel thin film transistor 1300a, a channel formation region is formed in a region of the semiconductor film 1305a which overlaps with the gate electrode 1307; the impurity regions 1311 serving as source and drain regions are formed in regions of the semiconductor film 1305a which do not overlap with the gate electrode 1307 and the insulating film 1310; and low concentration impurity regions (LDD regions) are formed in regions of the semiconductor film 1305a which overlap with the insulating film 1310, between the channel formation region and the impurity regions 1311. Similarly, channel formation regions, low concentration impurity regions, and the impurity regions 1311 are formed in the n-channel thin film transistors 1300b, 1300d, and 1300f.

In the p-channel thin film transistor 1300c, a channel formation region is formed in a region of the semiconductor film 1305c which overlaps with the gate electrode 1307, and the impurity regions 1309 serving as source and drain regions are formed in regions of the semiconductor film 1305c which do not overlap with the gate electrode 1307. Similarly, a channel formation region and the impurity regions 1309 are formed in the p-channel thin film transistor 1300e. Here, although LDD regions are not formed in the p-channel thin film transistors 1300c and 1300e, LDD regions may be provided in the p-channel thin film transistors or a structure without LDD regions may be applied to the n-channel thin film transistors.

Figure 18A:
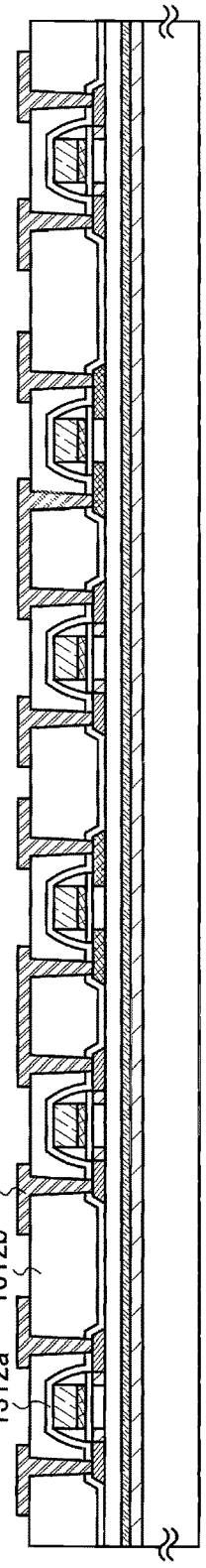
FIGS. 18A to 18C are views describing Embodiment 1.

Next, an insulating film with a single layer structure or a stacked layer structure is formed so as to cover the semiconductor films 1305a to 1305f, the gate electrodes 1307, and the like. Then, conductive films 1313 electrically connected to the impurity regions 1309 and 1311 which form the source and drain regions of the thin film transistors 1300a to 1300f are formed over the insulating film (see FIG. 18A). The insulating film is formed with a single layer or a stacked layer, using an inorganic material such as silicon oxide or silicon nitride, an organic material such as polyimide, polyamide, benzocyclobutene, acrylic, or epoxy, a siloxane material, or the like by a CVD method, a sputtering method, an SOG method, a droplet discharging method, a screen printing method, or the like. In this embodiment, the insulating film is formed to have a two-layer structure, and a silicon nitride oxide film is formed as a first insulating film 1312a and a silicon oxynitride film is fainted as a second insulating film 1312b. In addition, the conductive films 1313 can form the source and drain electrodes of the thin film transistors 1300a to 1300f.

Before the insulating films 1312a and 1312b are formed or after one or both of the insulating films 1312a and 1312b is/are formed, heat treatment is preferably conducted for recovery of the crystallinity of the semiconductor films, activation of the impurity element which has been added into the semiconductor films, or hydrogenation of the semiconductor films. As the heat treatment, thermal annealing, laser annealing, RTA, or the like may be applied.

The conductive films 1313 are formed with a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component by a CVD method, a sputtering method or the like. An alloy material containing aluminum as its main component corresponds to, for example, a material which contains aluminum as its main component and also contains nickel, or a material which contains aluminum as its main component, and also contains nickel and one or both of carbon and silicon. The conductive films 1313 are preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. Note that the "barrier film" corresponds to a thin film formed of titanium, titanium nitride, molybdenum, or molybdenum nitride. Aluminum and aluminum silicon are suitable materials for forming the conductive films 1313 because they have low resistance value and are inexpensive. When barrier layers are provided as the top layer and the bottom layer, generation of hillocks of aluminum or aluminum silicon can be prevented. In addition, when a barrier film formed of titanium which is an element having a high reducing property is formed, even when there is a thin natural oxide film formed on the crystalline semiconductor film, the natural oxide film can be chemically reduced, and a favorable contact between the conductive film 1313 and the crystalline semiconductor film can be obtained.

Next, an insulating film 1314 is formed so as to cover the conductive films 1313, and conductive films 1315a and 1315b electrically connected to the conductive films 1313 which form the source electrodes or the drain electrodes of the thin film transistors 1300a and 1300f are formed over the insulating film 1314. In addition, a conductive film 1316 electrically connected to the conductive film 1313 which forms the source electrode or drain electrode of the thin film transistor 1300b is formed. It is to be noted that the conductive films 1315a and 1315b and the conductive film 1316 may be formed using the same material at the same time. The conductive films 1315a and 1315b and the conductive film 1316 can be formed using any of the above-described materials for the conductive film 1313.

Figure 18B:
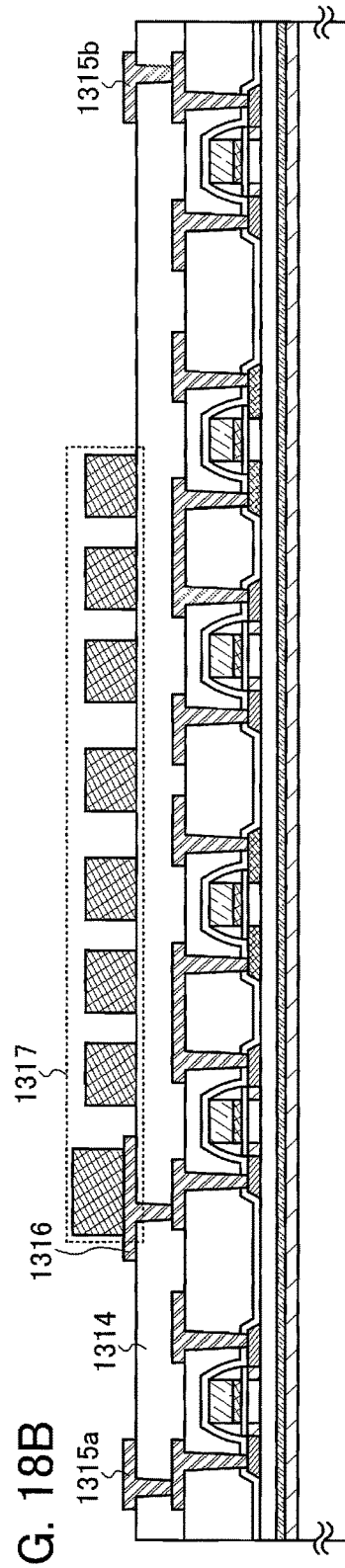

Next, a conductive film 1317 functioning as an antenna is formed so as to be electrically connected to the conductive film 1316 (see FIG. 18B).

The insulating film 1314 can be formed with a single layer or a stacked layer of an insulating film containing oxygen and/or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method or the like. It is to be noted that a siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. In addition, a fluoro group may be used as the substituent. Further, both a fluoro group and an organic group containing at least hydrogen may be used as the substituent.

The conductive film 1317 can be formed of a conductive material by a CVD method, a sputtering method, a printing method such as screen printing or gravure printing, a droplet discharging method, a dispenser method, a plating method, or the like. The conductive film 1317 is formed with a single layer or a stacked layer of an element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material containing such an element as its main component.

For example, when the conductive film 1317 functioning as an antenna is formed by a screen printing method, the conductive film can be provided by selective printing of a conductive paste in which conductive particles with a grain diameter of several nm to several tens of urn are dissolved or dispersed in an organic resin. The conductive particles can be at least one or more of metal particles selected from silver (Ag), gold (Au), copper (Cu), nickel (Ni), platinum (Pt), palladium (Pd), tantalum (Ta), molybdenum (Mo), titanium (Ti), and the like; fine particles of silver halide; and dispersive nanoparticles of such an element. In addition, the organic resin included in the conductive paste can be one or more of organic resins which function as a binder, a solvent, a dispersing agent, and a coating material of the metal particles. Typically, an organic resin such as an epoxy resin and a silicone resin can be given as examples. Preferably, a conductive paste is applied and baked to form the conductive film. For example, in the case of using fine particles (e.g., a grain diameter of 1 to 100 nm) containing silver as its main component as a material of the conductive paste, the conductive paste is baked and hardened at temperatures of 150 to 300° C., so that the conductive film can be obtained. Alternatively, it is also possible to use fine particles containing solder or lead-free solder as its main component. In that case, fine particles with a grain diameter of less than or equal to 20 μm are preferably used. Solder and lead-free solder have the advantage of low cost.

The conductive films 1315a and 1315b can function as wirings which are electrically connected to a secondary battery included in the radio field intensity measurement device of the present invention in a later step. In addition, in forming the conductive film 1317 which functions as an antenna, other conductive films may be separately formed so as to be electrically connected to the conductive films 1315a and 1315*b*, so that the conductive films can be utilized as the wirings to connect the conductive films 1315*a* and 1315*b* to the secondary battery.

Figure 18C:
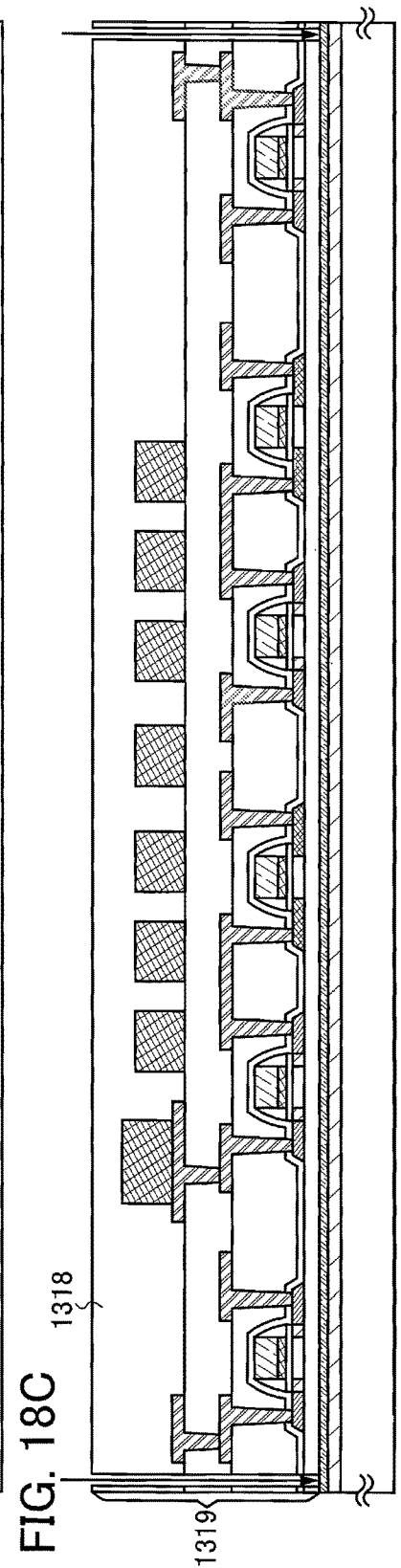

Next, after forming an insulating film 1318 so as to cover the conductive film 1317, a layer including the thin film transistors 1300*a* to 1300*f*, the conductive film 1317, and the like (hereinafter referred to as an "element formation layer 1319") is peeled off the substrate 1301. Here, after forming opening portions in the element formation layer 1319 excluding the region of the thin film transistors 1300*a* to 1300*f* by laser irradiation (e.g., UV light) (see FIG. 18C), the element formation layer 1319 can be peeled off the substrate 1301 with a physical force. The peeling layer 1303 may be selectively removed by introduction of an etchant into the opening portions before peeling the element formation layer 1319 off the substrate 1301. As the etchant, a gas or a liquid containing halogen fluoride or an interhalogen compound is used. For example, when chlorine trifluoride ($ClF_3$) is used as the gas containing halogen fluoride, the element formation layer 1319 is peeled off the substrate 1301. The whole peeling layer 1303 is not removed but part thereof may be left. Accordingly, the consumption of the etchant can be suppressed and process time for removing the peeling layer can be shortened. In addition, even after removing the peeling layer 1303, the element formation layer 1319 can be held above the substrate 1301. In addition, by reuse of the substrate 1301 from which the element formation layer 1319 has been peeled, cost reduction can be achieved.

The insulating film 1318 can be formed with a single layer or a stacked layer of an insulating film containing oxygen and/or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method, or the like.

Figure 19A:
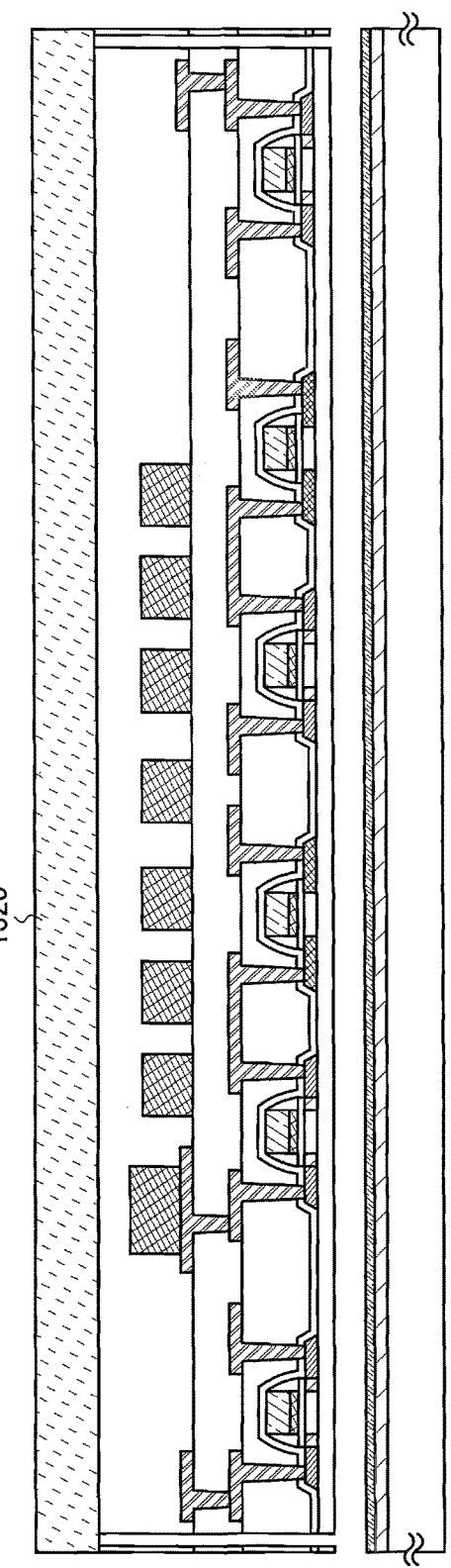
FIGS. 19A and 19B are views describing Embodiment 1.

In this embodiment, after forming the opening portions in the element formation layer 1319 by laser irradiation, a first sheet material 1320 is attached to one surface of the element formation layer 1319 (the surface where the insulating film 1318 is exposed), and then the element formation layer 1319 is peeled off the substrate 1301 (see FIG. 19A).

Figure 19B:
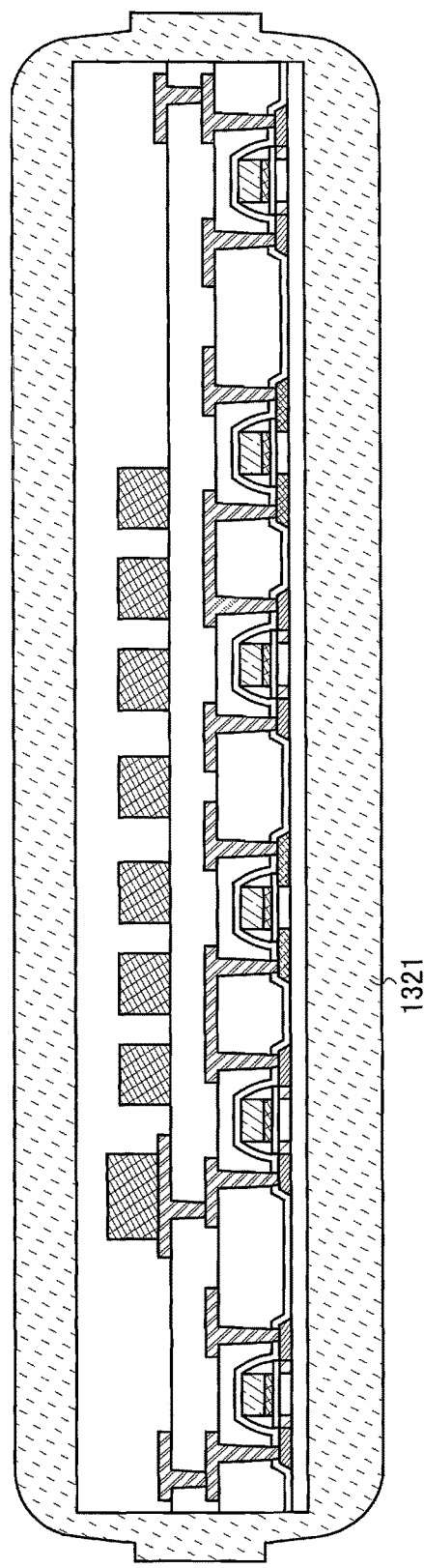

Next, a second sheet material 1321 is attached to the other surface of the element formation layer 1319 (the surface exposed by peeling), followed by one or both of heat treatment and pressurization treatment for attachment of the second sheet material 1321 (see FIG. 19B). As the first sheet material 1320 and the second sheet material 1321, a hot-melt film or the like can be used.

As the first sheet material 1320 and the second sheet material 1321, a film on which antistatic treatment for preventing static electricity or the like has been applied (hereinafter referred to as an antistatic film) can be used. As examples of the antistatic film, a film in which an antistatic material is dispersed in a resin, a film to which an antistatic material is attached, and the like can be given. The film provided with an antistatic material can be a film with an antistatic material provided on one of its surfaces, or a film with an antistatic material provided on each of its surfaces. The film with an antistatic material provided on one of its surfaces may be attached to the layer so that the antistatic material is placed on the inner side of the film or the outer side of the film. The antistatic material may be provided for the entire surface of the film, or over a part of the film. As an antistatic material, a metal, indium tin oxide (ITO), or a surfactant such as an amphoteric surfactant, a cationic surfactant, or a nonionic surfactant can be used. Further, as an antistatic material, a resin material which contains a cross-linked copolymer having a carboxyl group and a quaternary ammonium base on its side chain, or the like can be used. Such a material is attached, mixed, or applied to a film, so that an antistatic film can be formed. The element formation layer is sealed using the antistatic film, so that the semiconductor elements can be protected from adverse effects such as external static electricity when dealt with as a commercial product.

It is to be noted that a thin-film secondary battery is connected to the conductive films 1315*a* and 1315*b*, so that the battery is formed. The connection with the secondary battery may be conducted before the element formation layer 1319 is peeled off the substrate 1301 (at the stage shown in FIG. 18B or FIG. 18C), after the element formation layer 1319 is peeled off the substrate 1301 (at the stage shown in FIG. 19A), or after the element formation layer 1319 is sealed with the first sheet material and the second sheet material (at the stage shown in FIG. 19B). An example where the element formation layer 1319 and the secondary battery are formed to be connected is explained below with reference to FIGS. 20A and 20B and FIGS. 21A and 21B.

In FIG. 18B, conductive films 1331*a* and 1331*b* which are electrically connected to the conductive films 1315*a* and 1315*b*, respectively are formed at the same time as the conductive film 1317 which functions as an antenna. Then, the insulating film 1318 is formed so as to cover the conductive films 1317, 1331*a*, and 1331*b*, followed by formation of opening portions 1332*a* and 1332*b* so that the surfaces of the conductive films 1331*a* and 1331*b* are exposed. After that, the opening portions are formed in the element formation layer 1319 by laser irradiation, and then the first sheet material 1332 is attached to one surface of the element formation layer 1319 (the surface where the insulating film 1318 is exposed), so that the element formation layer 1319 is peeled off the substrate 1301 (see FIG. 20A).

Next, the second sheet material 1333 is attached to the other surface of the element formation layer 1319 (the surface exposed by peeling), and the element formation layer 1319 is peeled off the first sheet material 1332. Therefore, a material with low viscosity is used as the first sheet material 1332. Then, conductive films 1334*a* and 1334*b* which are electrically connected to the conductive films 1331*a* and 1331*b* respectively through the opening portions 1332*a* and 1332*b* are selectively formed (see FIG. 20B).

The conductive films 1334*a* and 1334*b* are formed of a conductive material by a CVD method, a sputtering method, a printing method such as screen printing or gravure printing, a droplet discharging method, a dispenser method, a plating method, or the like. The conductive films 1334*a* and 1334*b* are formed with a single layer or a stacked layer of an element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material containing the element as its main component.

Although the example shown in this embodiment is the case where the conductive films 1334*a* and 1334*b* are formed after peeling the element formation layer 1319 off the substrate 1301, the element formation layer 1319 may be peeled off the substrate 1301 after the formation of the conductive films 1334*a* and 1334*b*.

Next, in the case where a plurality of elements is formed over the substrate, the element formation layer 1319 is cut into elements (see FIG. 21A). A laser irradiation apparatus, a dicing apparatus, a scribing apparatus, or the like can be used for the cutting. At this time, the plurality of elements formed over one substrate is separated from one another by laser irradiation.

Next, the separated elements are electrically connected to the secondary battery (see FIG. 21B). In this embodiment, a thin-film secondary battery is used as the battery, in which a current-collecting thin film, a negative electrode active material layer, a solid electrolyte layer, a positive electrode active material layer, and a current-collecting thin film are sequentially stacked.

Conductive films 1336a and 1336b are formed of a conductive material by a CVD method, a sputtering method, a printing method such as screen printing or gravure printing, a droplet discharging method, a dispenser method, a plating method, or the like. The conductive films 1336a and 1336b are formed with a single layer or a stacked layer of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing such an element as its main component. The conductive material should have high adhesion to a negative electrode active material layer and also low resistance. In particular, aluminum, copper, nickel, vanadium, or the like is preferably used.

The structure of the thin-film secondary battery is described next. A negative electrode active material layer 1381 is formed over the conductive film 1336a. In general, vanadium oxide ($V_2O_5$) or the like is used. Next, a solid electrolyte layer 1382 is formed over the negative electrode active material layer 1381. In general, lithium phosphate ($Li_3PO_4$) or the like is used. Next, a positive electrode active material layer 1383 is formed over the solid electrolyte layer 1382. In general, lithium manganate ($LiMn_2O_4$) or the like is used. Lithium cobaltate ($LiCoO_2$) or lithium nickel oxide ($LiNiO_2$) may also be used. Next, a current-collecting thin film 1384 to serve as an electrode is formed over the positive electrode active material layer 1383. The current-collecting thin film 1384 should have high adhesion to the positive electrode active material layer 1383 and also low resistance. For example, aluminum, copper, nickel, vanadium, or the like can be used.

Each of the above thin layers of the negative electrode active material layer 1381, the solid electrolyte layer 1382, the positive electrode active material layer 1383, and the current-collecting thin film 1384 may be formed by a sputtering technique or an evaporation technique. In addition, the thickness of each layer is preferably 0.1 to 3 μm.

Next, an interlayer film 1385 is formed by application of a resin. The interlayer film 1385 is etched to form a contact hole. The interlayer film 1385 is not limited to a resin, and other films such as a CVD oxide film may be used as well; however, a resin is preferably used in terms of flatness. In addition, the contact hole may be formed without using etching, but using a photosensitive resin. Next, a wiring layer 1386 is formed over the interlayer film 1385 and connected to the conductive film 1336b. Thus, an electrical connection with the thin-film secondary battery is secured.

Here, the conductive films 1334a and 1334b which are provided in the element formation layer 1319 are connected to the conductive films 1336a and 1336b respectively, which serve as the connection terminals of the thin film secondary battery 1389, which has been made in advance. Here, an example is shown in which an electrical connection between the conductive films 1334a and 1336a or an electrical connection between the conductive films 1334b and 1336b is performed by pressure bonding with an adhesive material such as an anisotropic conductive film (ACF) or an anisotropic conductive paste (ACP) interposed therebetween. In this embodiment, the example is shown, in which the connection is performed using conductive particles 1338 included in an adhesive resin 1337. Alternatively, a conductive adhesive such as a silver paste, a copper paste, or a carbon paste; solder joint; or the like can be used.

The structures of such transistors can be various without being limited to the specific structure shown in this embodiment. For example, a multi-gate structure having two or more gate electrodes may be employed. When a multi-gate structure is employed, a structure in which channel regions are connected in series is provided; therefore, a structure in which a plurality of transistors are connected in series is provided. When a multi-gate structure is employed, various advantages can be obtained in that off-current can be reduced; withstand voltage of the transistor can be increased, so that the reliability is increased; and even if drain-source voltage changes when the transistor operates in the saturation region, a drain-source current does not change very much, and thus flat characteristics can be obtained. In addition, a structure in which gate electrodes are formed above and below a channel may also be employed. When a structure in which gate electrodes are formed above and below a channel is employed, the channel region is enlarged and the amount of current flowing therethrough can be increased. Thus, a depletion layer can be easily formed and the subthreshold swing (S value) can be decreased. When gate electrodes are formed above and below a channel, a structure in which a plurality of transistors is connected in parallel is provided.

In addition, any of the following structures may be employed: a structure in which a gate electrode is formed above a channel; a structure in which a gate electrode is formed below a channel; a staggered structure; and an inversely staggered structure. Further, a structure in which a channel region is divided into a plurality of regions and the divided regions are connected in parallel or in series may be employed. In addition, a channel (or part thereof) may overlap with a source electrode or a drain electrode. However, when a structure in which a channel (or part thereof) overlaps with a source electrode or a drain electrode is employed, electric charges can be prevented from being accumulated in part of the channel and thus an unstable operation can be prevented. In addition, an LDD (Lightly Doped Drain) region may be provided. When an LDD region is provided, off-current can be reduced; the withstand voltage of the transistor can be increased, so that the reliability is increased; and even if drain-source voltage changes when the transistor operates in the saturation region, drain-source current does not change very much, and thus flat characteristics can be obtained.

The method of manufacturing the radio field intensity measurement device in this embodiment can be applied to any of the radio field intensity measurement devices in the other embodiments.

Embodiment 2

Embodiment 2 will describe an example of a method for manufacturing the radio field intensity measurement device described in the above embodiment modes, with reference to drawings. In this embodiment, a structure in which an antenna and a signal processing circuit of the radio field intensity measurement device are formed over the same substrate will be explained. It is to be noted that an antenna and a signal processing circuit are formed using transistors including channel formation regions formed on a single crystal substrate, together over the same single crystal substrate. When transistors formed using a single crystal substrate are used as the transistors, a radio field intensity measurement device having transistors with few characteristic variations can be formed, which is preferable. In addition, in this embodiment, an example is explained in which the thin-film secondary battery described in Embodiment 1 is used as the battery included in the signal processing circuit.

Figure 22A:
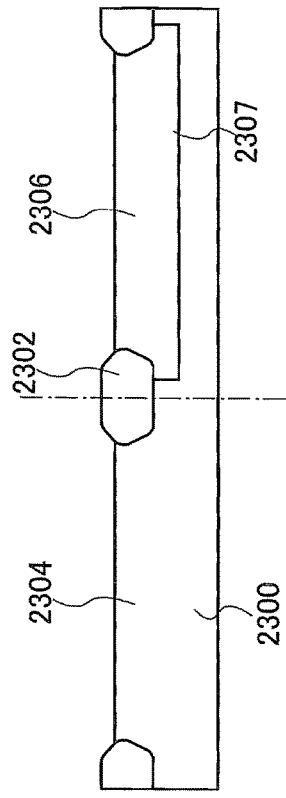
FIGS. 22A to 22C are views describing Embodiment 2.

First, separated regions 2304 and 2306 (hereinafter simply referred to as regions 2304 and 2306) are formed in a semiconductor substrate 2300 (see FIG. 22A). The regions 2304 and 2306 provided in the semiconductor substrate 2300 are separated from each other by an insulating film (also referred to as a field oxide film) 2302. The example shown here is the case where a single crystal Si substrate having n-type conductivity is used as the semiconductor substrate 2300, and a p well 2307 is formed in the region 2306 of the semiconductor substrate 2300.

Any substrate can be used as the substrate 2300 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (Silicon on Insulator) substrate formed by a bonding method or a SIMOX (Separation by IMplanted OXygen) method, or the like can be used.

The regions 2304 and 2306 can be formed by a LOCOS (LOCal Oxidation of Silicon) method, a trench isolation method, or the like.

In addition, the p well 2307 formed in the region 2306 of the semiconductor substrate 2300 can be formed by selective doping of the semiconductor substrate 2300 with a p-type impurity element. As a p-type impurity element, boron (B), aluminum (Al), gallium (Ga), or the like can be used.

In this embodiment, although the region 2304 is not doped with an impurity element because an n-type semiconductor substrate is used as the semiconductor substrate 2300, an n well may be formed in the region 2304 by introduction of an n-type impurity element. As an n-type impurity element, phosphorus (P), arsenic (As), or the like can be used. When a p-type semiconductor substrate is used, on the other hand, the region 2304 may be doped with an n-type impurity element to form an n well, whereas the region 2306 may not be doped with an impurity element.

Figure 22B:
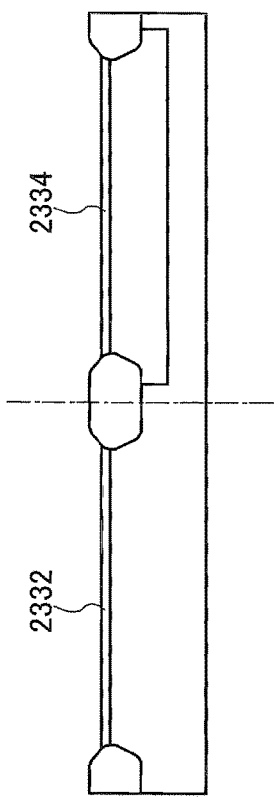

Next, insulating films 2332 and 2334 are formed so as to cover the regions 2304 and 2306, respectively (see FIG. 22B).

For example, surfaces of the regions 2304 and 2306 provided in the semiconductor substrate 2300 are oxidized by heat treatment, so that the insulating films 2332 and 2334 can be formed of silicon oxide films. Alternatively, the insulating films 2332 and 2334 may be formed to have a stacked structure of a silicon oxide film and a film containing oxygen and nitrogen (a silicon oxynitride film) by the steps of forming a silicon oxide film by a thermal oxidation method and then nitriding the surface of the silicon oxide film by nitridation treatment.

Further alternatively, the insulating films 2332 and 2334 can be formed by plasma treatment as described above. For example, the insulating films 2332 and 2334 can be formed using a silicon oxide ($SiO_x$) film or a silicon nitride ($SiN_x$) film which is obtained by application of high-density plasma oxidation or high-density plasma nitridation treatment to the surfaces of the regions 2304 and 2306 provided in the semiconductor substrate 2300. Furthermore, after applying high-density plasma oxidation treatment to the surfaces of the regions 2304 and 2306, high-density plasma nitridation treatment may be performed. In that case, silicon oxide films are formed on the surfaces of the regions 2304 and 2306, and then silicon oxynitride films are formed on the silicon oxide films Thus, the insulating films 2332 and 2334 are each formed to have a stacked structure of the silicon oxide film and the silicon oxynitride film. In addition, high-density plasma oxidation or high-density nitridation treatment may be applied to the silicon oxide films after silicon oxide films are formed on the surfaces of the regions 2304 and 2306 by a thermal oxidation method.

The insulating films 2332 and 2334 formed over the regions 2304 and 2306 of the semiconductor substrate 2300 respectively function as the gate insulating films of transistors which are completed later.

Figure 22C:
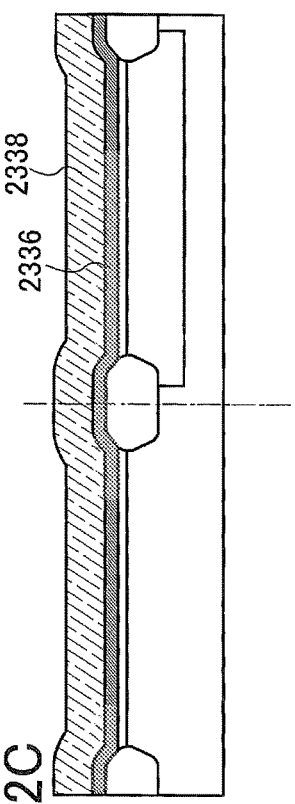

Next, a conductive film is formed so as to cover the insulating films 2332 and 2334 which are formed over the regions 2304 and 2306, respectively (see FIG. 22C). Here, an example is shown in which conductive films 2336 and 2338 are sequentially stacked as the conductive film. Needless to say, the conductive film may be formed to have a single layer or a stacked structure of three or more layers.

As materials of the conductive films 2336 and 2338, an element selected from tantalum (Ta), tungsten (W), titanium (Ti), molybdenum (Mo), aluminum (Al), copper (Cu), chromium (Cr), niobium (Nb), or the like, or an alloy material or a compound material containing such an element as its main component can be used. Alternatively, a metal nitride film obtained by nitridation of the above element can be used. Besides, a semiconductor material typified by polycrystalline silicon doped with an impurity element such as phosphorus can be used.

In this case, a stacked structure is employed in which the conductive film 2336 is formed using tantalum nitride and the conductive film 2338 is formed thereover using tungsten. Alternatively, it is also possible to form the conductive film 2336 using a single-layer film or a stacked film of tungsten nitride, molybdenum nitride, and/or titanium nitride and form the conductive film 2338 using a single-layer film or a stacked film of tantalum, molybdenum, and/or titanium.

Figure 23A:
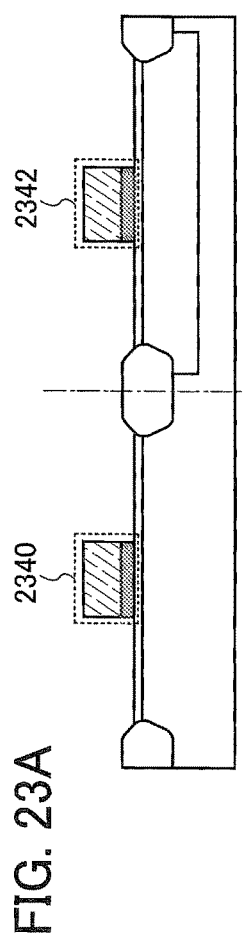
FIGS. 23A to 23C are views describing Embodiment 2.

Next, the stacked conductive films 2336 and 2338 are selectively removed by etching, so that the conductive films 2336 and 2338 remain above part of the regions 2304 and 2306, respectively. Thus, gate electrodes 2340 and 2342 are formed (see FIG. 23A).

Figure 23B:
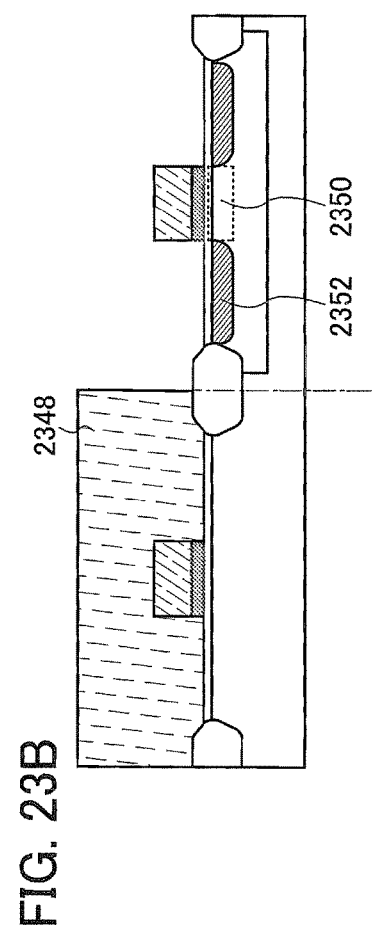

Next, a resist mask 2348 is selectively formed so as to cover the region 2304, and the region 2306 is doped with an impurity element, using the resist mask 2348 and the gate electrode 2342 as masks, so that impurity regions are formed (see FIG. 23B). As an impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used as the impurity element.

In FIG. 23B, by introduction of an impurity element, impurity regions 2352 which form source and drain regions and a channel formation region 2350 are formed in the region 2306.

Figure 23C:
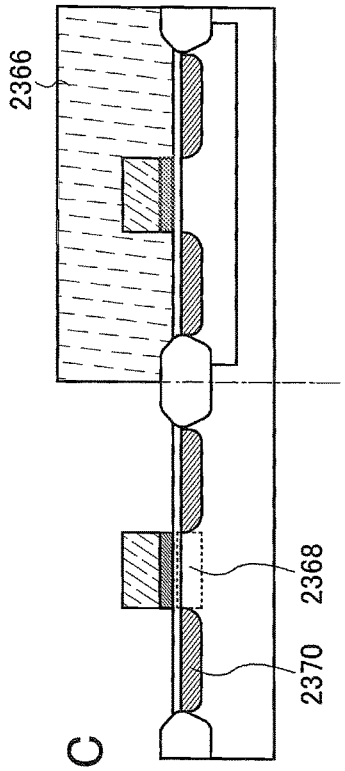

Next, a resist mask 2366 is selectively formed so as to cover the region 2306, and the region 2304 is doped with an impurity element, using the resist mask 2366 and the gate electrode 2340 as masks, so that impurity regions are formed (see FIG. 23C). As the impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. At this time, an impurity element (e.g., boron (B)) of a conductivity type different from that of the impurity element introduced into the region 2306 in FIG. 23B is used. As a result, impurity regions 2370 which form source and drain regions and a channel formation region 2368 are formed in the region 2304.

Figure 24A:
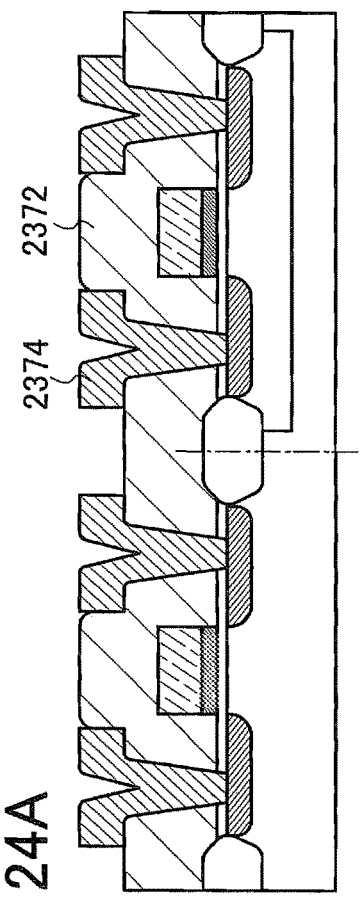
FIGS. 24A and 24B are views describing Embodiment 2.

Next, a second insulating film 2372 is formed so as to cover the insulating films 2332 and 2334 and the gate electrodes 2340 and 2342. Then, wirings 2374, which are electrically connected to the impurity regions 2352 and 2370 formed in the regions 2306 and 2304 respectively, are formed over the second insulating film 2372 (see FIG. 24A).

The second insulating film 2372 can be formed with a single layer or a stacked layer of an insulating film containing oxygen and/or nitrogen such as silicon oxide ($SiO_x$), silicon nitride ($SiN_x$), silicon oxynitride ($SiO_xN_y$, where x>y>0), or silicon nitride oxide ($SiN_xO_y$ where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method or the like. A siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. Also, a fluoro group may be used as the substituent, or both a fluoro group and an organic group containing at least hydrogen may be used.

The wirings 2374 are formed with a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing such an element as its main component by a CVD method, a sputtering method or the like. An alloy material containing aluminum as its main component corresponds to, for example, a material which contains aluminum as its main component and also contains nickel, or a material which contains aluminum as its main component and also contains nickel and one or both of carbon and silicon. The wirings 2374 are preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. It is to be noted that the "barrier film" corresponds to a thin film formed of titanium, titanium nitride, molybdenum, or molybdenum nitride. Aluminum and aluminum silicon are suitable materials for forming the wirings 2374 because they have high resistance values and are inexpensive. When barrier layers are provided as the top layer and the bottom layer, generation of hillocks of aluminum or aluminum silicon can be prevented. When a barrier film formed of titanium which is an element having a high reducing property is formed, even when there is a thin natural oxide film formed on the crystalline semiconductor film, the natural oxide film can be chemically reduced, and a favorable contact between the wirings 2374 and the crystalline semiconductor film can be obtained.

It is to be noted that the structure of transistors of the present invention is not limited to the one shown in the drawing. For example, a transistor with an inversely staggered structure, a FinFET structure, or the like can be used. A FinFET structure is preferable because it can suppress a short channel effect which occurs along with reduction in transistor size.

The radio field intensity measurement device of the present invention includes a battery by which power can be stored in the signal processing circuit. As the battery, a capacitor such as an electric double layer capacitor or a thin-film secondary battery is preferably used. In this embodiment, a connection between the transistor formed in this embodiment and a thin-film secondary battery is explained.

Figure 24B:
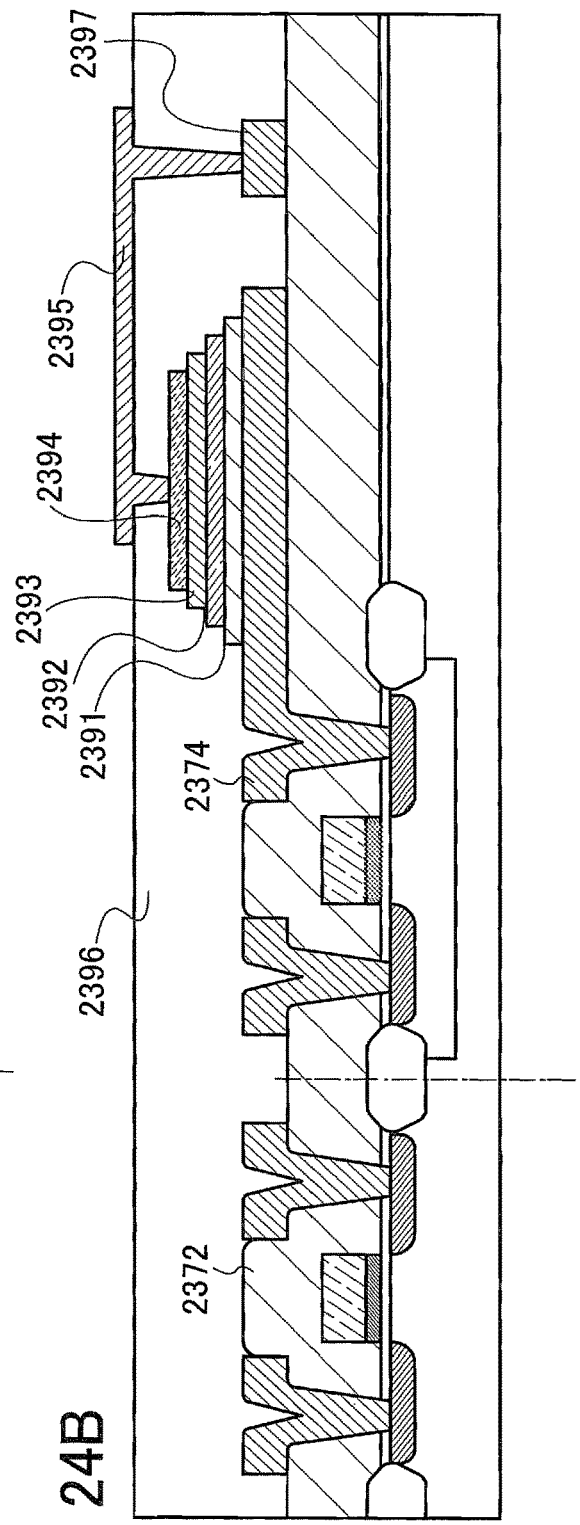

In this embodiment, the secondary battery is stacked over the wiring 2374 connected to the transistor. The secondary battery has a structure in which a current-collecting thin film, a negative electrode active material layer, a solid electrolyte layer, a positive electrode active material layer, and a current-collecting thin film are sequentially stacked (see FIG. 24B). Therefore, the material of the wiring 2374 which also has a function of the current-collecting thin film of the secondary battery should have high adhesion to the negative electrode active material layer and also low resistance. In particular, aluminum, copper, nickel, vanadium, or the like is preferably used.

Subsequently, the structure of the thin-film secondary battery is described. A negative electrode active material layer 2391 is formed over the wiring 2374. In general, vanadium oxide ($V_2O_5$) or the like is used. Next, a solid electrolyte layer 2392 is formed over the negative electrode active material layer 2391. In general, lithium phosphate ($Li_3PO_4$) or the like is used. Next, a positive electrode active material layer 2393 is formed over the solid electrolyte layer 2392. In general, lithium manganate ($LiMn_2O_4$) or the like is used. Lithium cobaltate ($LiCoO_2$) or lithium nickel oxide ($LiNiO_2$) may also be used. Next, a current-collecting thin film 2394 to serve as an electrode is formed over the positive electrode active material layer 2393. The current-collecting thin film 2394 should have high adhesion to the positive electrode active material layer 2393 and also low resistance. For example, aluminum, copper, nickel, vanadium, or the like can be used.

Each of the above-described thin layers of the negative electrode active material layer 2391, the solid electrolyte layer 2392, the positive electrode active material layer 2393, and the current-collecting thin film 2394 may be formed by a sputtering technique or an evaporation technique. In addition, the thickness of each layer is preferably 0.1 to 3 µm.

Next, an interlayer film 2396 is formed by application of a resin. The interlayer film 2396 is etched to form a contact hole. The interlayer film is not limited to a resin, and other films such as a CVD oxide film may also be used; however, a resin is preferably used in terms of flatness. In addition, the contact hole may be formed without etching, but using a photosensitive resin. Next, a wiring layer 2395 is formed over the interlayer film 2396 and connected to a wiring 2397. Thus, an electrical connection between the secondary battery and the transistor is secured.

With the above-described structure, the radio field intensity measurement device of the present invention can have a structure in which transistors are formed on a single crystal substrate and a thin-film secondary battery is formed thereover. Thus, the radio field intensity measurement device of the present invention can achieve flexibility as well as thinning and reduction in size.

The method of manufacturing the radio field intensity measurement device in this embodiment can be applied to any of the radio field intensity measurement devices in the other embodiments.

Embodiment 3

An example of a method for manufacturing a radio field intensity measurement device, which is different from that described in Embodiment 2, will be explained with reference to drawings.

Figure 25A:
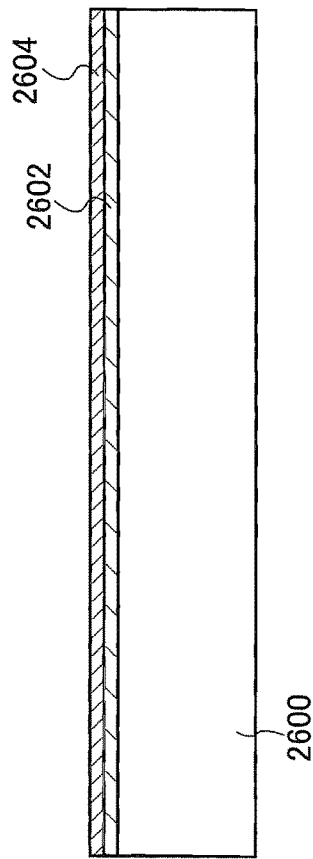
FIGS. 25A to 25C are views describing Embodiment 3.

First, an insulating film is formed over a substrate 2600. Here, a single crystal Si substrate having n-type conductivity is used as the substrate 2600, and insulating films 2602 and 2604 are formed over the substrate 2600 (see FIG. 25A). For example, silicon oxide ($SiO_x$) is formed as the insulating film 2602 by application of heat treatment to the substrate 2600, and then silicon nitride ($SiN_x$) is formed over the insulating film 2602 by a CVD method.

Any substrate can be used as the substrate 2600 as long as it is a semiconductor substrate, without particular limitations. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (Silicon on Insulator) substrate formed by a bonding method or a SIMOX (Separation by IMplanted OXygen) method, or the like can be used.

Alternatively, after forming the insulating film 2602, the insulating film 2604 may be formed by nitridation of the insulating film 2602 by high-density plasma treatment. It is to be noted that the insulating film provided over the substrate 2600 may have a single-layer structure or a stacked structure of three or more layers.

Figure 25B:
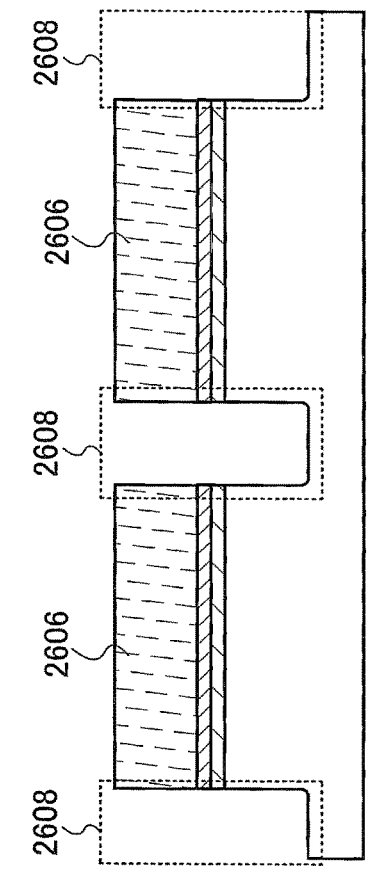

Next, patterns of a resist mask 2606 are selectively formed over the insulating film 2604, and selective etching is performed using the resist mask 2606 as a mask, so that recessed portions 2608 are selectively formed in the substrate 2600 (see FIG. 25B). For the etching of the substrate 2600 and the insulating films 2602 and 2604, plasma dry etching can be conducted.

Figure 25C:
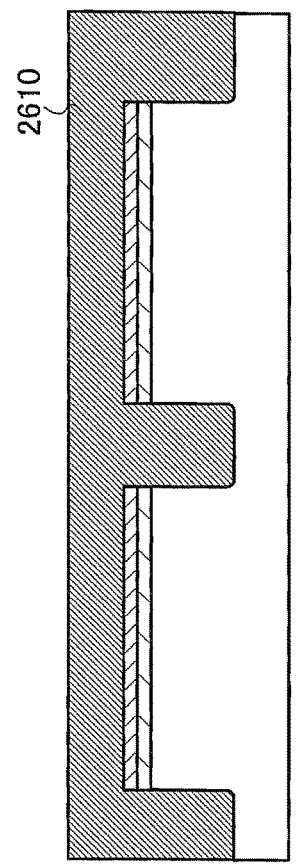

Next, the patterns of the resist mask 2606 are removed, and then an insulating film 2610 is formed so as to fill the recessed portions 2608 formed in the substrate 2600 (see FIG. 25C).

The insulating film 2610 is formed of an insulating material such as silicon oxide, silicon nitride, silicon oxynitride ($SiO_xN_y$, where x>y>0), or silicon nitride oxide ($SiN_xO_y$, where x>y>0) by a CVD method, a sputtering method, or the like. As the insulating film 2610, a silicon oxide film is formed by an atmospheric pressure CVD method or a low-pressure CVD method using a TEOS (tetraethyl orthosilicate) gas.

Figure 26A:
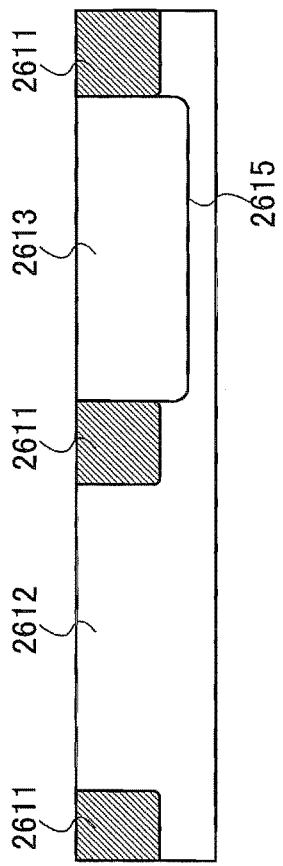
FIGS. 26A to 26C are views describing Embodiment 3.

Next, the surface of the substrate 2600 is exposed by grinding treatment or polishing treatment such as CMP (Chemical Mechanical Polishing). Here, by exposure of the surface of the substrate 2600, regions 2612 and 2613 are formed between insulating films 2611 which are formed in the recessed portions 2608 of the substrate 2600. The insulating film 2610 formed over the surface of the substrate 2600 is removed by grinding treatment or polishing treatment such as CMP, so that the insulating films 2611 are obtained. Subsequently, by selective introduction of a p-type impurity element, a p well 2615 is formed in the region 2613 of the substrate 2600 (see FIG. 26A).

As a p-type impurity element, boron (B), aluminum (Al), gallium (Ga), or the like can be used. In this case, boron (B) is introduced into the region 2613 as the impurity element.

Further, in this embodiment, although the region 2612 is not doped with an impurity element because an n-type semiconductor substrate is used as the substrate 2600, an n well may be formed in the region 2612 by introduction of an n-type impurity element. As an n-type impurity element, phosphorus (P), arsenic (As), or the like can be used.

When a p-type semiconductor substrate is used, on the other hand, the region 2612 may be doped with an n-type impurity element to form an n well, whereas the region 2613 may not be doped with an impurity element.

Figure 26B:
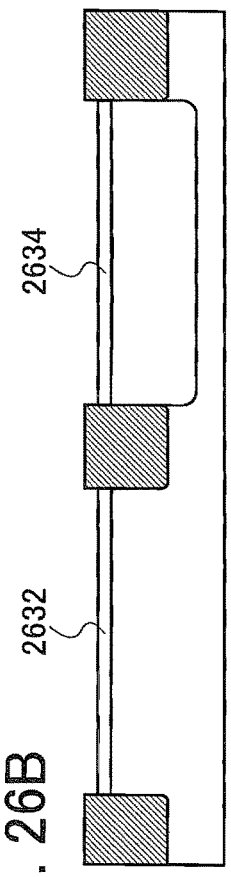

Next, insulating films 2632 and 2634 are formed over the surfaces of the regions 2612 and 2613 in the substrate 2600, respectively (see FIG. 26B).

For example, surfaces of the regions 2612 and 2613 provided in the substrate 2600 are oxidized by heat treatment, so that the insulating films 2632 and 2634 of silicon oxide films can be formed. Alternatively, the insulating films 2632 and 2634 may each be formed to have a stacked structure of a silicon oxide film and a film containing oxygen and nitrogen (a silicon oxynitride film) by the steps of forming a silicon oxide film by a thermal oxidation method and then nitriding the surface of the silicon oxide film by nitridation treatment.

Further alternatively, the insulating films 2632 and 2634 may be formed by plasma treatment as described above. For example, the insulating films 2632 and 2634 can be formed with a silicon oxide ($SiO_x$) film or a silicon nitride ($SiN_x$) film which is obtained by application of high-density plasma oxidation or high-density nitridation treatment to the surfaces of the regions 2612 and 2613 provided in the substrate 2600. In addition, after application of high-density plasma oxidation treatment to the surfaces of the regions 2612 and 2613, high-density plasma nitridation treatment may be conducted. In that case, silicon oxide films are formed on the surfaces of the regions 2612 and 2613 and then silicon oxynitride films are formed on the silicon oxide films. Thus, the insulating films 2632 and 2634 are each formed to have a stacked structure of the silicon oxide film and the silicon oxynitride film. In addition, silicon oxide films are formed on the surfaces of the regions 2612 and 2613 by a thermal oxidation method, and then high-density plasma oxidation treatment or high-density plasma nitridation treatment may be performed to the silicon oxide films.

It is to be noted that the insulating films 2632 and 2634 formed over the regions 2612 and 2613 of the substrate 2600 respectively function as the gate insulating films of transistors which are completed later.

Figure 26C:
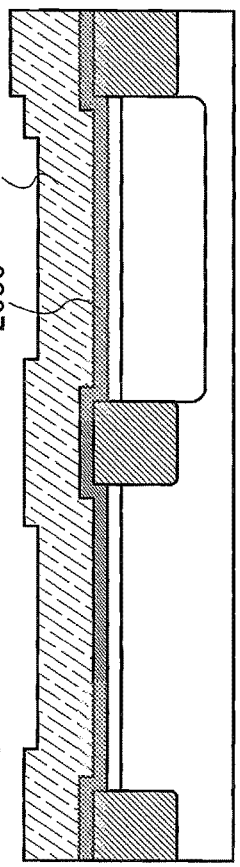

Next, a conductive film is formed so as to cover the insulating films 2632 and 2634 which are formed over the regions 2612 and 2613 provided in the substrate 2600, respectively (see FIG. 26C). In this embodiment, an example is shown where conductive films 2636 and 2638 are sequentially stacked as the conductive film. Needless to say, the conductive film may be formed to have a single layer or a stacked structure of three or more layers.

As a material of the conductive films 2636 and 2638, an element selected from tantalum (Ta), tungsten (W), titanium (Ti), molybdenum (Mo), aluminum (Al), copper (Cu), chromium (Cr), niobium (Nb), or the like, or an alloy material or a compound material containing such an element as its main component can be used. Alternatively, a metal nitride film obtained by nitridation of such an element can also be used.

Furthermore, a semiconductor material typified by polycrystalline silicon doped with an impurity element such as phosphorus can also be used.

In this case, a stacked structure is employed in which the conductive film 2636 is formed using tantalum nitride and the conductive film 2638 is formed thereover using tungsten. Alternatively, it is also possible to form the conductive film 2636 using a single-layer film or a stacked film of tantalum nitride, tungsten nitride, molybdenum nitride, and/or titanium nitride and form the conductive film 2638 using a single-layer film or a stacked film of tungsten, tantalum, molybdenum, and/or titanium.

Figure 27A:
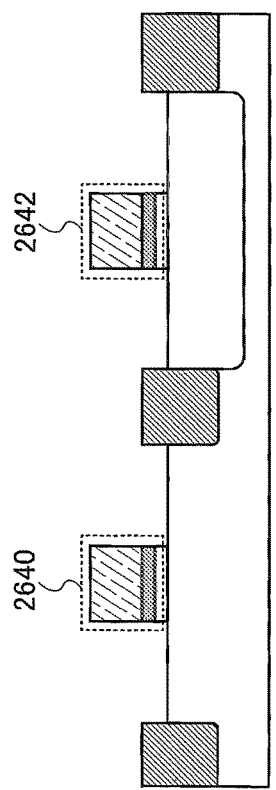
FIGS. 27A to 27C are views describing Embodiment 3.

Next, the stacked conductive films 2636 and 2638 are selectively removed by etching, so that the conductive films 2636 and 2638 remain above part of the regions 2612 and 2613 of the substrate 2600. Thus, conductive films 2640 and 2642 functioning as gate electrodes are formed (see FIG. 27A). Here, surfaces of the regions 2612 and 2613 of the substrate 2600 which does not overlap with the conductive films 2640 and 2642 respectively are exposed.

Specifically, in the region 2612 of the substrate 2600, a part of the insulating film 2632 formed below the conductive film 2640, which does not overlap with the conductive film 2640, is selectively removed, so that the ends of the conductive film 2640 and the ends of the insulating film 2632 are almost aligned with each other. In addition, in the region 2613 of the substrate 2600, a part of the insulating film 2634 formed below the conductive film 2642, which do not overlap with the conductive film 2642, is selectively removed, so that the ends of the conductive film 2642 and the ends of the insulating film 2634 are almost aligned with each other.

In this case, the part of the insulating films or the like which do not overlap with the conductive films 2640 and 2642 may be removed at the same time as the formation of the conductive films 2640 and 2642. Alternatively, the part of the insulating films which do not overlap with the conductive films 2640 and 2642 may be removed using resist masks which are left after the formation of the conductive films 2640 and 2642 or the conductive films 2640 and 2642 as masks.

Figure 27B:
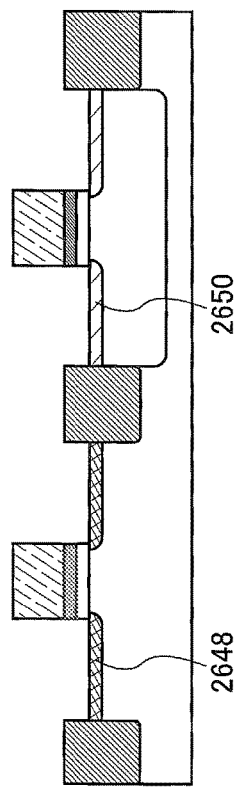

Then, the regions 2612 and 2613 of the substrate 2600 are selectively doped with an impurity element (see FIG. 27B). At this time, the region 2613 is selectively doped with an n-type impurity element at low concentration, using the conductive film 2642 as a mask, whereas the region 2612 is selectively doped with a p-type impurity element at low concentration, using the conductive film 2640 as a mask. As an n-type impurity element, phosphorus (P), arsenic (As), or the like can be used. As a p-type impurity element, boron (B), aluminum (Al), gallium (Ga), or the like can be used.

Next, sidewalls 2654 which are in contact with the side surfaces of the conductive films 2640 and 2642 are formed. Specifically, the sidewalls are formed with a single layer or a stacked layer of a film containing an inorganic material such as silicon, silicon oxide, or silicon nitride, or a film containing an organic material such as an organic resin. Then, such an insulating film is selectively etched by anisotropic etching mainly in the perpendicular direction, so that the sidewalls 2654 can be formed so as to be in contact with the side surfaces of the conductive films 2640 and 2642. The sidewalls 2654 are used as masks in doping for forming LDD (Lightly Doped Drain) regions. In addition, the sidewalls 2654 are formed to be in contact with side surfaces of the insulating films formed below the conductive films 2640 and 2642.

Figure 27C:
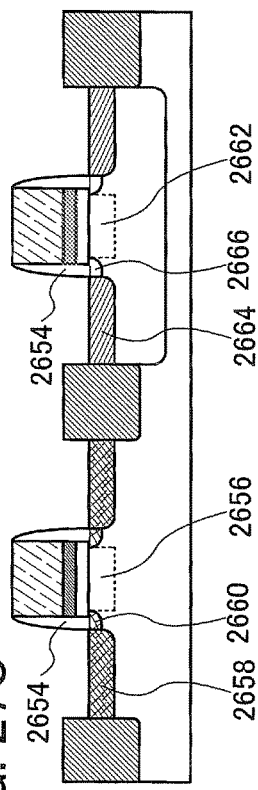

Next, the regions 2612 and 2613 of the substrate 2600 are doped with an impurity element, using the sidewalls 2654 and the conductive films 2640 and 2642 as masks, so that impurity regions which function as source and drain regions are formed (see FIG. 27C). At this time, the region 2613 of the substrate 2600 is doped with an n-type impurity element at high concentration, using the sidewalls 2654 and the conductive film 2642 as masks, whereas the region 2612 is doped with a p-type impurity element at high concentration, using the sidewalls 2654 and the conductive film 2640 as masks.

As a result, impurity regions 2658 which form source and drain regions, low concentration impurity regions 2660 which form LDD regions, and a channel formation region 2656 are formed in the region 2612 of the substrate 2600. Meanwhile, impurity regions 2664 which form source and drain regions, low concentration impurity regions 2666 which form LDD regions, and a channel formation region 2662 are formed in the region 2613 of the substrate 2600.

In this embodiment, the impurity elements are introduced under the condition that parts of the regions 2612 and 2613 of the substrate 2600 which do not overlap with the conductive films 2640 and 2642 are exposed. Accordingly, the channel formation regions 2656 and 2662 which are formed in the regions 2612 and 2613 of the substrate 2600 respectively can be formed in a self-aligned manner, due to the conductive films 2640 and 2642.

Figure 28A:
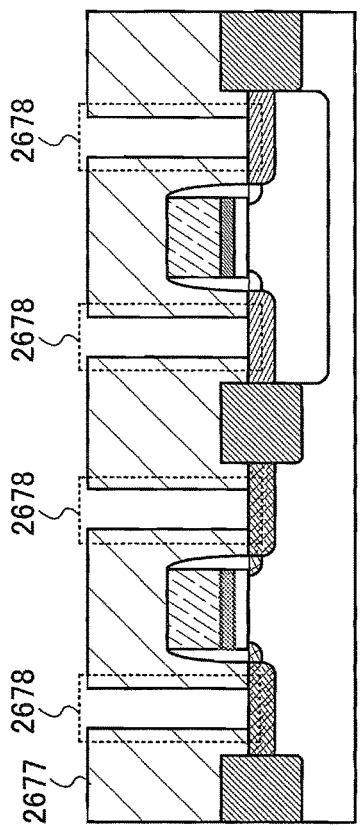
FIGS. 28A and 28B are views describing Embodiment 3.

Next, a second insulating film 2677 is formed so as to cover the insulating films, the conductive films, and the like which are provided over the regions 2612 and 2613 of the substrate 2600, and opening portions 2678 are formed in the second insulating film 2677 (see FIG. 28A).

The second insulating film 2677 can be formed with a single layer or a stacked layer of an insulating film containing oxygen and/or nitrogen such as silicon oxide ($SiO_x$), silicon nitride ($SiN_x$), silicon oxynitride ($SiO_xN_y$ where x>y>0), or silicon nitride oxide ($SiN_xO_y$ where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin, by a CVD method, a sputtering method or the like. A siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. In addition, a fluoro group may be used as the substituent. Further, a fluoro group and an organic group containing at least hydrogen may be used as the substituent.

Figure 28B:
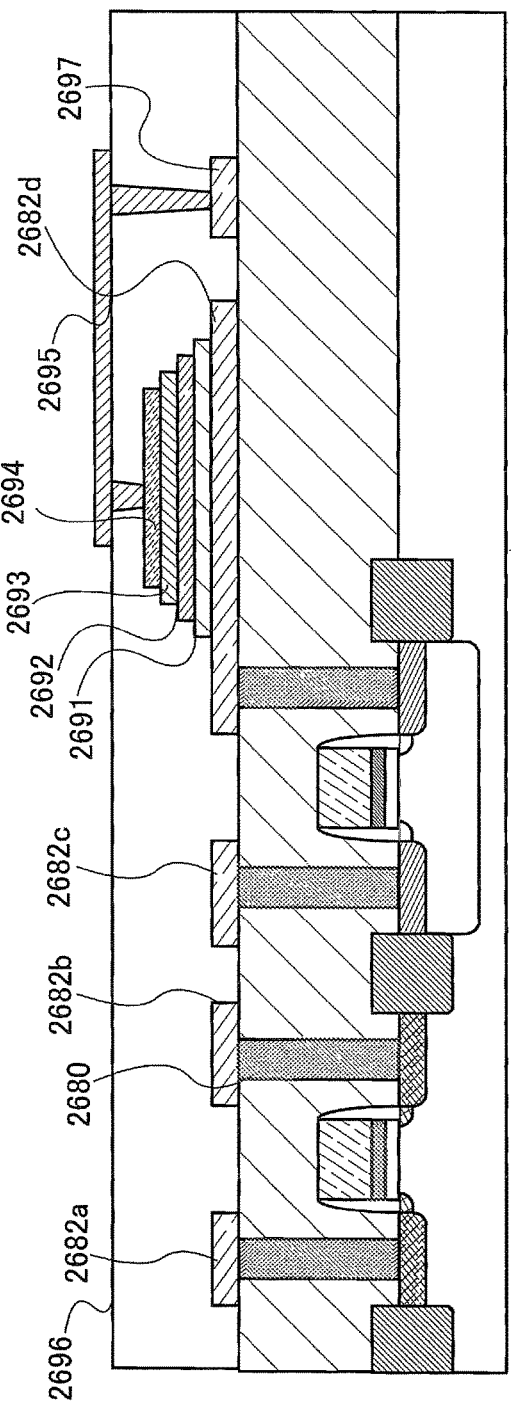

Next, conductive films 2680 are formed in the opening portions 2678 by a CVD method. Then, conductive films 2682a to 2682d are selectively formed over the insulating film 2677 so as to be electrically connected to the conductive films 2680 (see FIG. 28B).

The conductive films 2680 and 2682a to 2682d are formed with a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing such an element as its main component by a CVD method, a sputtering method or the like. An alloy material containing aluminum as its main component corresponds to, for example, a material which contains aluminum as its main component and also contains nickel, or a material which contains aluminum as its main component and also contains nickel and one or both of carbon and silicon. For example, each of the conductive films 2680 and 2682a to 2682d is preferably formed to have a stacked structure of a barrier film, an aluminum-silicon (Al—Si) film, and a barrier film or a stacked structure of a barrier film, an aluminum silicon (Al—Si) film, a titanium nitride film, and a barrier film. It is to be noted that the "barrier film" corresponds to a thin film formed of titanium, titanium nitride, molybdenum, or molybdenum nitride. Aluminum and aluminum silicon are suitable materials for forming the conductive films 2680 and 2682a to 2682d because they have high resistance values and are inexpensive. When barrier layers are provided as the top layer and the bottom layer, generation of hillocks of aluminum or aluminum silicon can be prevented. When a barrier film formed of titanium which is an element having a high reducing property is formed, even when there is a thin natural oxide film formed on the crystalline semiconductor film, the natural oxide film can be chemically reduced, and a favorable contact between the conductive film 2680 and 2682a to 2682d, and the crystalline semiconductor film can be obtained. Here, the conductive films 2680 and 2682a to 2682d can be formed by selective growth of tungsten (W) by a CVD method.

Through the above steps, a p-channel transistor formed in the region 2612 of the substrate 2600 and an n-channel transistor formed in the region 2613 of the substrate 2600 can be obtained.

It is to be noted that the structure of transistors constituting the radio field intensity measurement device of the present invention is not limited to the one shown in the drawings. For example, a transistor with an inversely staggered structure, a FinFET structure, or the like can be used. A FinFET structure is preferable because it can suppress a short channel effect which occurs along with reduction in transistor size.

The radio field intensity measurement device of the present invention is provided with a battery by which power can be stored in the signal processing circuit. As the battery, a capacitor such as an electric double layer capacitor or a thin-film secondary battery is preferably used. In this embodiment, a connection between the transistor formed in this embodiment and a thin-film secondary battery will be described.

In this embodiment, a secondary battery is stacked over the conductive film 2682d connected to the transistor. The secondary battery has a structure in which a current-collecting thin film, a negative electrode active material layer, a solid electrolyte layer, a positive electrode active material layer, and a current-collecting thin film are sequentially stacked (see FIG. 28B). Therefore, the material of the conductive film 2682d which is also used as the material of the current-collecting thin film of the secondary battery preferably has high adhesion to the negative electrode active material layer and also low resistance. In particular, aluminum, copper, nickel, vanadium, or the like is preferably used.

Subsequently, the structure of the thin-film secondary battery is described. A negative electrode active material layer 2691 is formed over the conductive film 2682d. In general, vanadium oxide ($V_2O_5$) or the like is used. Next, a solid electrolyte layer 2692 is formed over the negative electrode active material layer 2691. In general, lithium phosphate ($Li_3PO_4$) or the like is used. Next, a positive electrode active material layer 2693 is formed over the solid electrolyte layer 2692. In general, lithium manganate ($LiMn_2O_4$) or the like is used. Lithium cobaltate ($LiCoO_2$) or lithium nickel oxide ($LiNiO_2$) can also be used. Next, a current-collecting thin film 2694 to serve as an electrode is formed over the positive electrode active material layer 2693. The current-collecting thin film 2694 should have high adhesion to the positive electrode active material layer 2693 and also low resistance. For example, aluminum, copper, nickel, vanadium, or the like can be used.

Each of the above-described thin layers of the negative electrode active material layer 2691, the solid electrolyte layer 2692, the positive electrode active material layer 2693, and the current-collecting thin film 2694 may be formed by a sputtering technique or an evaporation technique. In addition, the thickness of each layer is preferably 0.1 to 3 µm.

Next, an interlayer film 2696 is formed by application of a resin. The interlayer film 2696 is etched to form a contact hole. The interlayer film 2696 is not limited to a resin, and other films such as a CVD oxide film may also be used; however, a resin is preferably used in terms of flatness. In addition, the contact hole may be formed without etching, but using a photosensitive resin. Next, a wiring layer 2695 is formed over the interlayer film 2696 and is connected to a wiring 2697. Thus, an electrical connection between the thin-film secondary battery and the transistor is obtained by the connection with the wiring 2697.

With the above-described structure, the radio field intensity measurement device of the present invention can have a structure in which transistors are formed on a single crystal substrate and a thin-film secondary battery is formed thereover. Thus, the radio field intensity measurement device of the present invention can achieve flexibility as well as thinning and reduction in size.

The method of manufacturing the radio field intensity measurement device in this embodiment can be applied to any of the radio field intensity measurement devices in the other embodiments.

Embodiment 4

Embodiment 4 will describe applications of the radio field intensity measurement device of the present invention. The radio field intensity measurement device of the present invention can protect an object which may malfunction due to a radiowave of medical equipment, pace makers or the like, and can visibly informs us that the intensity of the radiowave around the object is high. Thus the radio field intensity measurement device of the present invention can be used as a so-called radio field intensity detector.

In this embodiment, with reference to FIGS. 29A to 36B, application examples of the present invention and examples of products in the application examples are described.

FIG. 29A illustrates an example of a completed radio field intensity detector according the present invention. A radio field intensity measurement device 3001 is formed on a checking badge 3000. On the checking badge 3000, an ID 3002 and a photograph 3003 of an operator wearing the checking badge is attached. The checking badge 3000 like this, as illustrated in FIG. 29B, is attached on work clothes 3004 of the operator. The operator has the radio field intensity detector and confirms color changed of the radio field intensity measurement device 3001, when the operator enters an area with extremely intense radiowave. At this time, the operator can know the intensity of radiowave. The radio field intensity measurement device of the present invention can measure a weak radiowave from a long distance, and has excellent visibility even when brightness in surroundings is intense e.g., under sunlight. Therefore, in the radio field intensity detector of FIG. 29A, the operator can measure a weak radiowave from a long distance and can see the measured result with excellent visibility even when brightness in surroundings is intense e.g., under sunlight.

Figure 30B:
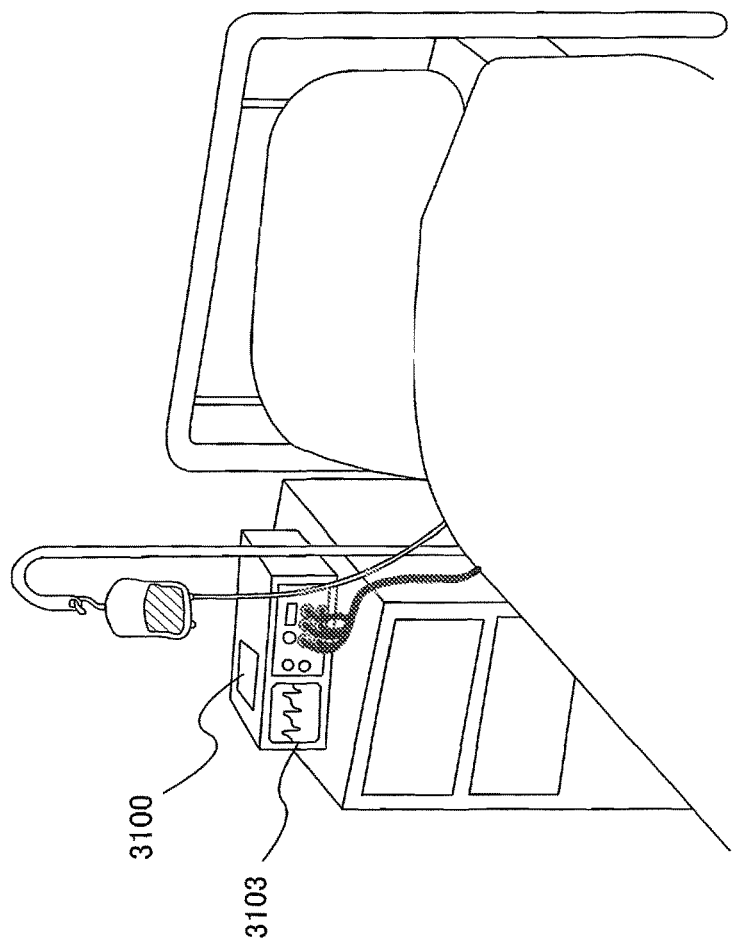
FIGS. 30A and 30B are views describing Embodiment 4.
Figure 30A:
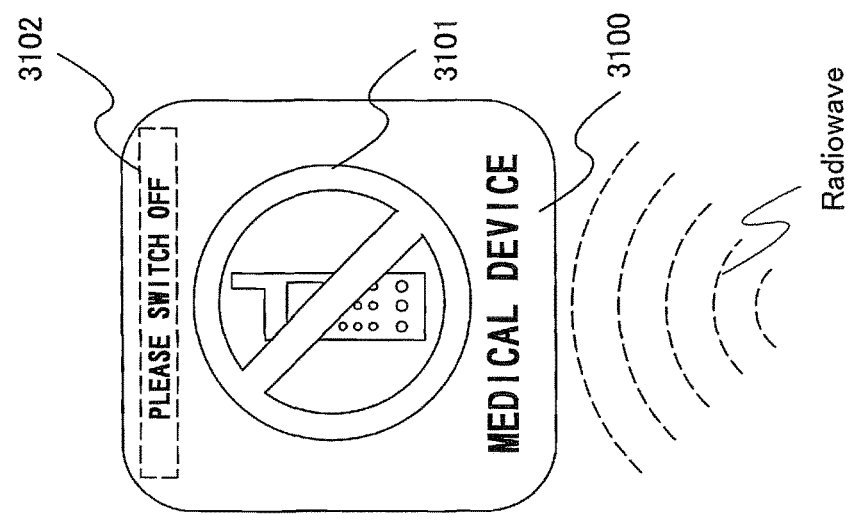

FIG. 30A illustrates an example of a completed radio field intensity detector according to the present invention. On a seal 3100, a warning mark 3101 to warn someone not to use a device sending a radiowave and a radio field intensity measurement device 3102 are formed. The seal 3100 like this is attached to a medical device 3103 in a hospital as illustrated in FIG. 30B for example. When a visitor or a hospital patient comes near the radio field intensity measurement device 3102, having a device sending a radiowave whose power is not switched off, the color of the radio field intensity measurement device 3102 is changed to send a visible warning and tell the visitor or the hospital patient to switch off the device sending radiowave. The radio field intensity measurement device of the present invention can measure a weak radiowave from a long distance, and has excellent visibility even when brightness in surroundings is intense e.g., under sunlight. Therefore, in the radio field intensity detector of FIG. 30A, a visitor or a hospital patient can measure a weak radiowave from a long distance and can see the measured result with excellent visibility even when brightness in surroundings is intense e.g., under sunlight.

Figure 31B:
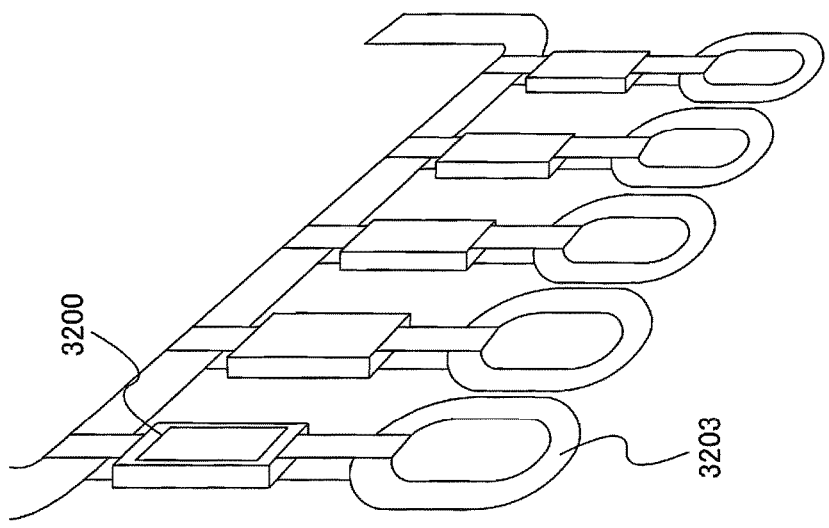
FIGS. 31A and 31B are views describing Embodiment 4.
Figure 31A:
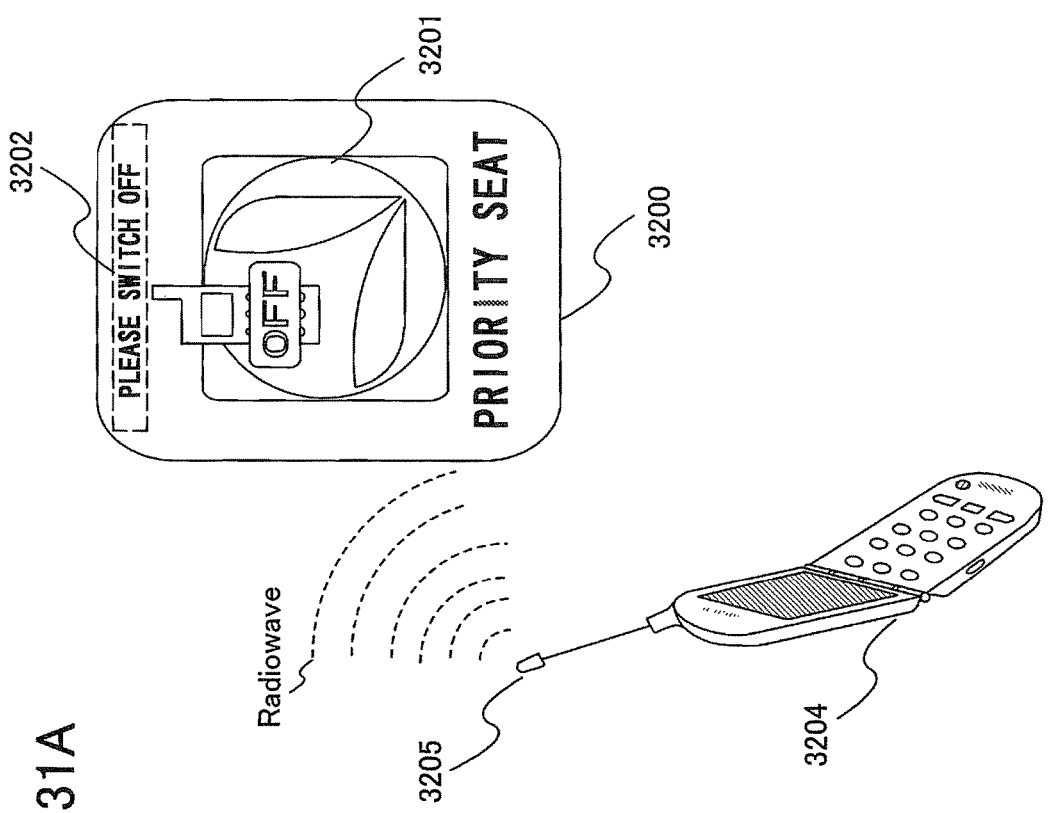

FIG. 31A illustrates an example of a completed radio field intensity detector according to the present invention. On a seal 3200, a warning mark 3201 to warn someone not to use a cellular phone and a radio field intensity measurement device 3202 are formed. The seal 3200 like this is attached to a strap 3203 near priority seating in a train as illustrated in FIG. 31B for example. When a passenger has a cellular phone whose power is not switched off and an antenna 3205 of the cellular phone 3204 sends radiowave, the color of the radio field intensity measurement device 3202 is changed due to a radiowave to visibly warn the passenger to switch off the cellular phone. In addition, someone has or wear an object which may malfunction due to radiowave, such as a pace maker, he/she can sense a risk of the malfunction by seeing the color of the radio field intensity measurement device, and he/she can leave the source of radiowave. The radio field intensity measurement device of the present invention can measure a weak radiowave from a long distance, and has excellent visibility even when brightness in surroundings is intense e.g., under sunlight. Therefore, in the radio field intensity detector of FIG. 31A, a passenger can measure a weak radiowave from a long distance and can see the measured result with excellent visibility even when brightness in surroundings is intense e.g., under sunlight.

Figure 32C:
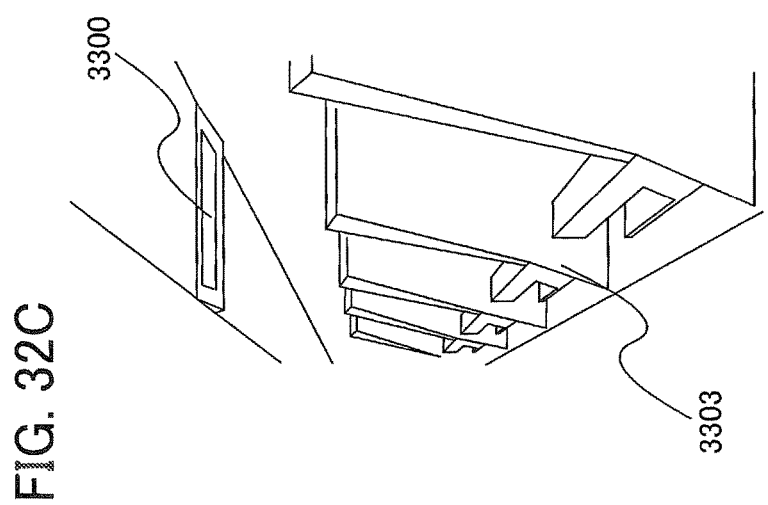
FIGS. 32A to 32C are views describing Embodiment 4.
Figure 32A:
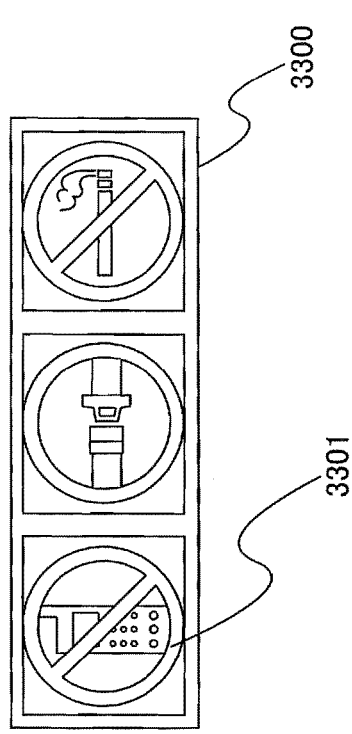
Figure 32B:
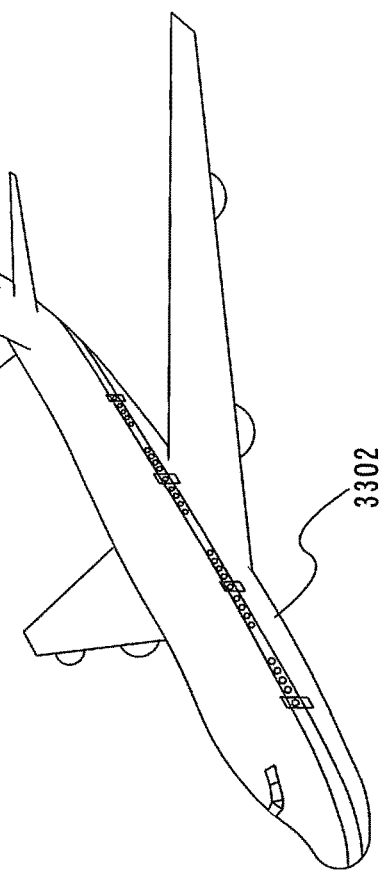

FIG. 32A illustrates an example of a completed radio field intensity detector according to the present invention. On a warning light 3300, a warning mark 3301 incorporating the radio field intensity measurement device of the present invention is formed. The warning light like this is used in an airplane 3302 as illustrated in FIG. 32B for example. Specifically, as illustrated in FIG. 32C, the warning light 3300 is installed above seats 3303. When an airplane takes off, a flight attendant confirms the warning light. If a source emitting a radiowave is around, the flight attendant warns passengers to switch off the source. The radio field intensity measurement device of the present invention can measure a weak radiowave from a long distance, and has excellent visibility even when brightness in surroundings is intense e.g., under sunlight. Therefore, in the radio field intensity detector of FIG. 32A, a flight attendant can measure a weak radiowave from a long distance and can see the measured result with excellent visibility even when brightness in surroundings is intense e.g., under sunlight, so that the radio field intensity detector works as a security device in the public vehicle.

Figure 33B:
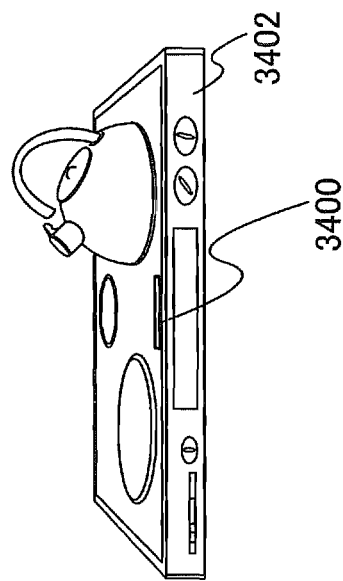
FIGS. 33A and 33B are views describing Embodiment 4.
Figure 33A:
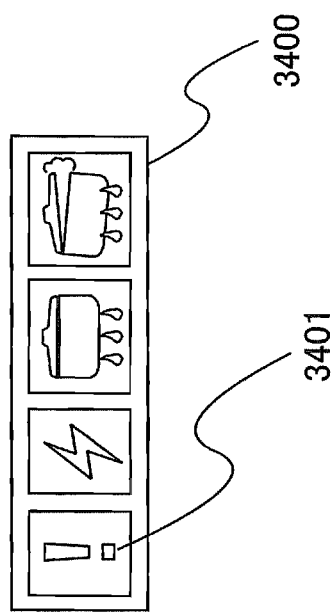

FIG. 33A illustrates an example of a completed radio field intensity detector according to the present invention. On a warning light 3400, a warning mark 3401 incorporating the radio field intensity measurement device of the present invention is formed. The warning light like this is incorporated in an electromagnetic cooker (or an induction heating (IH) cooker) 3402 as illustrated in FIG. 33B for example. When the electromagnetic cooker is broken and emits dangerous electromagnetic wave around, the color of the warning light is changed to notify danger. The radio field intensity measurement device of the present invention can measure a weak radiowave from a long distance, and has excellent visibility even when brightness in surroundings is intense e.g., under sunlight. Therefore, in the radio field intensity detector of FIG. 33A, a user can measure a weak radiowave from a long distance and can see the measured result with excellent visibility even when brightness in surroundings is intense e.g., under sunlight.

Figure 34B:
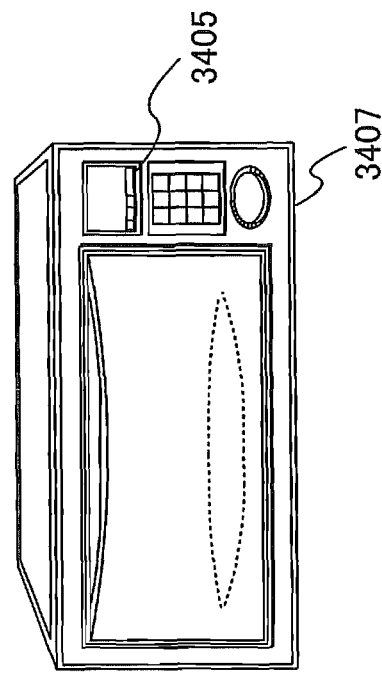
FIGS. 34A and 34B are views describing Embodiment 4.
Figure 34A:
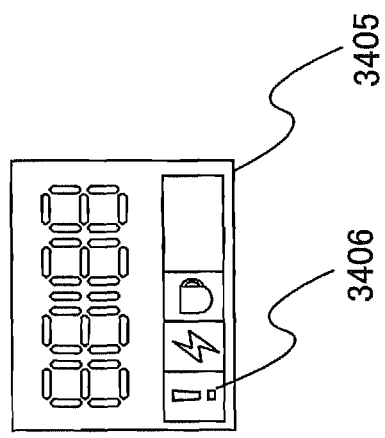

FIG. 34A illustrates an example of a completed radio field intensity detector according to the present invention. On a display portion 3405, a warning mark 3406 incorporating the radio field intensity measurement device of the present invention is formed. The display portion like this is incorporated in a microwave oven 3407 as illustrated in FIG. 34B for example. When the microwave oven 3407 is broken and emits dangerous electromagnetic wave around, the color of the warning light is changed to notify danger. The radio field intensity measurement device of the present invention can measure a weak radiowave from a long distance, and has excellent visibility even when brightness in surroundings is intense e.g., under sunlight. Therefore, in the radio field intensity detector of FIG. 34A, a user can measure a weak radiowave from a long distance and can see the measured result with excellent visibility even when brightness in surroundings is intense e.g., under sunlight.

Figure 35A:
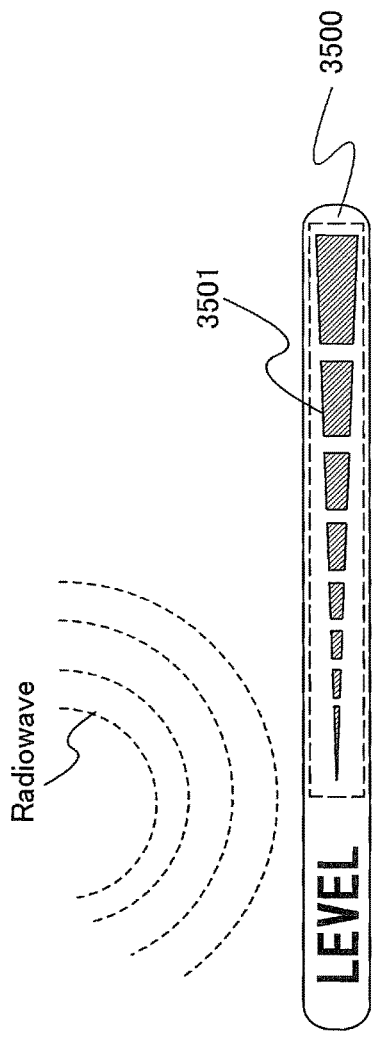
FIGS. 35A and 35B are views describing Embodiment 4.
Figure 35B:
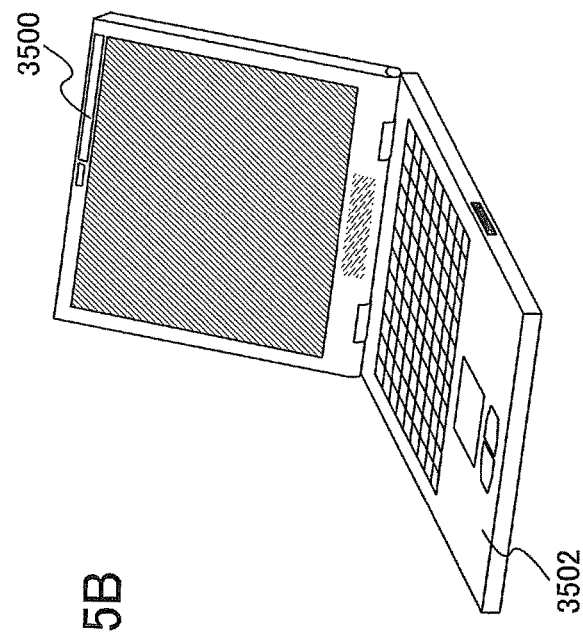

FIG. 35A is an example of a completed radio field intensity detector according to the present invention. On a seal 3500, a radio field intensity measurement device 3501 is formed. The seal 3500 like this is attached on a computer 3502 as illustrated in FIG. 35B for example. A user of the computer can know the intensity of a radiowave used in radio communication by the color change of the radio field intensity measurement device 3501. The radio field intensity measurement device of the present invention can measure a weak radiowave from a long distance, and has excellent visibility even when brightness in surroundings is intense e.g., under sunlight. Therefore, in the radio field intensity detector of FIG. 35A, a user can measure a weak radiowave from a long distance and can see the measured result with excellent visibility even when brightness in surroundings is intense e.g., under sunlight.

Figure 36B:
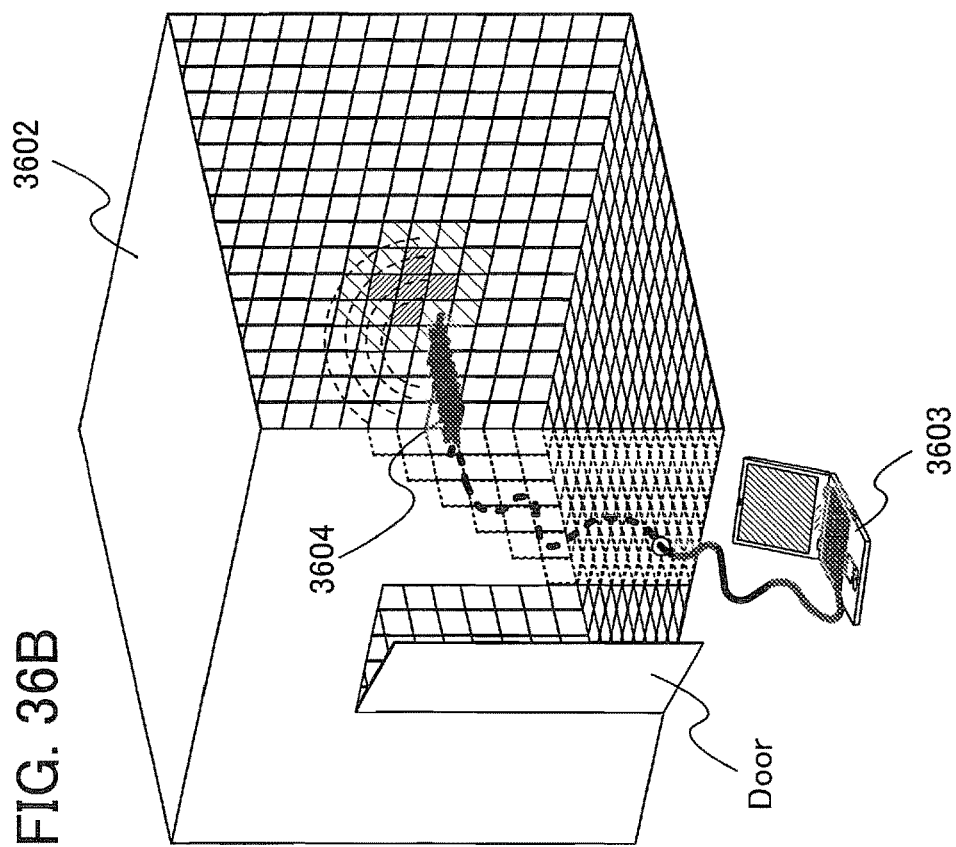
FIGS. 36A and 36B are views describing Embodiment 4.
Figure 36A:
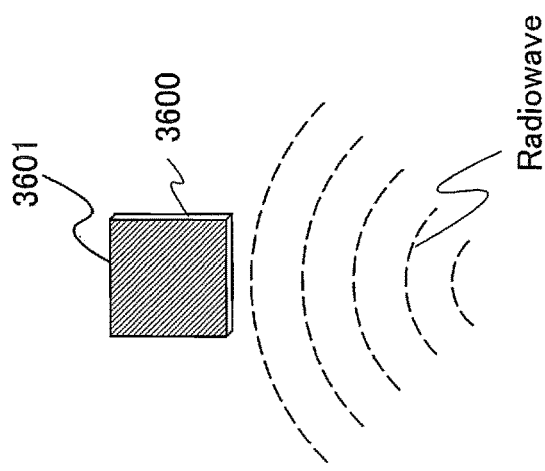

FIG. 36A illustrates an example of a completed radio field intensity detector according to the present invention. On a plate 3600, a radio field intensity measurement device 3601 is formed. The plate 3600 like this is attached on an inner wall of a radiowave measurement room 3602 as illustrated in FIG. 36B. A design engineer of an antenna sends a radiowave by using the computer 3603 through an antenna 3604, and confirms the color change of the inner wall of the radiowave measurement room. Thus, the distribution of the radiowave is observed in a visible manner and the performance of the antenna 3604 can be measured. The radio field intensity measurement device of the present invention can measure a weak radiowave from a long distance, and has excellent visibility even when brightness in surroundings is intense e.g., under sunlight. Therefore, in the radio field intensity detector of FIG. 36A, a user can measure a weak radiowave from a long distance and can see the measured result with excellent visibility even when brightness in surroundings is intense e.g., under sunlight.

As described above, the radio field intensity measurement device of the present invention can be provided in any object (including creatures) of which the level of radiowave is to be detected.

This embodiment can be freely combined with any of the other embodiment modes and embodiments. In other words, a radio field intensity detector including the radio field intensity measurement device of the preset invention can measure a weak radiowave from a long distance, and can have excellent visibility even when brightness in surroundings is intense e.g., under sunlight.

Embodiment 5

Embodiment 5 will describe application of a radio field intensity detector of the present invention. The radio field intensity detector using the radio field intensity measurement device of the present invention can be used as an amusement device utilizing a radiowave as colors.

In this embodiment, application examples of the present invention and examples of products in the application examples are described with reference to FIGS. 37A and 37B.

Figure 37B:
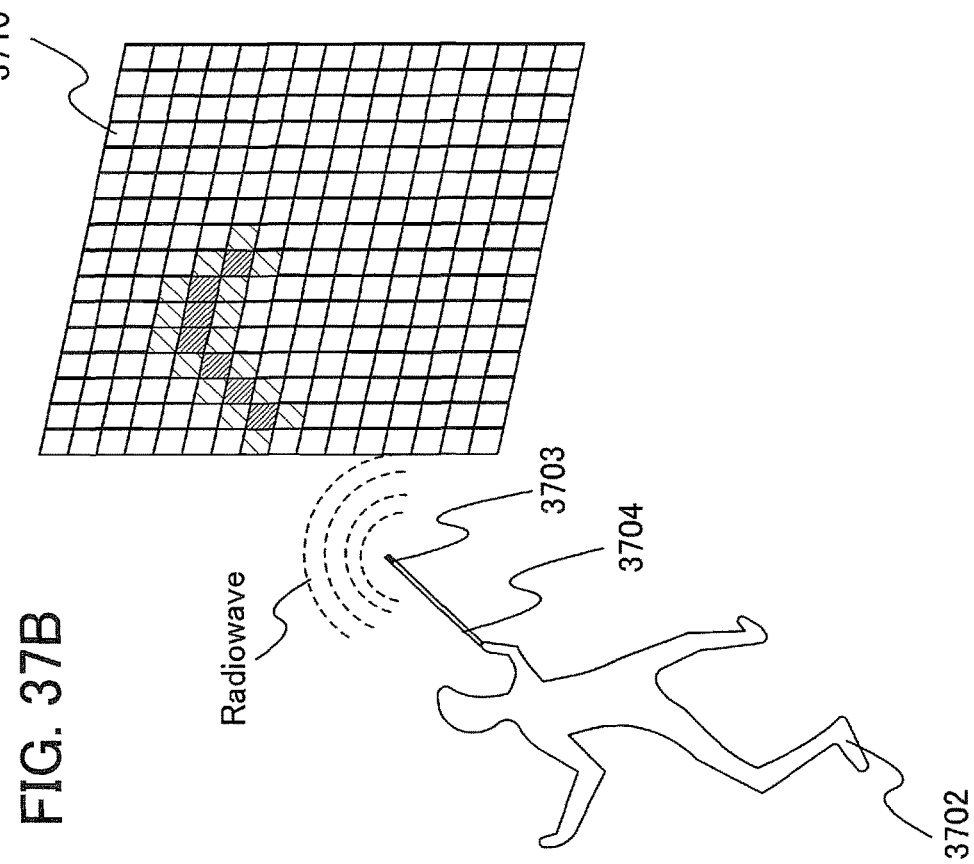
FIGS. 37A and 37B are views describing Embodiment 5.
Figure 37A:
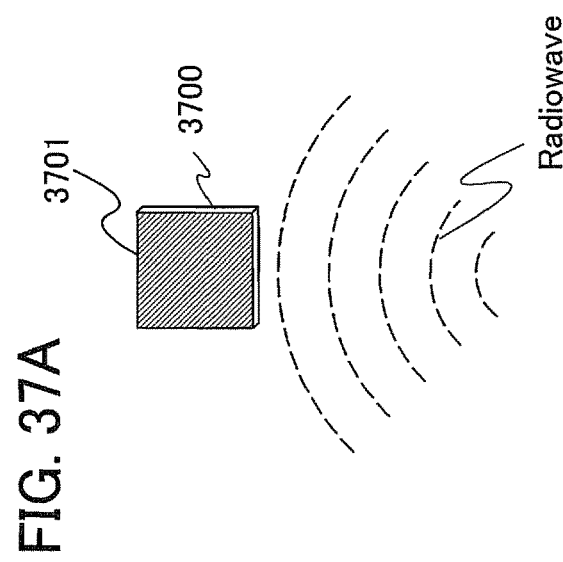
Figure 38:
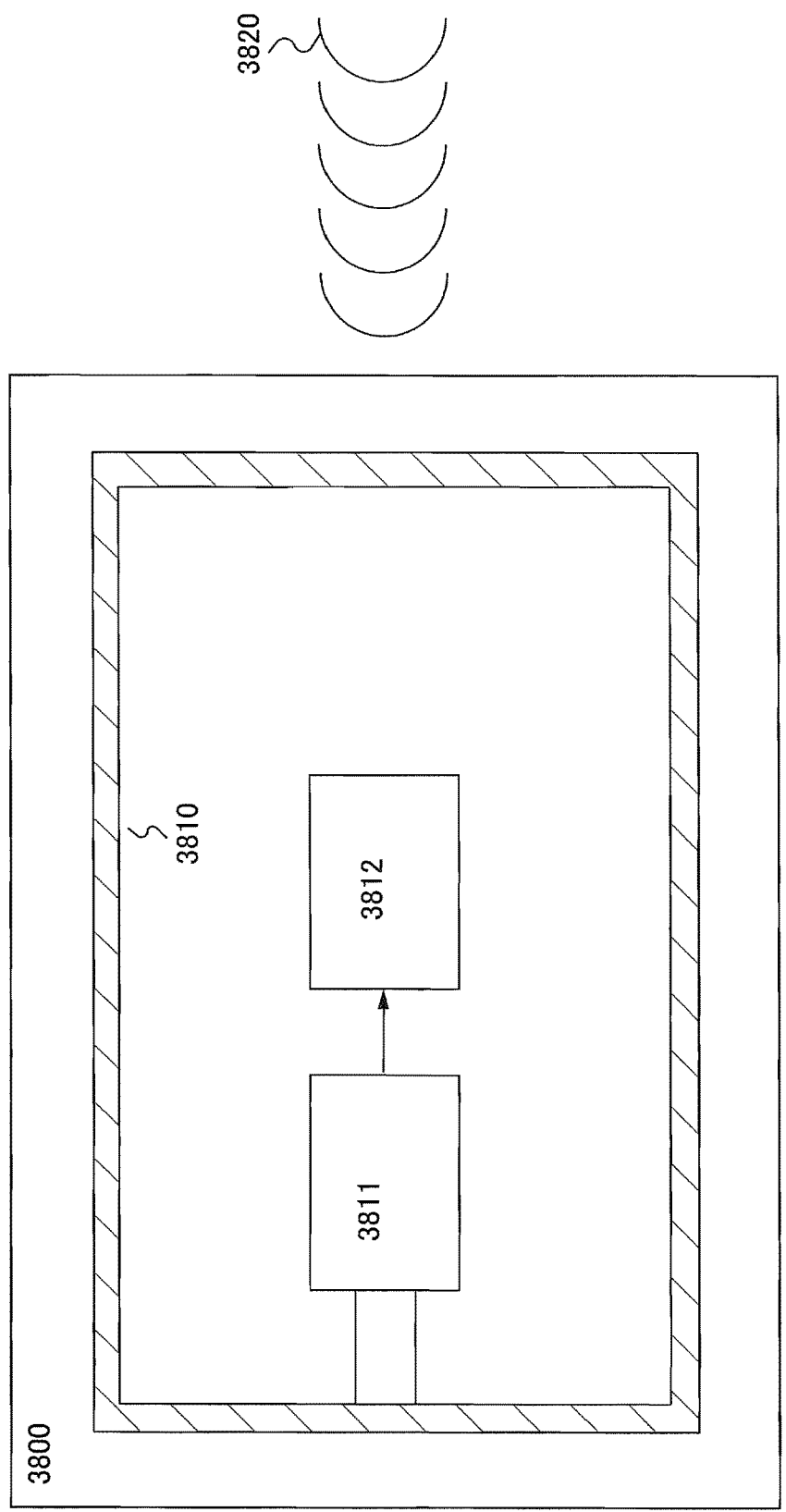
FIG. 38 is a view describing an object of the present invention.

FIG. 37A illustrates an example of a completed radio field intensity detector according to the present invention. On a plate 3700, a radio field intensity measurement device 3701 is formed. A thin plastic plate is used as the plate 3700, and transistors forming the radio field intensity measurement device is formed on the thin plastic substrate, so that it can be processed to be curved.

In the game console of this embodiment, a plurality of the plates 3700 in FIG. 37A are combined to form a plate-like radio field intensity detector 3710 having a height as high as a man, as illustrated in FIG. 37B. A user 3702 sends a radiowave by swinging around a stick 3704 including a radiowave emitter 3703, and enjoys color change of the plate-like radio field intensity detector 3710.

Sending of a radiowave by the user is interlocked with the movement of the user 3702 by combining a sensor such as an acceleration sensor or a piezoelectric sensor including a microphone or the like incorporated in the stick 3704 to entertain the amusement device more. In addition, in FIG. 37B, the stick 3704 is illustrated as a member including a radiowave emitter; however, is not limited to a stick shape, and the member including a radiowave emitter may be operative by interlocking with the movement of human body.

This embodiment employs a flat plate-like shape for the plate-like radio field intensity detector 3710; however, may another shape such as sphere or irregular surface to enjoy the color change. Further, by combining a liquid crystal display device or a light-emitting device, an amusement device having wide visible variation may be formed.

As described above, a radio field intensity measurement device of the present invention can be provided in any object (including creatures) of which the level of the radiowave is to be detected.

This embodiment can be freely combined with any of the other embodiment modes and embodiments. In other words, a radio field intensity detector including the radio field intensity measurement device of the preset invention can measure a weak radiowave from a long distance, and can have excellent visibility even when brightness in surroundings is intense e.g., under sunlight.

This application is based on Japanese Patent Application serial No. 2006-309996 filed in Japan Patent Office on Nov. 16, 2006, the entire contents of which are hereby incorporated by reference.

What is claimed is:

1. A device comprising:
   a signal processing circuit comprising a transistor;
   a first insulating film over the transistor;
   an antenna over the first insulating film;
   a second insulating film over the antenna; and
   a battery over the second insulating film, wherein the battery comprises a solid electrolyte layer,
   wherein the signal processing circuit comprises:
      a rectifier circuit electrically connected to the antenna; and
      a control circuit through which the rectifier circuit is electrically connected to the battery.

2. The device according to claim 1, comprising a display element electrically connected to the signal processing circuit.

3. The device according to claim 2, wherein the display element comprises a material exhibiting a chromism phenomenon.

4. The device according to claim 1, wherein the signal processing circuit comprises an amplifier circuit electrically connected to the rectifier circuit.

5. The device according to claim 1, wherein the control circuit comprises a voltage comparison circuit configured to compare an output potential of the battery with an output potential of the rectifier circuit.

6. The device according to claim 1, wherein the transistor comprises a compound semiconductor.

7. The device according to claim 1, wherein the battery comprises a stack including a negative electrode active material layer, the solid electrolyte layer, and a positive electrode active material layer.

8. The device according to claim 1, wherein the battery overlaps with the transistor.

9. The device according to claim 1, wherein the battery overlaps with the antenna.

10. A device comprising:
    a signal processing circuit comprising a transistor;
    a first insulating film over the transistor;
    an antenna over the first insulating film;
    a second insulating film over the antenna; and
    a battery over the second insulating film, wherein the battery comprises a solid electrolyte layer,
    wherein the signal processing circuit comprises:
       a rectifier circuit electrically connected to the antenna; and
       a control circuit electrically connected to the rectifier circuit and the battery.

11. The device according to claim 10, comprising a display element electrically connected to the signal processing circuit.

12. The device according to claim 11, wherein the display element comprises a material exhibiting a chromism phenomenon.

13. The device according to claim 10, wherein the signal processing circuit comprises an amplifier circuit electrically connected to the rectifier circuit.

14. The device according to claim 10, wherein the control circuit comprises a voltage comparison circuit configured to compare an output potential of the battery with an output potential of the rectifier circuit.

15. The device according to claim 10, wherein the transistor comprises a compound semiconductor.

16. The device according to claim 10, wherein the battery comprises a stack including a negative electrode active material layer, the solid electrolyte layer, and a positive electrode active material layer.

17. The device according to claim 10, wherein the battery overlaps with the transistor.

18. The device according to claim 10, wherein the battery overlaps with the antenna.

19. A device comprising:
a transistor;
a first insulating film over the transistor;
an antenna over the first insulating film;
a second insulating film over the antenna; and
a battery electrically connected to the transistor through a contact hole in at least one of the first insulating film and the second insulating film, the battery being over the second insulating film, wherein the battery comprises a solid electrolyte layer and is configured to be charged using a radiowave received by the antenna.

20. The device according to claim 19, comprising a display element electrically connected to the transistor.

21. The device according to claim 20, wherein the display element comprises a material exhibiting a chromism phenomenon.

22. The device according to claim 19, wherein the transistor comprises a compound semiconductor.

23. The device according to claim 19, wherein the battery comprises a stack including a negative electrode active material layer, the solid electrolyte layer, and a positive electrode active material layer.

24. The device according to claim 19, wherein the battery overlaps with the transistor.

25. The device according to claim 19, wherein the battery overlaps with the antenna.

26. The device according to claim 19, wherein the radiowave received by the antenna is converted into an induction signal, the induction signal is rectified into a direct signal, and the battery is charged by the direct signal.

* * * * *